(12) United States Patent
Yamazaki et al.

(10) Patent No.: US 8,115,210 B2
(45) Date of Patent: Feb. 14, 2012

(54) SEMICONDUCTOR DISPLAY DEVICE

(75) Inventors: Shunpei Yamazaki, Tokyo (JP); Satoshi Murakami, Tochigi (JP); Masahiko Hayakawa, Kanagawa (JP); Kiyoshi Kato, Kanagawa (JP); Mitsuaki Osame, Kanagawa (JP); Takashi Hirosue, Tochigi (JP); Saishi Fujikawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/162,791

(22) Filed: Jun. 17, 2011

(65) Prior Publication Data
US 2011/0241008 A1 Oct. 6, 2011

Related U.S. Application Data

(60) Continuation of application No. 12/122,823, filed on May 19, 2008, now Pat. No. 7,964,874, and a division of application No. 11/633,579, filed on Dec. 5, 2006, now Pat. No. 7,375,376, and a division of application No. 11/151,260, filed on Jun. 14, 2005, now Pat. No. 7,148,510, and a division of application No. 10/412,687, filed on Apr. 14, 2003, now Pat. No. 6,911,688.

(30) Foreign Application Priority Data

Apr. 15, 2002 (JP) ................. 2002-112151

(51) Int. Cl.
*H01L 29/04* (2006.01)
*H01L 29/15* (2006.01)
*H01L 31/036* (2006.01)
*H01L 29/10* (2006.01)
*H01L 31/0376* (2006.01)
*H01L 31/20* (2006.01)
*H01L 29/76* (2006.01)
*H01L 31/112* (2006.01)
*H01L 27/108* (2006.01)
*H01L 29/12* (2006.01)
*H01L 31/062* (2006.01)
*H01L 31/113* (2006.01)

(52) U.S. Cl. ................. 257/72; 257/57; 257/59; 257/66; 257/68; 257/69; 257/291; 257/E29.151; 257/E29.182; 257/E29.202

(58) Field of Classification Search .................... 257/57, 257/59, 66, 68, 69, 72, 291, E29.151, E29.182, 257/E29.202
See application file for complete search history.

(56) References Cited

U.S. PATENT DOCUMENTS 3,597,667 A 8/1971 Horn
(Continued)

FOREIGN PATENT DOCUMENTS

EP 0 556 484 A1 8/1993
(Continued)

*Primary Examiner* — Ida M Soward
(74) *Attorney, Agent, or Firm* — Nixon Peabody LLP; Jeffrey L. Costellia

(57) ABSTRACT

A semiconductor display device with an interlayer insulating film in which surface levelness is ensured with a limited film formation time, heat treatment for removing moisture does not take long, and moisture in the interlayer insulating film is prevented from escaping into a film or electrode adjacent to the interlayer insulating film. A TFT is formed and then a nitrogen-containing inorganic insulating film that transmits less moisture compared to organic resin film is formed so as to cover the TFT. Next, organic resin including photosensitive acrylic resin is applied and an opening is formed by partially exposing the organic resin film to light. The organic resin film where the opening is foamed, is then covered with a nitrogen-containing inorganic insulating film which transmits less moisture than organic resin film does. Thereafter, the gate insulating film and the two layers of the nitrogen-containing inorganic insulating films are partially etched away in the opening of the organic resin film to expose the active layer of the TFT.

20 Claims, 38 Drawing Sheets

U.S. PATENT DOCUMENTS

| | | | |
|---|---|---|---|
| 4,313,782 A | 2/1982 | Sokoloski | |
| 4,342,617 A | 8/1982 | Fu et al. | |
| 4,347,586 A | 8/1982 | Natsui | |
| 4,409,724 A | 10/1983 | Tasch, Jr. et al. | |
| 4,447,272 A | 5/1984 | Saks | |
| 4,566,175 A | 1/1986 | Smayling et al. | |
| 4,651,406 A | 3/1987 | Shimizu et al. | |
| 4,808,845 A | 2/1989 | Suzuki et al. | |
| 4,823,180 A | 4/1989 | Wieder et al. | |
| 4,851,370 A | 7/1989 | Doklan et al. | |
| 4,886,962 A | 12/1989 | Gofuku et al. | |
| 4,951,100 A | 8/1990 | Parrillo | |
| 5,055,906 A | 10/1991 | Mase et al. | |
| 5,063,378 A | 11/1991 | Roach | |
| RE33,829 E | 2/1992 | Castleberry | |
| 5,102,813 A | 4/1992 | Kobayashi et al. | |
| 5,113,511 A | 5/1992 | Nelson et al. | |
| 5,142,344 A | 8/1992 | Yamazaki | |
| 5,169,792 A | 12/1992 | Katoh et al. | |
| 5,182,620 A | 1/1993 | Shimada et al. | |
| 5,191,373 A | 3/1993 | Nakano | |
| 5,198,685 A | 3/1993 | Kitani et al. | |
| 5,212,119 A | 5/1993 | Hah et al. | |
| 5,247,289 A | 9/1993 | Matsueda | |
| 5,292,675 A | 3/1994 | Codama | |
| 5,292,677 A | 3/1994 | Dennison | |
| 5,306,651 A | 4/1994 | Masumo et al. | |
| 5,308,998 A | 5/1994 | Yamazaki et al. | |
| 5,313,076 A | 5/1994 | Yamazaki et al. | |
| 5,324,974 A | 6/1994 | Liao | |
| 5,343,066 A | 8/1994 | Okamoto et al. | |
| 5,359,206 A | 10/1994 | Yamamoto et al. | |
| 5,365,079 A | 11/1994 | Kodaira et al. | |
| 5,414,278 A | 5/1995 | Kobayashi et al. | |
| 5,414,442 A | 5/1995 | Yamazaki et al. | |
| 5,424,752 A | 6/1995 | Yamazaki et al. | |
| 5,426,315 A | 6/1995 | Pfiester | |
| 5,440,163 A | 8/1995 | Ohhashi | |
| 5,444,457 A | 8/1995 | Hotto | |
| 5,446,562 A | 8/1995 | Sato | |
| 5,457,415 A * | 10/1995 | Schlig | 327/94 |
| 5,459,596 A | 10/1995 | Ueda et al. | |
| 5,466,617 A | 11/1995 | Shannon | |
| 5,468,987 A | 11/1995 | Yamazaki et al. | |
| 5,476,802 A | 12/1995 | Yamazaki et al. | |
| 5,479,052 A | 12/1995 | Yuuki | |
| 5,485,019 A | 1/1996 | Yamazaki et al. | |
| 5,497,021 A | 3/1996 | Tada | |
| 5,498,562 A | 3/1996 | Dennison et al. | |
| 5,499,123 A | 3/1996 | Mikoshiba | |
| 5,504,020 A | 4/1996 | Aomori et al. | |
| 5,504,029 A | 4/1996 | Murata et al. | |
| 5,508,209 A | 4/1996 | Zhang et al. | |
| 5,512,779 A | 4/1996 | Noda | |
| 5,521,107 A | 5/1996 | Yamazaki et al. | |
| 5,523,257 A | 6/1996 | Yamazaki et al. | |
| 5,545,577 A | 8/1996 | Tada | |
| 5,563,427 A | 10/1996 | Yudasaka et al. | |
| 5,576,231 A | 11/1996 | Konuma et al. | |
| 5,576,655 A | 11/1996 | Fujihira et al. | |
| 5,580,381 A | 12/1996 | Yamagata | |
| 5,583,369 A | 12/1996 | Yamazaki et al. | |
| 5,585,949 A | 12/1996 | Yamazaki et al. | |
| 5,585,951 A | 12/1996 | Noda et al. | |
| 5,612,254 A | 3/1997 | Mu et al. | |
| 5,619,045 A | 4/1997 | Konuma et al. | |
| 5,620,905 A | 4/1997 | Konuma et al. | |
| 5,623,157 A | 4/1997 | Miyazaki et al. | |
| 5,627,084 A | 5/1997 | Yamazaki et al. | |
| 5,635,423 A | 6/1997 | Huang et al. | |
| 5,650,338 A | 7/1997 | Yamazaki et al. | |
| 5,663,077 A | 9/1997 | Adachi et al. | |
| 5,670,979 A * | 9/1997 | Huq et al. | 345/100 |
| 5,672,900 A | 9/1997 | Konuma et al. | |
| 5,674,771 A | 10/1997 | Machida et al. | |
| 5,680,147 A | 10/1997 | Yamazaki et al. | |
| 5,696,386 A | 12/1997 | Yamazaki | |
| 5,706,064 A | 1/1998 | Fukunaga et al. | |
| 5,712,495 A | 1/1998 | Suzawa | |
| 5,719,065 A | 2/1998 | Takemura et al. | |
| 5,721,601 A | 2/1998 | Yamaji et al. | |
| 5,729,035 A | 3/1998 | Anma | |
| 5,733,797 A | 3/1998 | Yamaha | |
| 5,737,049 A | 4/1998 | Shin et al. | |
| 5,747,355 A | 5/1998 | Konuma et al. | |
| 5,771,110 A | 6/1998 | Hirano et al. | |
| 5,781,254 A | 7/1998 | Kim et al. | |
| 5,784,073 A | 7/1998 | Yamazaki et al. | |
| 5,786,241 A | 7/1998 | Shimada | |
| 5,789,762 A | 8/1998 | Koyama et al. | |
| 5,804,878 A | 9/1998 | Miyazaki et al. | |
| 5,805,252 A | 9/1998 | Shimada et al. | |
| 5,808,315 A | 9/1998 | Murakami et al. | |
| 5,814,529 A | 9/1998 | Zhang | |
| 5,815,226 A | 9/1998 | Yamazaki et al. | |
| 5,818,550 A | 10/1998 | Kadota et al. | |
| 5,831,284 A | 11/1998 | Park et al. | |
| 5,847,410 A | 12/1998 | Nakajima | |
| 5,849,611 A | 12/1998 | Yamazaki et al. | |
| 5,879,969 A | 3/1999 | Yamazaki et al. | |
| 5,880,038 A | 3/1999 | Yamazaki et al. | |
| 5,893,623 A | 4/1999 | Muramatsu | |
| 5,895,937 A | 4/1999 | Su et al. | |
| 5,913,112 A | 6/1999 | Yamazaki et al. | |
| 5,917,225 A | 6/1999 | Yamazaki et al. | |
| 5,939,731 A | 8/1999 | Yamazaki et al. | |
| 5,940,732 A | 8/1999 | Zhang | |
| 5,945,711 A | 8/1999 | Takemura | |
| 5,946,561 A | 8/1999 | Yamazaki et al. | |
| 5,956,105 A | 9/1999 | Yamazaki et al. | |
| 5,962,870 A | 10/1999 | Yamazaki et al. | |
| 5,962,872 A | 10/1999 | Zhang et al. | |
| 5,982,460 A | 11/1999 | Zhang et al. | |
| 5,990,542 A | 11/1999 | Yamazaki | |
| 6,013,928 A | 1/2000 | Yamazaki et al. | |
| 6,031,290 A | 2/2000 | Miyazaki et al. | |
| 6,037,712 A | 3/2000 | Codama et al. | |
| 6,057,904 A | 5/2000 | Kim et al. | |
| 6,069,443 A | 5/2000 | Jones et al. | |
| 6,078,316 A | 6/2000 | Page et al. | |
| 6,115,090 A | 9/2000 | Yamazaki | |
| 6,124,904 A | 9/2000 | Sato | |
| 6,136,624 A | 10/2000 | Kemmochi et al. | |
| 6,137,465 A * | 10/2000 | Sekine et al. | 345/98 |
| 6,141,066 A | 10/2000 | Matsushima | |
| 6,147,375 A | 11/2000 | Yamazaki et al. | |
| 6,150,692 A | 11/2000 | Iwanaga et al. | |
| 6,166,414 A | 12/2000 | Miyazaki et al. | |
| 6,215,154 B1 | 4/2001 | Ishida et al. | |
| 6,236,106 B1 | 5/2001 | Sato | |
| 6,252,297 B1 | 6/2001 | Kemmochi et al. | |
| 6,271,066 B1 | 8/2001 | Yamazaki et al. | |
| 6,271,543 B1 | 8/2001 | Ohtani et al. | |
| 6,274,516 B1 | 8/2001 | Kamei et al. | |
| 6,274,887 B1 | 8/2001 | Yamazaki et al. | |
| 6,294,799 B1 | 9/2001 | Yamazaki et al. | |
| 6,306,559 B1 | 10/2001 | Tanamura et al. | |
| 6,306,694 B1 | 10/2001 | Yamazaki et al. | |
| 6,320,224 B1 | 11/2001 | Zhang | |
| 6,335,555 B1 | 1/2002 | Takemura et al. | |
| 6,346,718 B1 | 2/2002 | Yamanaka et al. | |
| 6,356,318 B1 | 3/2002 | Kawahata | |
| 6,372,558 B1 | 4/2002 | Yamanaka et al. | |
| 6,429,053 B1 | 8/2002 | Yamazaki et al. | |
| 6,448,612 B1 | 9/2002 | Miyazaki et al. | |
| 6,451,636 B1 | 9/2002 | Segawa et al. | |
| 6,475,836 B1 | 11/2002 | Suzawa et al. | |
| 6,476,447 B1 | 11/2002 | Yamazaki et al. | |
| 6,492,659 B1 | 12/2002 | Yamazaki et al. | |
| 6,493,271 B2 | 12/2002 | Matsubara et al. | |
| 6,514,855 B1 | 2/2003 | Suzuki et al. | |
| 6,515,300 B2 | 2/2003 | den Boer et al. | |
| 6,521,913 B1 | 2/2003 | Murade | |
| 6,528,824 B2 | 3/2003 | Yamagata et al. | |
| 6,538,301 B1 | 3/2003 | Yamada et al. | |
| 6,556,257 B2 | 4/2003 | Ino | |
| 6,562,672 B2 | 5/2003 | Yamazaki et al. | |

| | | |
|---|---|---|
| 6,566,711 B1 | 5/2003 | Yamazaki et al. |
| 6,576,926 B1 | 6/2003 | Yamazaki et al. |
| 6,580,475 B2 | 6/2003 | Yamazaki et al. |
| 6,593,920 B2 * | 7/2003 | Okumura et al. ............. 345/204 |
| 6,593,990 B1 | 7/2003 | Yamazaki |
| 6,599,818 B2 | 7/2003 | Dairiki |
| 6,605,826 B2 | 8/2003 | Yamazaki et al. |
| 6,608,353 B2 | 8/2003 | Miyazaki et al. |
| 6,614,076 B2 | 9/2003 | Kawasaki et al. |
| 6,617,611 B2 | 9/2003 | Hasegawa et al. |
| 6,624,450 B1 | 9/2003 | Yamazaki et al. |
| 6,657,230 B1 | 12/2003 | Murade |
| 6,657,260 B2 | 12/2003 | Yamazaki et al. |
| 6,664,145 B1 | 12/2003 | Yamazaki et al. |
| 6,664,732 B2 | 12/2003 | Yamazaki et al. |
| 6,677,621 B2 | 1/2004 | Yamazaki et al. |
| 6,680,577 B1 | 1/2004 | Inukai et al. |
| 6,689,492 B1 | 2/2004 | Yamazaki et al. |
| 6,690,031 B1 | 2/2004 | Ohtani et al. |
| 6,690,033 B2 | 2/2004 | Yamazaki et al. |
| 6,730,948 B2 | 5/2004 | Umeda et al. |
| 6,739,931 B2 | 5/2004 | Yamazaki et al. |
| 6,740,599 B2 | 5/2004 | Yamazaki et al. |
| 6,747,639 B2 * | 6/2004 | So ................................ 345/211 |
| 6,768,259 B2 | 7/2004 | Hirano |
| 6,768,480 B2 * | 7/2004 | Jinno ............................. 345/80 |
| 6,774,578 B2 | 8/2004 | Tanada |
| 6,777,710 B1 | 8/2004 | Koyama |
| 6,778,232 B2 | 8/2004 | Nakata et al. |
| 6,784,037 B2 | 8/2004 | Yamazaki et al. |
| 6,784,949 B1 | 8/2004 | Nagata et al. |
| 6,791,129 B2 | 9/2004 | Inukai |
| 6,791,521 B2 | 9/2004 | Isami et al. |
| 6,822,264 B2 | 11/2004 | Yamazaki et al. |
| 6,822,629 B2 | 11/2004 | Yamazaki et al. |
| 6,828,950 B2 | 12/2004 | Koyama |
| 6,833,560 B2 | 12/2004 | Konuma et al. |
| 6,842,660 B2 | 1/2005 | Tripathi et al. |
| 6,855,954 B1 | 2/2005 | Zhang |
| 6,864,628 B2 | 3/2005 | Yamazaki et al. |
| 6,872,604 B2 | 3/2005 | Yamazaki et al. |
| 6,875,999 B2 | 4/2005 | Koyama et al. |
| 6,900,462 B2 | 5/2005 | Suzawa et al. |
| 6,903,377 B2 | 6/2005 | Yamazaki et al. |
| 6,905,903 B2 | 6/2005 | Hasegawa et al. |
| 6,909,114 B1 | 6/2005 | Yamazaki |
| 6,911,688 B2 | 6/2005 | Yamazaki et al. |
| 6,914,260 B2 | 7/2005 | Zhang et al. |
| 6,919,868 B2 * | 7/2005 | Tam ................................. 345/76 |
| 6,919,886 B2 * | 7/2005 | Sato et al. ...................... 345/205 |
| 6,936,846 B2 | 8/2005 | Koyama et al. |
| 6,940,180 B1 | 9/2005 | Uchiyama |
| 6,943,369 B2 | 9/2005 | Hayashi |
| 6,958,489 B2 | 10/2005 | Kimura |
| 6,967,129 B2 | 11/2005 | Yamazaki et al. |
| 6,972,263 B2 | 12/2005 | Yamazaki et al. |
| 6,972,435 B2 | 12/2005 | Ohtani |
| 6,977,392 B2 | 12/2005 | Yamazaki et al. |
| 6,977,394 B2 | 12/2005 | Yamazaki et al. |
| 6,987,283 B2 | 1/2006 | Zhang et al. |
| 6,992,698 B1 * | 1/2006 | Xia .......................... 348/207.99 |
| 7,038,239 B2 | 5/2006 | Murakami et al. |
| 7,042,024 B2 | 5/2006 | Yamazaki et al. |
| 7,045,399 B2 | 5/2006 | Miyazaki et al. |
| 7,061,016 B2 | 6/2006 | Miyazaki et al. |
| 7,084,517 B2 | 8/2006 | Uchiyama |
| 7,094,635 B2 | 8/2006 | Yamazaki et al. |
| 7,132,693 B2 | 11/2006 | Konuma et al. |
| 7,141,821 B1 | 11/2006 | Yamazaki et al. |
| 7,142,781 B2 | 11/2006 | Koyama et al. |
| 7,148,510 B2 | 12/2006 | Yamazaki et al. |
| 7,242,021 B2 | 7/2007 | Yamazaki et al. |
| 7,301,209 B2 | 11/2007 | Takemura et al. |
| 7,365,393 B2 | 4/2008 | Yamazaki et al. |
| 7,375,376 B2 | 5/2008 | Yamazaki et al. |
| 7,422,934 B2 | 9/2008 | Yamazaki et al. |
| 7,442,991 B2 | 10/2008 | Yamazaki et al. |
| 7,615,786 B2 | 11/2009 | Takemura et al. |
| 7,671,369 B2 | 3/2010 | Yamazaki et al. |
| 2001/0005606 A1 | 6/2001 | Tanaka et al. |
| 2001/0009283 A1 | 7/2001 | Arao et al. |
| 2001/0030322 A1 | 10/2001 | Yamazaki et al. |
| 2001/0045929 A1 * | 11/2001 | Prache et al. ................... 345/89 |
| 2001/0051416 A1 | 12/2001 | Yamazaki et al. |
| 2001/0053559 A1 | 12/2001 | Nagao et al. |
| 2001/0055841 A1 | 12/2001 | Yamazaki et al. |
| 2002/0036462 A1 | 3/2002 | Hirano |
| 2002/0050786 A1 | 5/2002 | Yamazaki et al. |
| 2002/0051382 A1 | 5/2002 | Matsubara et al. |
| 2002/0052124 A1 | 5/2002 | Raaijmakers et al. |
| 2002/0055206 A1 | 5/2002 | Zhang |
| 2002/0067328 A1 * | 6/2002 | Yumoto et al. .................. 345/92 |
| 2002/0145116 A1 | 10/2002 | Choo et al. |
| 2002/0155706 A1 | 10/2002 | Mitsuki et al. |
| 2002/0163043 A1 | 11/2002 | Zhang et al. |
| 2002/0177326 A1 | 11/2002 | Klee et al. |
| 2002/0179969 A1 | 12/2002 | Miyazaki et al. |
| 2003/0057419 A1 | 3/2003 | Murakami et al. |
| 2003/0090447 A1 | 5/2003 | Kimura |
| 2003/0129790 A1 | 7/2003 | Yamazaki et al. |
| 2003/0162314 A1 | 8/2003 | Yamazaki et al. |
| 2003/0173570 A1 | 9/2003 | Yamazaki et al. |
| 2003/0189207 A1 | 10/2003 | Murakami et al. |
| 2003/0189210 A1 | 10/2003 | Yamazaki et al. |
| 2003/0193054 A1 | 10/2003 | Hayakawa et al. |
| 2003/0197178 A1 | 10/2003 | Yamazaki et al. |
| 2003/0206332 A1 | 11/2003 | Yamazaki et al. |
| 2003/0210358 A1 | 11/2003 | Zhang et al. |
| 2003/0230764 A1 | 12/2003 | Yamazaki et al. |
| 2004/0023445 A1 | 2/2004 | Miyazaki et al. |
| 2004/0051102 A1 | 3/2004 | Miyazaki et al. |
| 2004/0072380 A1 | 4/2004 | Yamazaki et al. |
| 2004/0075094 A1 | 4/2004 | Yamazaki et al. |
| 2004/0080263 A1 | 4/2004 | Yamazaki et al. |
| 2004/0135181 A1 | 7/2004 | Yamazaki et al. |
| 2004/0144978 A2 * | 7/2004 | Koyama ........................... 257/59 |
| 2004/0150591 A1 * | 8/2004 | Ozawa et al. ................... 345/76 |
| 2005/0056948 A1 | 3/2005 | Uchiyama |
| 2005/0087741 A1 | 4/2005 | Yamazaki |
| 2005/0132549 A1 | 6/2005 | Shih et al. |
| 2005/0205868 A1 | 9/2005 | Yamazaki et al. |
| 2005/0233507 A1 | 10/2005 | Yamazaki et al. |
| 2005/0276912 A1 | 12/2005 | Yamamoto et al. |
| 2005/0282305 A1 | 12/2005 | Murakami et al. |
| 2005/0287722 A1 | 12/2005 | Zhang |
| 2006/0060861 A1 | 3/2006 | Yamazaki et al. |
| 2007/0001236 A1 | 1/2007 | Yamazaki et al. |
| 2007/0096106 A1 | 5/2007 | Yamazaki et al. |
| 2007/0096224 A1 | 5/2007 | Takemura et al. |
| 2008/0061299 A1 | 3/2008 | Takemura et al. |
| 2008/0246039 A1 | 10/2008 | Zhang |
| 2009/0014724 A1 | 1/2009 | Yamazaki et al. |
| 2009/0072235 A1 | 3/2009 | Zhang et al. |
| 2009/0200611 A1 | 8/2009 | Takemura et al. |

FOREIGN PATENT DOCUMENTS

| | | |
|---|---|---|
| EP | 0 603 866 A1 | 6/1994 |
| EP | 0 680 082 A1 | 11/1995 |
| EP | 0 878 840 A1 | 11/1998 |
| EP | 1 031 873 A2 | 8/2000 |
| EP | 1 122 773 A2 | 8/2001 |
| EP | 1 128 439 A2 | 8/2001 |
| EP | 1128430 A2 | 8/2001 |
| EP | 1 148 553 A2 | 10/2001 |
| EP | 1 566 837 A2 | 8/2005 |
| JP | 56-111258 | 9/1981 |
| JP | 64-054762 | 3/1989 |
| JP | 1-156725 | 6/1989 |
| JP | 02-025024 | 1/1990 |
| JP | 02-039541 | 2/1990 |
| JP | 02-044769 | 2/1990 |
| JP | 02-159730 | 6/1990 |
| JP | 2-234134 | 9/1990 |
| JP | 03-020046 | 1/1991 |
| JP | 03-095938 | 4/1991 |
| JP | 03-095939 | 4/1991 |
| JP | 03-280018 | 12/1991 |
| JP | 03-280420 | 12/1991 |

| | | | | | | |
|---|---|---|---|---|---|---|
| JP | 04-139828 | 5/1992 | | JP | 10-048668 | 2/1998 |
| JP | 04-142740 | 5/1992 | | JP | 10-056182 | 2/1998 |
| JP | 04-155834 | 5/1992 | | JP | 10-068972 | 3/1998 |
| JP | 04-196328 | 7/1992 | | JP | 10-307305 | 11/1998 |
| JP | 04-358129 | 12/1992 | | JP | 11-103069 | 4/1999 |
| JP | 05-055581 | 3/1993 | | JP | 11-183929 | 7/1999 |
| JP | 05-055582 | 3/1993 | | JP | 11-345981 | 12/1999 |
| JP | 05-082442 | 4/1993 | | JP | 2001-189462 | 7/2001 |
| JP | 05-226364 | 9/1993 | | JP | 2001-223267 | 8/2001 |
| JP | 05-249478 | 9/1993 | | JP | 2001-313397 | 11/2001 |
| JP | 05-275373 | 10/1993 | | JP | 2001-318622 | 11/2001 |
| JP | 06-291314 | 10/1994 | | JP | 2001-318628 | 11/2001 |
| JP | 07-056190 | 3/1995 | | JP | 2001-356711 | 12/2001 |
| JP | 07-273191 | 10/1995 | | JP | 2002-006777 | 1/2002 |
| JP | 08-152651 | 6/1996 | | JP | 2003-017273 | 1/2003 |
| JP | 08-181214 | 7/1996 | | WO | WO 92/014268 | 8/1992 |
| JP | 08-203876 | 8/1996 | | WO | WO 03/038533 A1 | 5/2003 |
| JP | 10-039334 | 2/1998 | | | | |

* cited by examiner

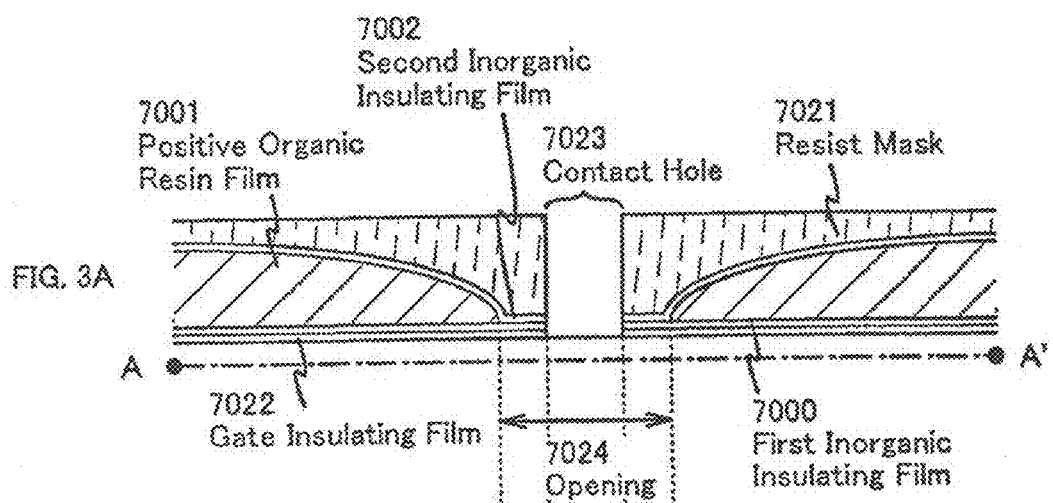
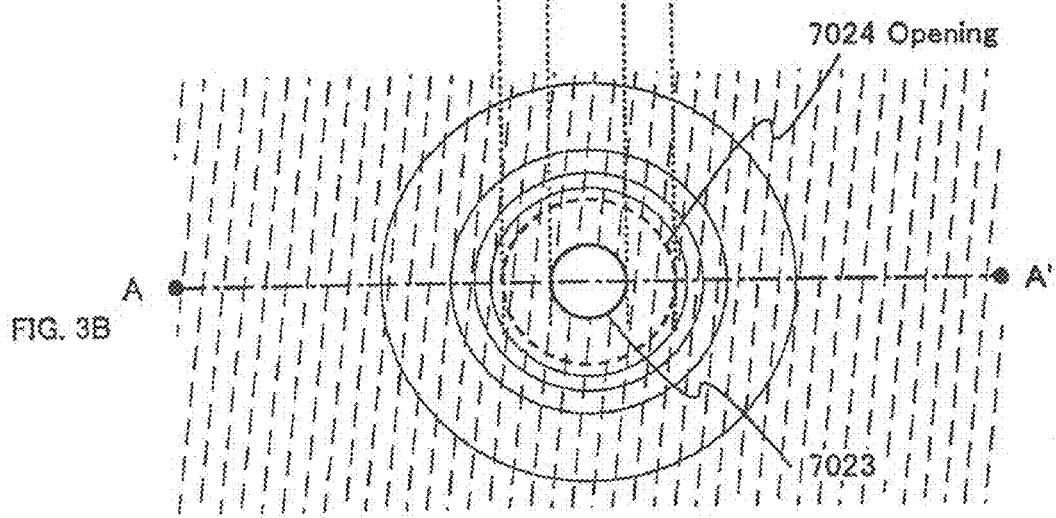
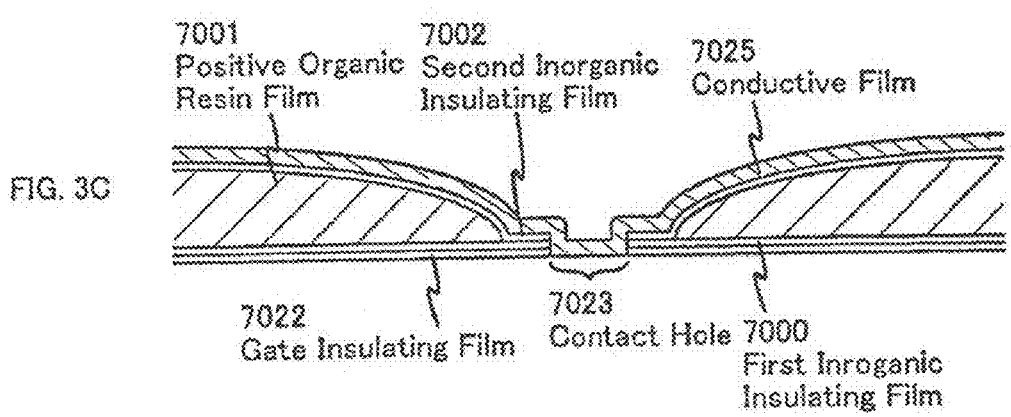

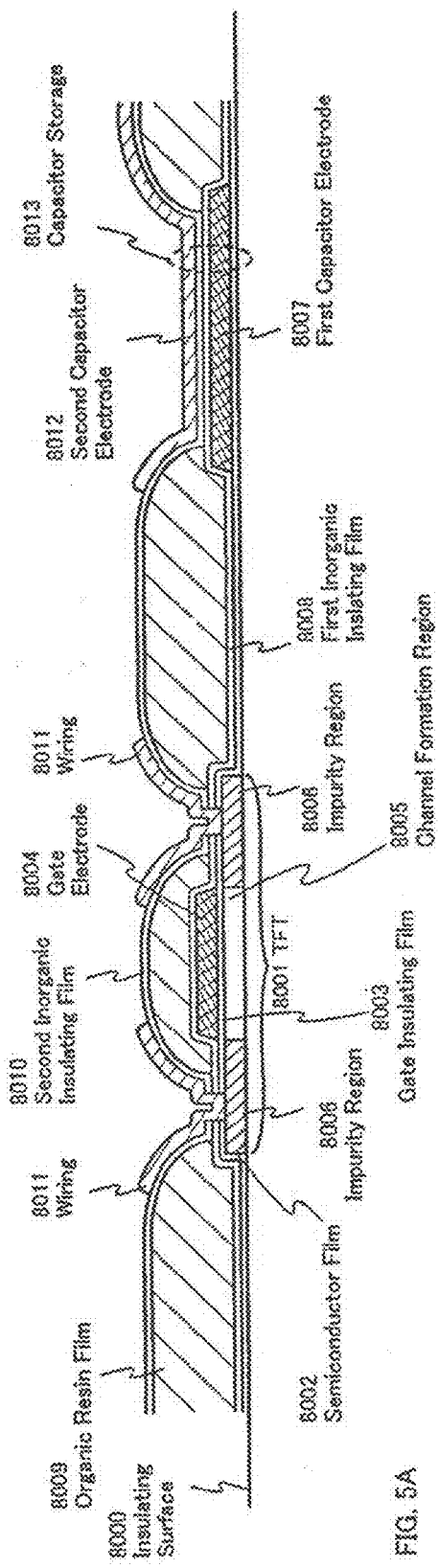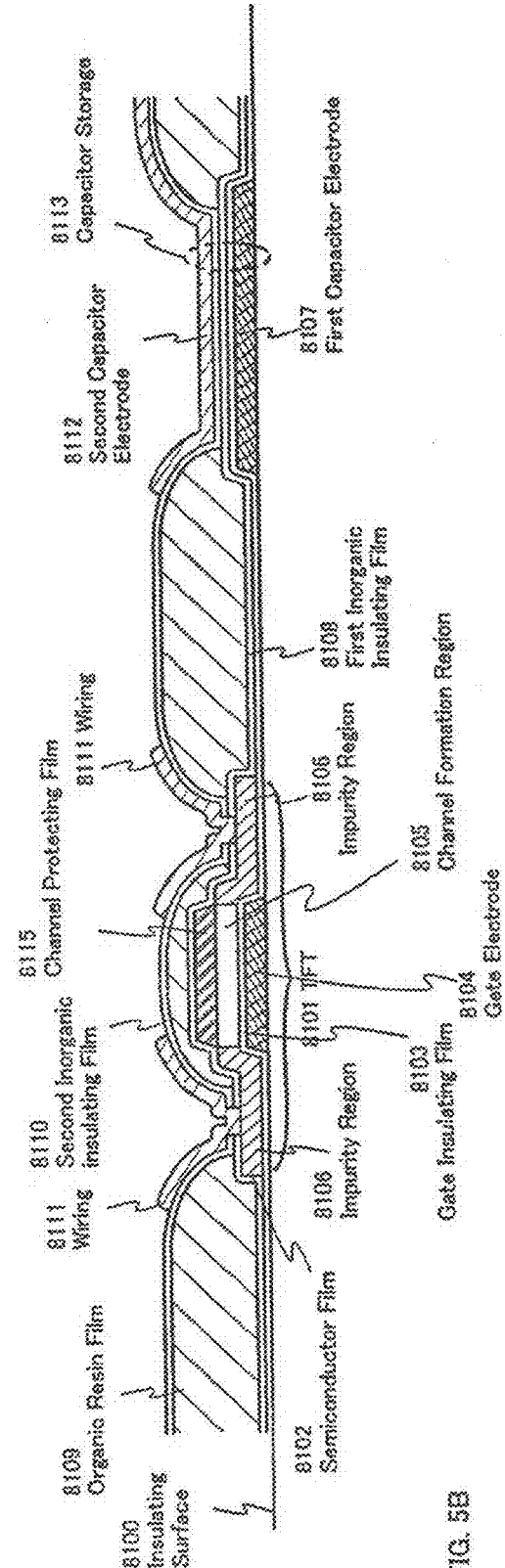
FIG. 5A
FIG. 5B

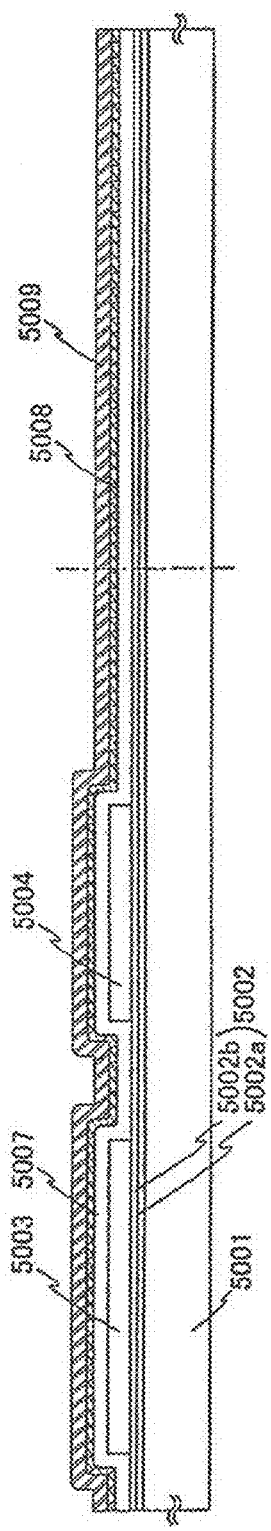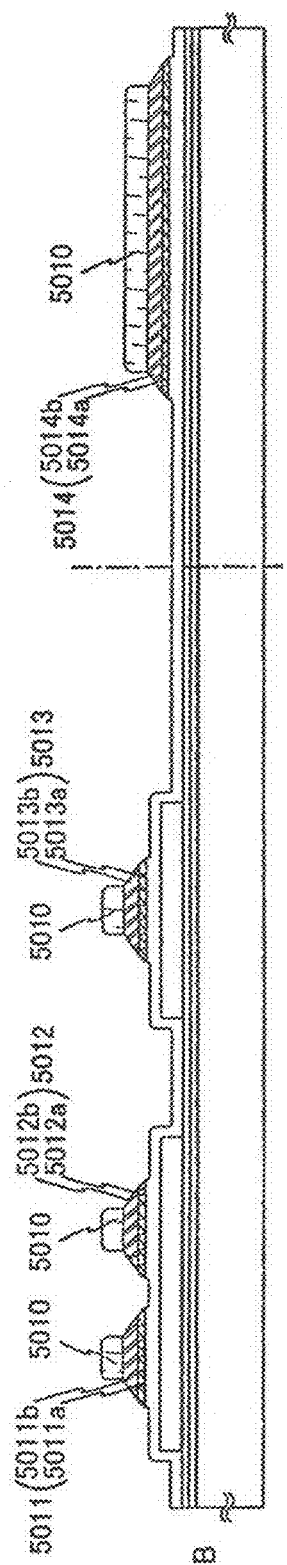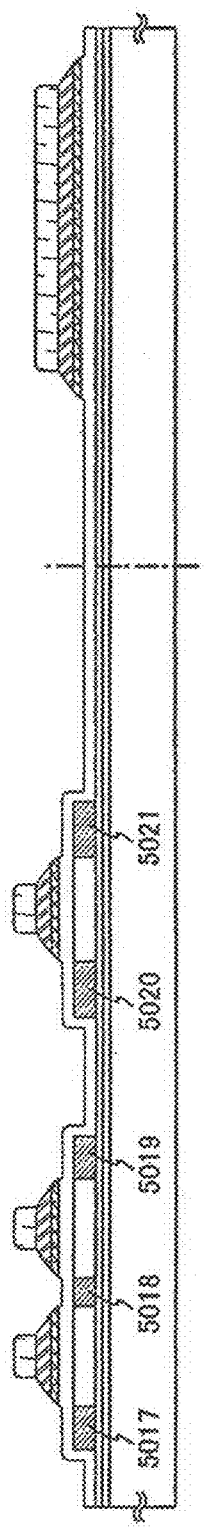
FIG. 13A
FIG. 13B
FIG. 13C

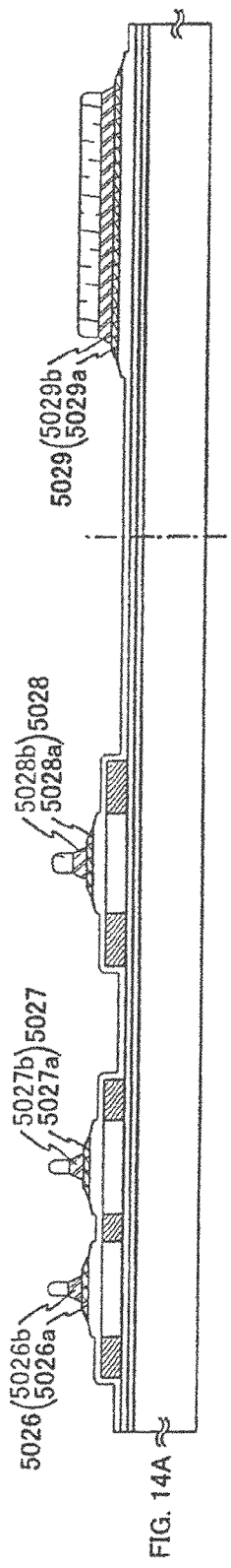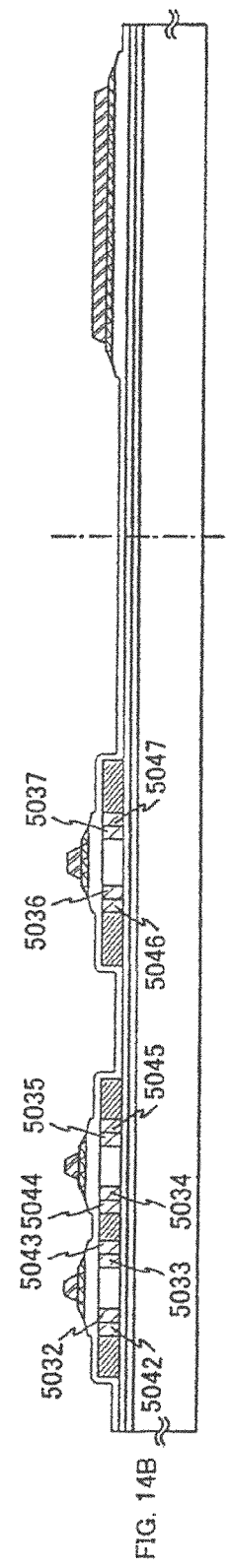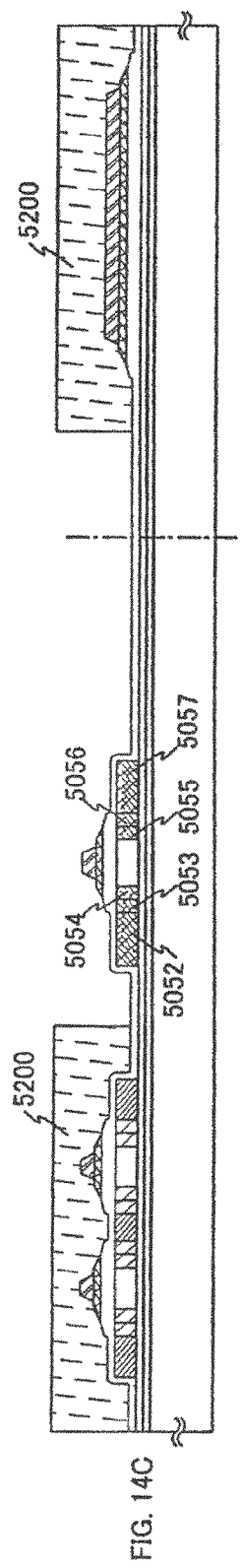

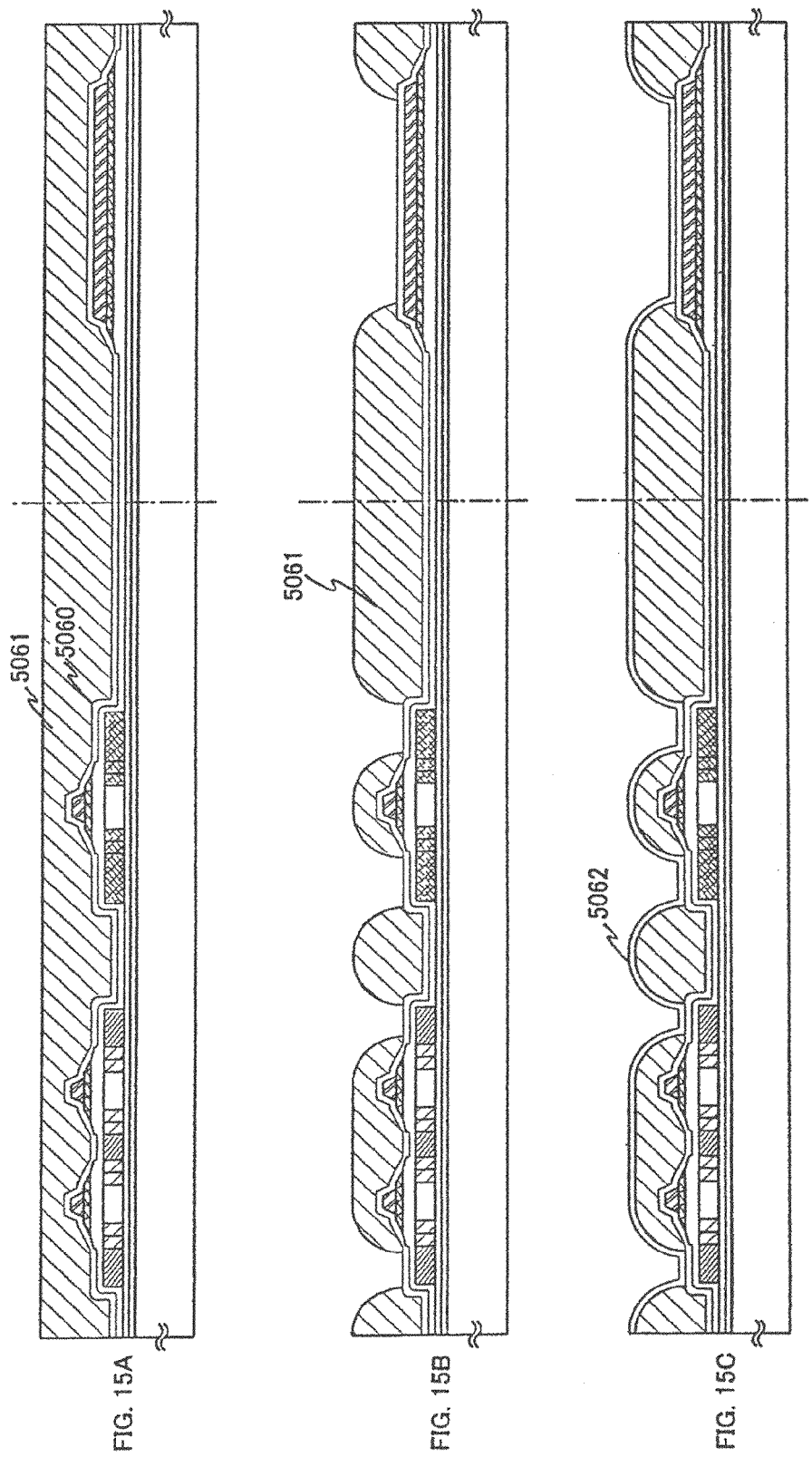

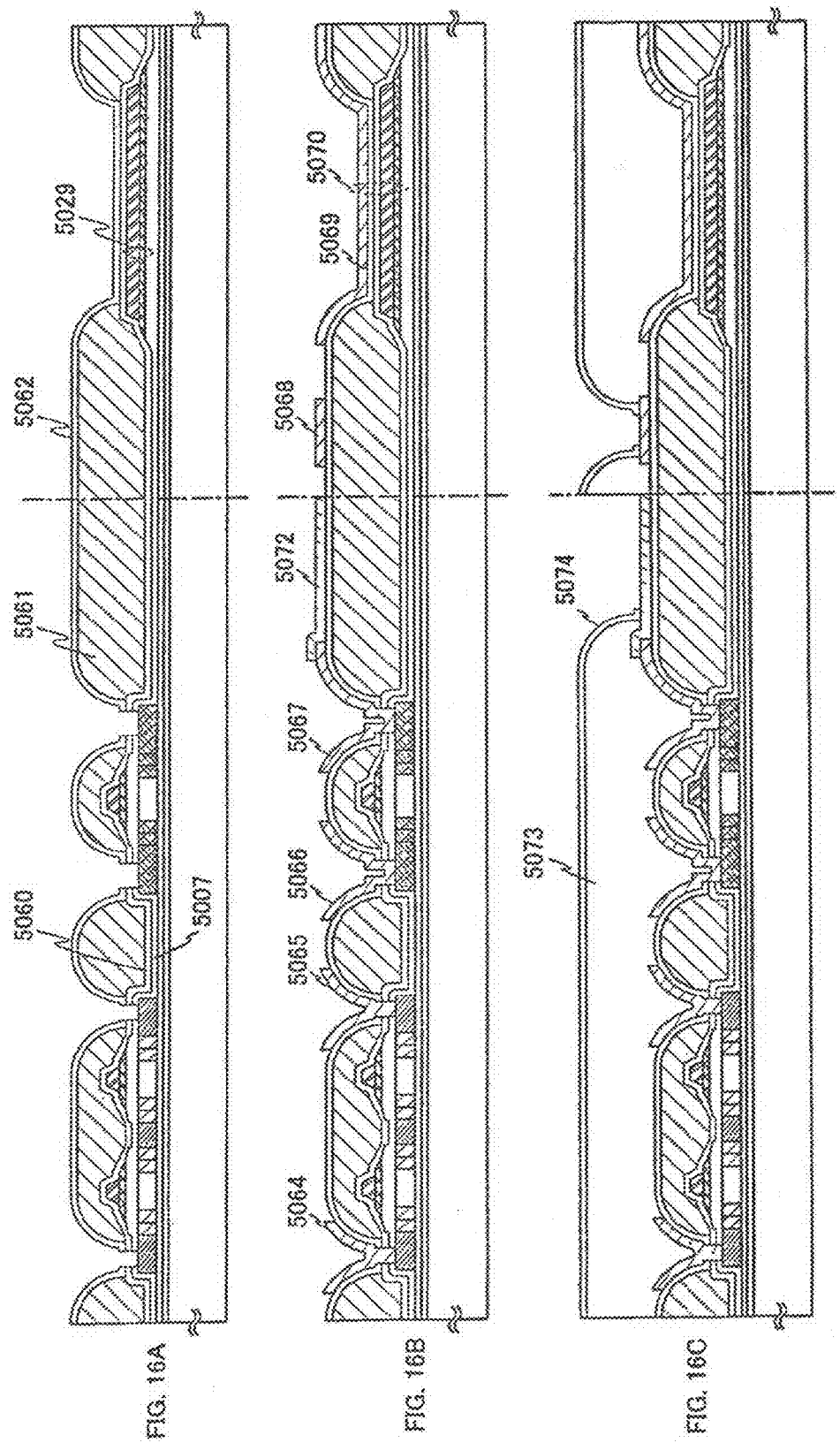

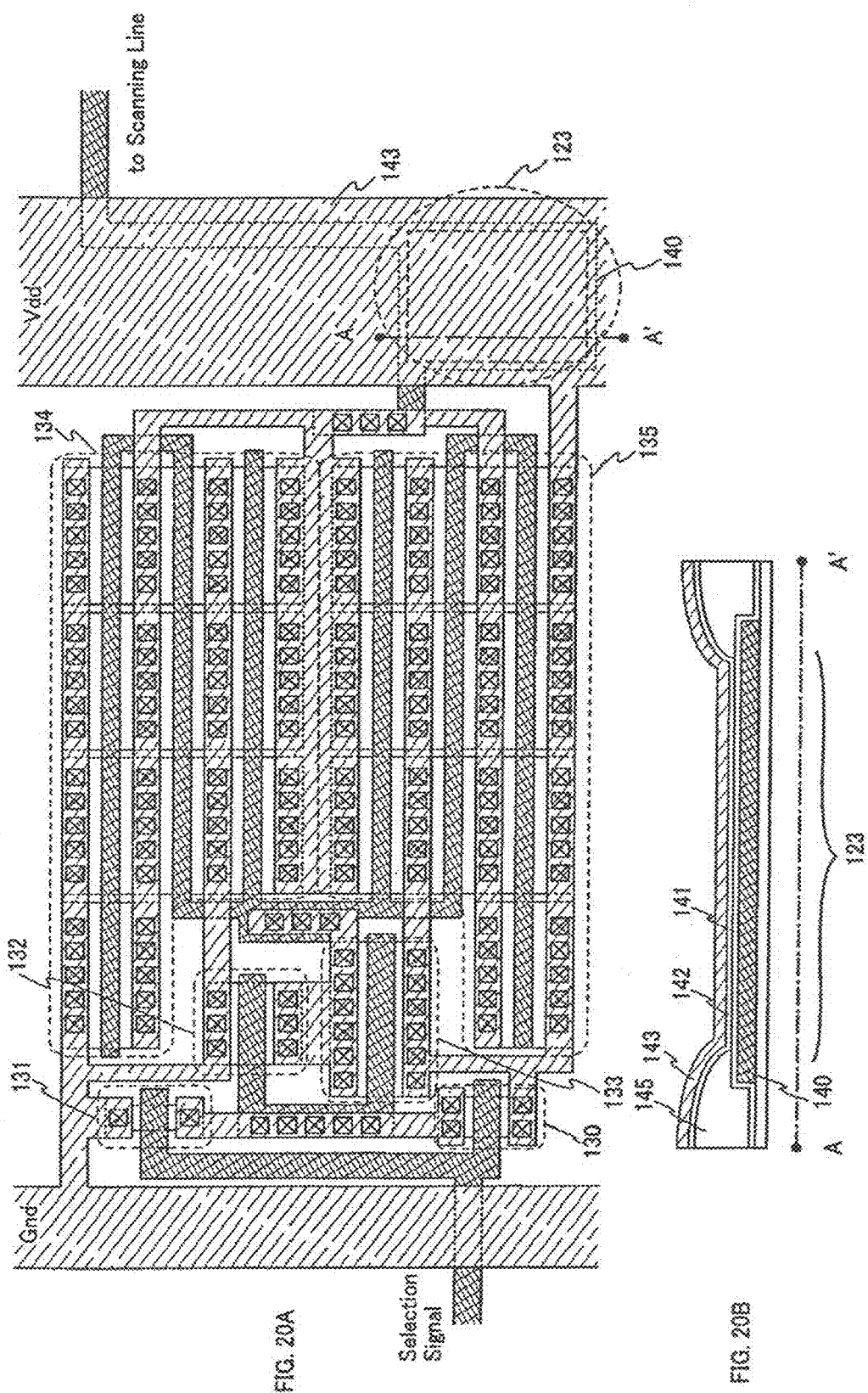

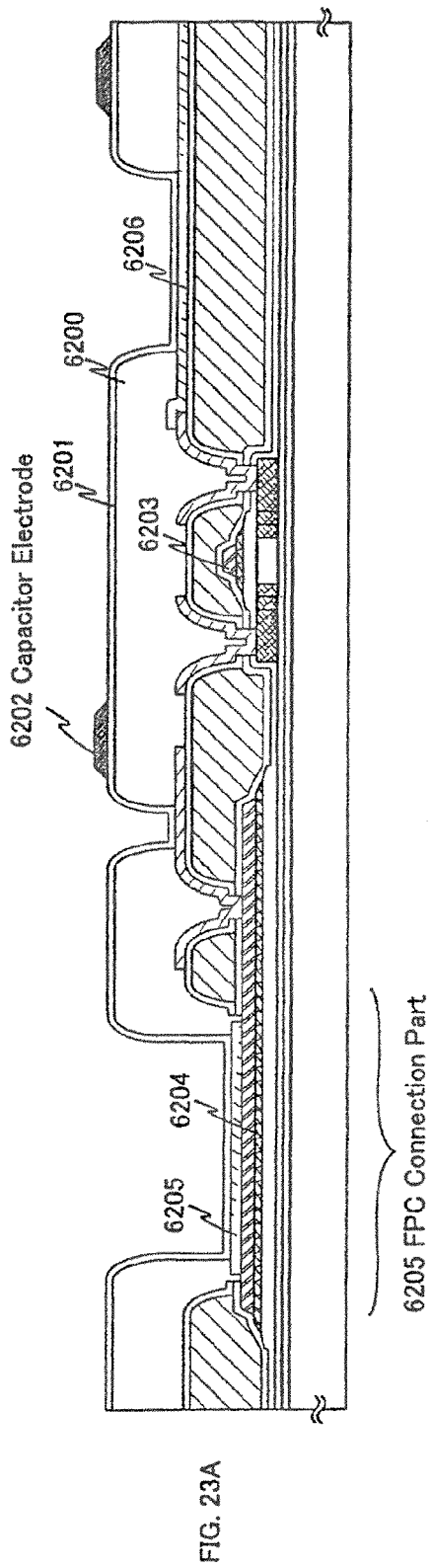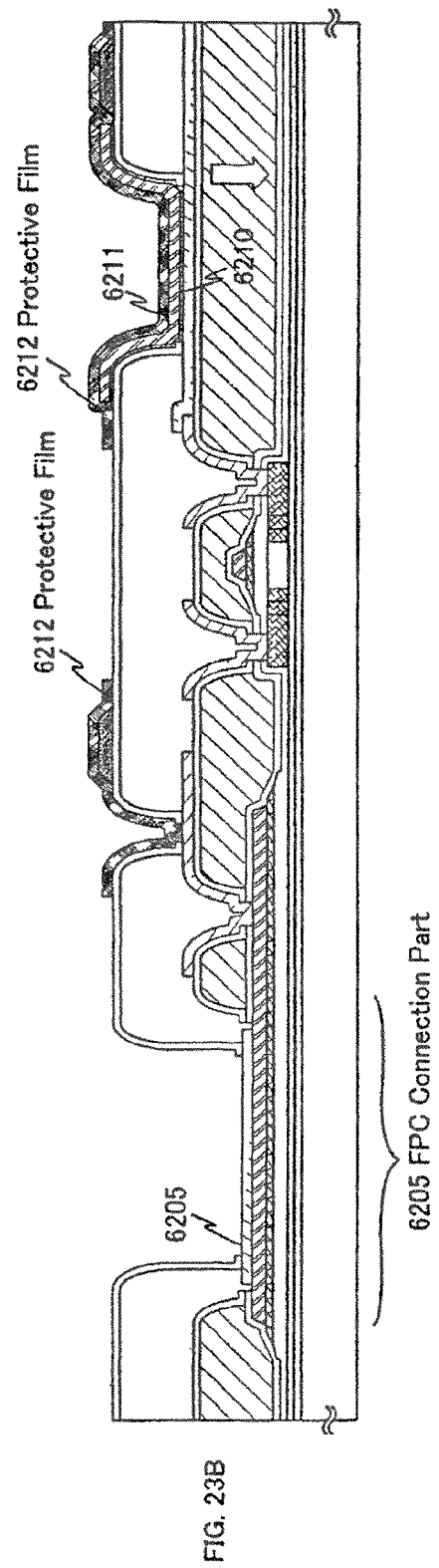
FIG. 23A
FIG. 23B

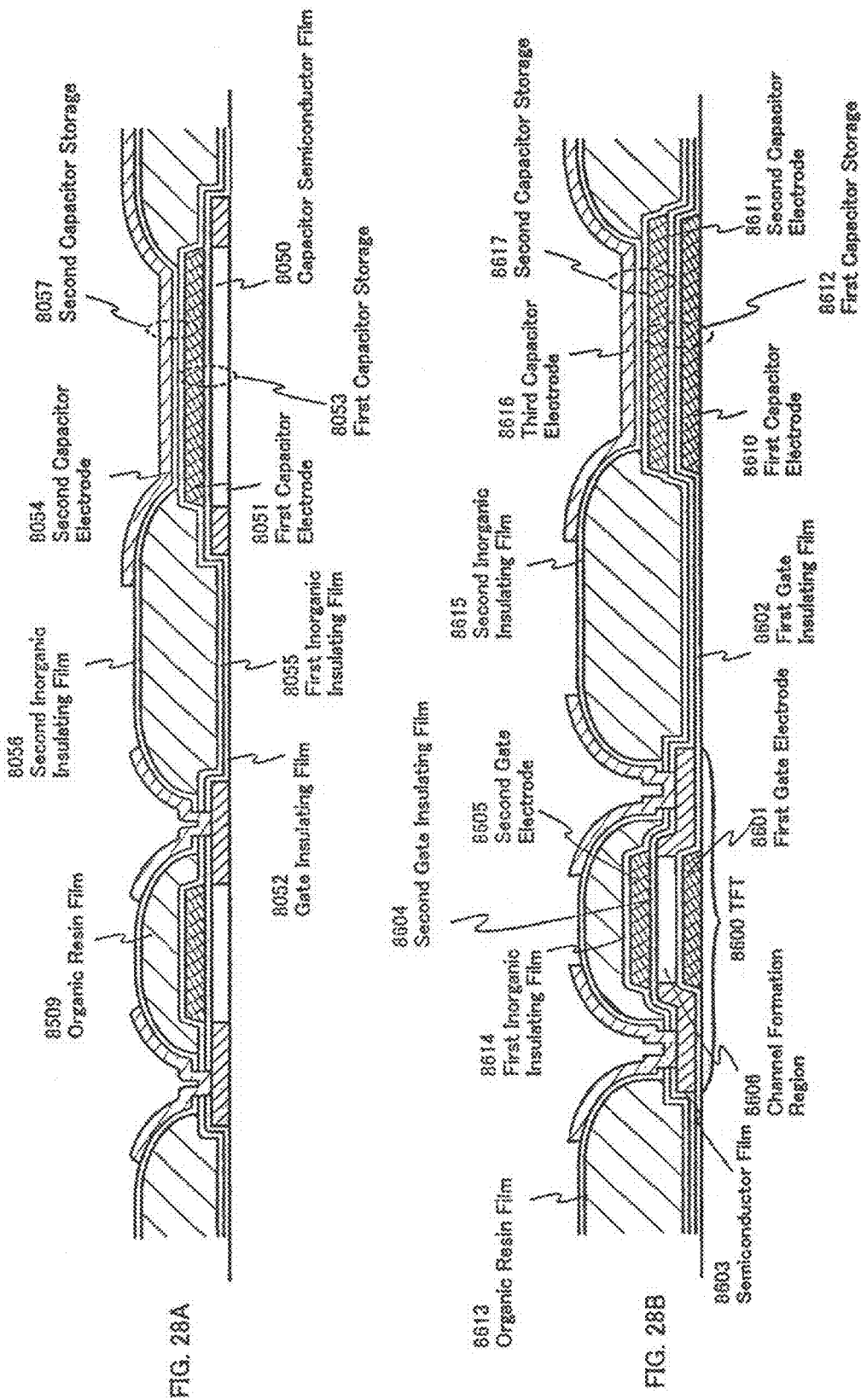

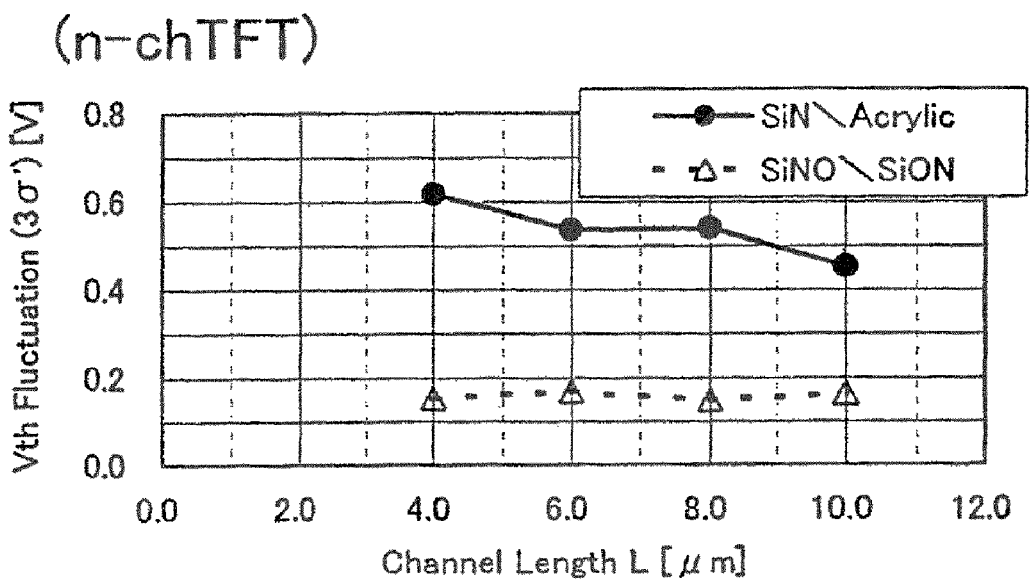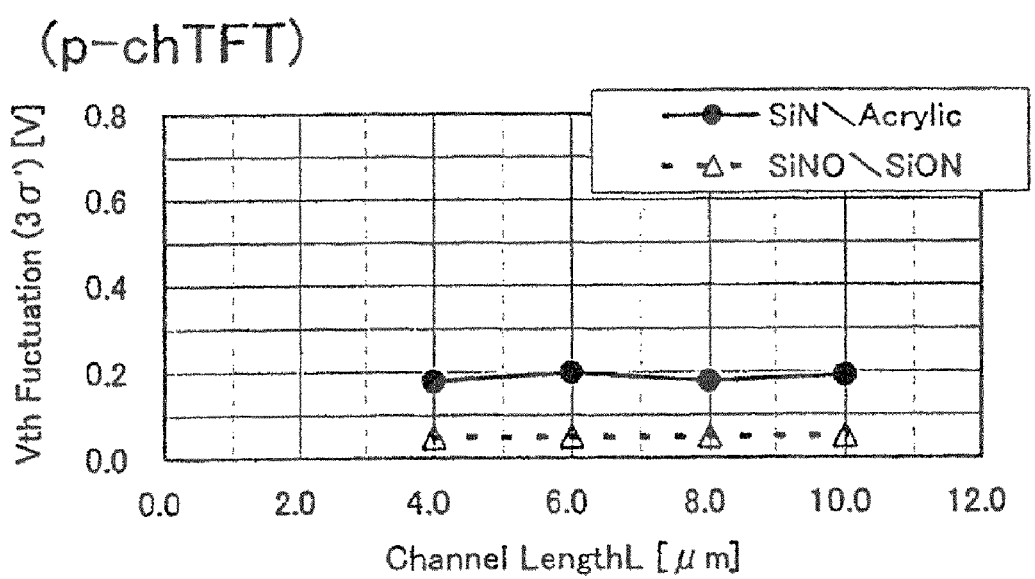
FIG. 29

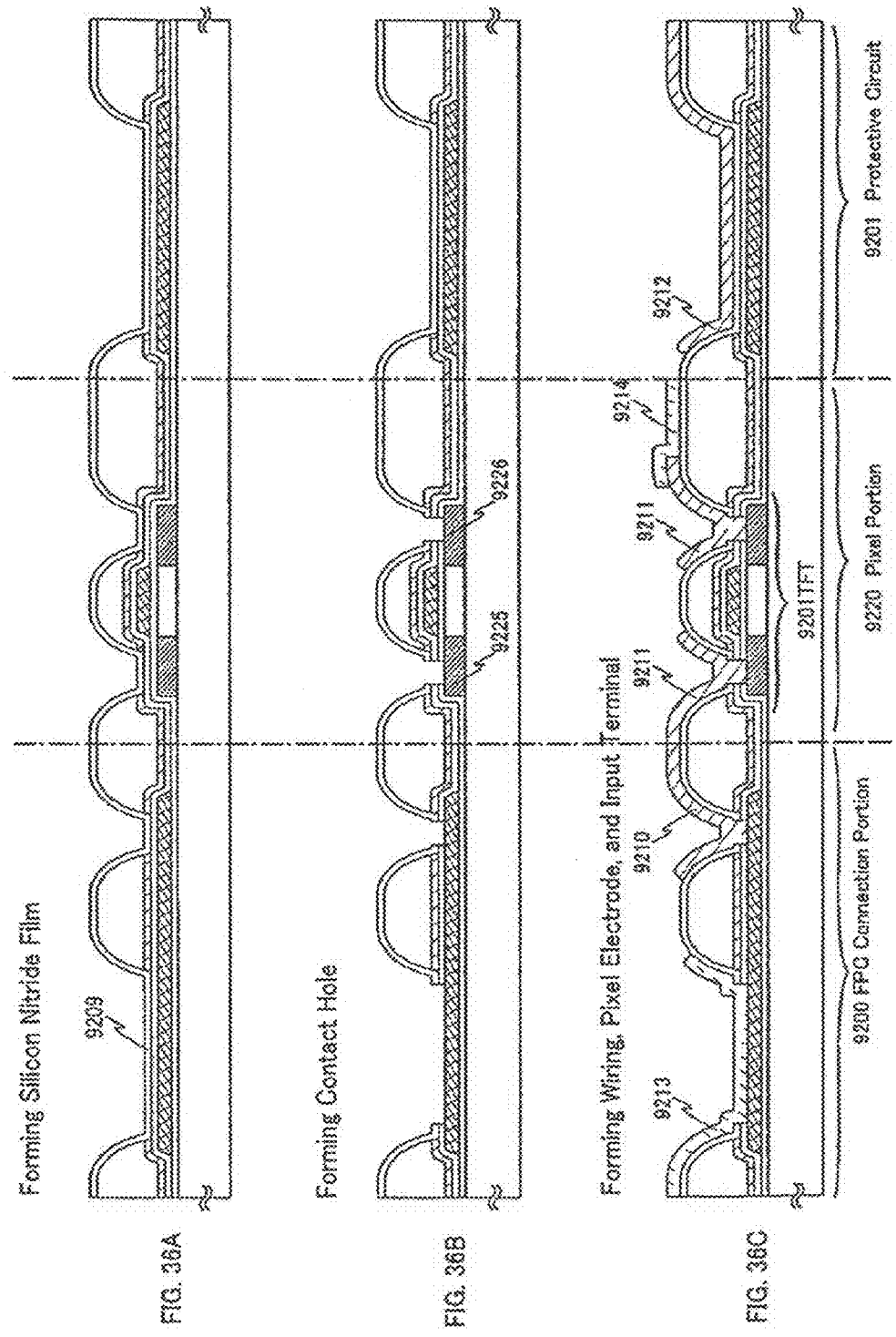

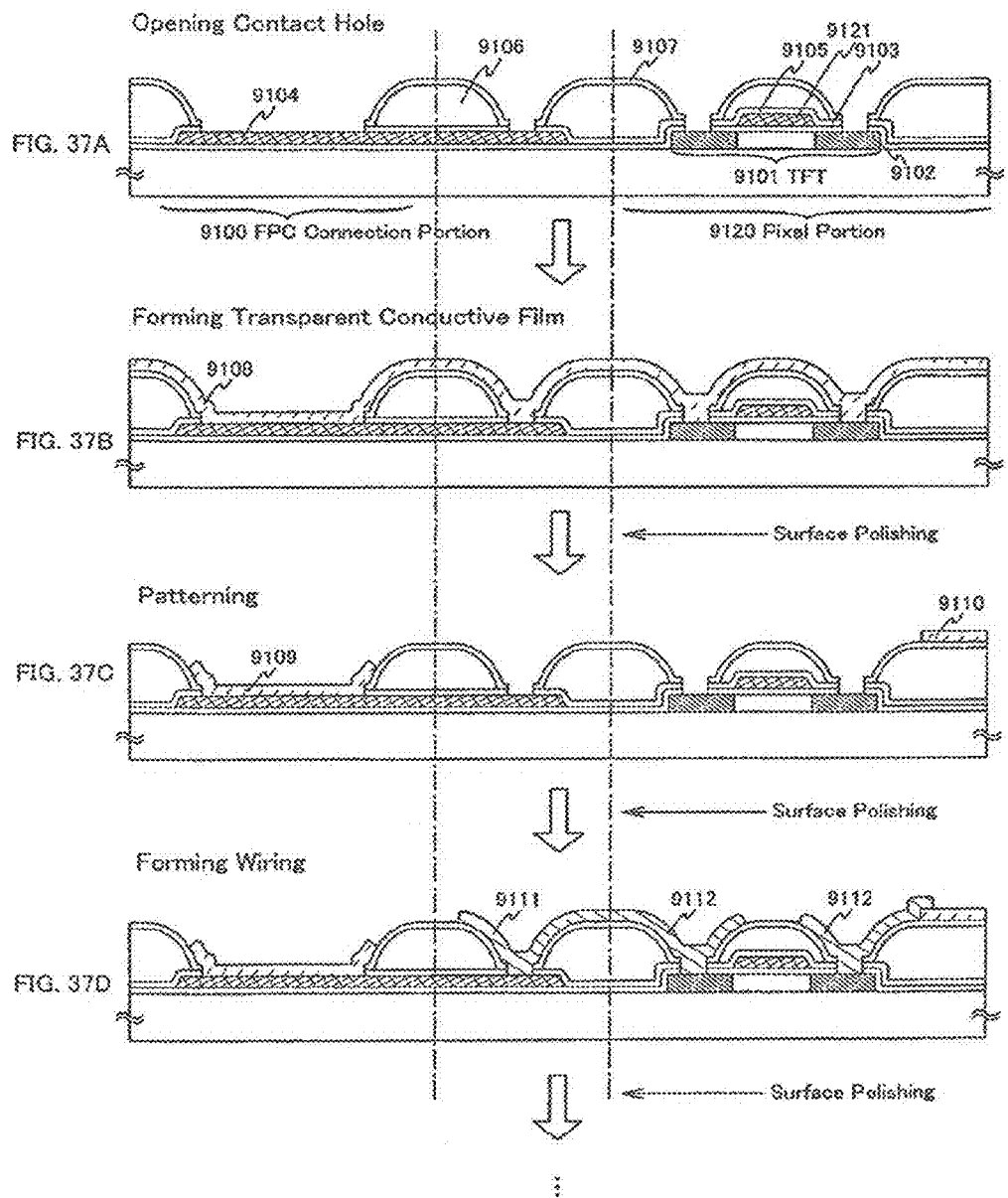

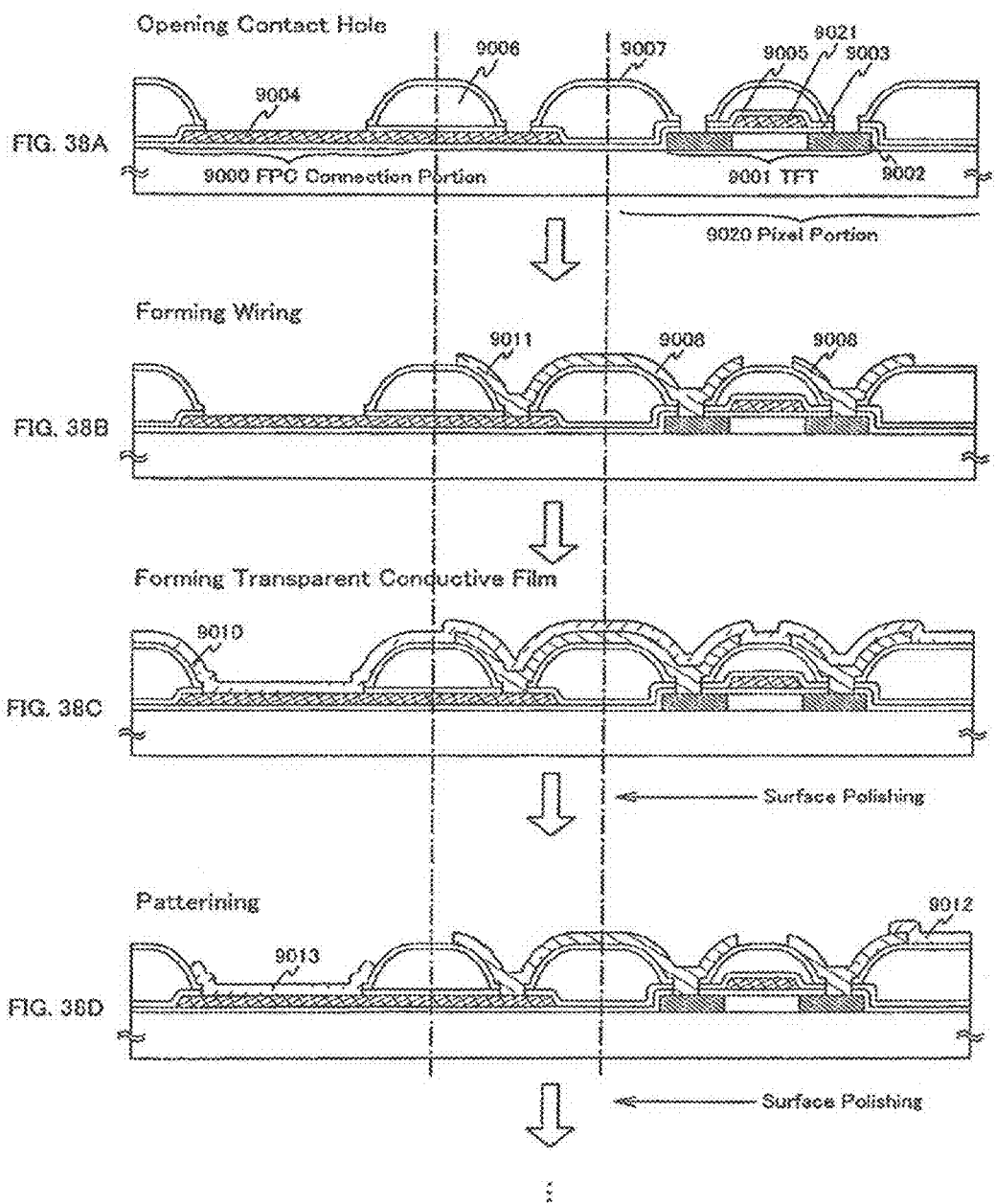

SEMICONDUCTOR DISPLAY DEVICE

BACKGROUND OF THE INVENTION

1. Field of the Invention

The present invention relates to a semiconductor display device which uses an organic resin film as an interlayer insulating film, and more specifically to a semiconductor display device structured which has a protective circuit formed in an input/output portion to protect internal circuits against breakage brought by high voltage load such as static electricity.

2. Description of the Related Art

In recent years, a technique of forming a TFT on a substrate has greatly progressed, and its application and development for an active matrix semiconductor display device as one of the semiconductor devices have been advanced. In particular, since a TFT using a polycrystalline semiconductor film has higher field-effect mobility (also referred to as mobility) than a conventional TFT using an amorphous semiconductor film, it enables high-speed operation. It is therefore possible to control the pixel by the driver circuit formed on the same substrate where the pixel is formed, though the pixel is conventionally controlled by a driver circuit provided outside the substrate.

A TFT consists of an active layer obtained by adding impurities to impart one conductivity type on a semiconductor film, a gate electrode, and a gate insulating film formed between the active layer and the gate electrode. Further, generally, an interlayer insulating film comprised of an insulating film is formed to cover the TFT, and the wiring to be electrically connected to the TFT on the interlayer insulating film is formed on the interlayer insulating film.

In a case where a wiring to be electrically connected to the TFT is formed on the interlayer insulating film, if the surface of the interlayer insulating film is not leveled sufficiently, the wiring will be broken or, though the wiring is not totally broken and locally thinned, the wiring resistance will increase. In addition to the wiring, if a pixel electrode is formed on the interlayer insulating film, the surface irregularities in the interlayer insulating film cause the surface irregularities in the pixel electrode and the inequality thickness of the pixel electrode. This may result in unevenness in a displayed image.

It is therefore necessary to give the interlayer insulating film enough thickness, 1 to 5 μm for example, so that the shape of the TFT does not cause the surface irregularities in the interlayer insulating film.

Films for use as the interlayer insulating film are roughly divided into insulating films formed of inorganic materials (hereafter referred to as inorganic insulating films) and insulating films formed of insulative organic resin (hereinafter referred to as organic resin films).

An inorganic insulating film is formed using vapor phase growth method such as CVD method and sputtering method. Using an inorganic insulating film as the interlayer insulating film has a drawback because it takes time to form a film thick enough to level the surface using vapor phase growth method.

On the other hand, if an organic resin film is used, the interlayer insulating film is formed by applying organic resin to a substrate on which the TFT is formed, and therefore a leveled surface is easily obtained.

The wiring to be connected to the TFT is obtained by forming a film having conductivity (hereinafter referred to as conductive film) on the interlayer insulating film in which a contact hole is opened and then etching the conductive film.

The conductive film can be etched either by wet etching or dry etching. Wet etching is isotropic etching and therefore is not adaptable to wiring pattern miniaturization if it goes beyond 3 μm. Dry etching, on the other hand, is anisotropic etching and therefore can deal with wiring pattern miniaturization.

However, a problem of dry etching is that, when the conductive film on an organic resin film serving as the interlayer insulating film is treated by dry etching, the surface of the organic resin film is roughen. With the surface of the organic resin film roughened, a flatness of the pixel electrode formed on the organic resin film is impaired and pixel display is accordingly affected.

Organic resin has high water-absorbing property and swells with water in an alkaline aqueous solution which is used in development. Therefore, a dehydration step of extracting water from the organic resin film by heat treatment has to be included after development. Despite dehydration through heat treatment, the organic resin film absorbs moisture in the adjacent films or in the air. There is a fear that the absorbed moisture corrodes over time the wiring that is in contact with the organic resin film and impairs the long-time reliability of the panel.

SUMMARY OF THE INVENTION

In view of the above problems, an object of the present invention is to provide a semiconductor display device with an interlayer insulating film in which surface levelness is ensured with a limited film formation time, heat treatment for removing moisture does not take long, and moisture in the interlayer insulating film is prevented from escaping into a film or electrode adjacent to the interlayer insulating film.

Research by the applicant of the present invention shows a fact that, when a resin film is used as an interlayer insulating film and a contact hole is formed using dry etching, thin film transistors obtained are largely fluctuated in threshold voltage (Vth). The data obtained can be made into a graph through estimation by statistical work of threshold voltage fluctuation, in which the horizontal axis shows the channel length (how far carriers move) and the vertical axis shows the Vth fluctuation. In recent years, statistical work called 'quartile deviation' becomes widely recognized. Quartile deviation shows the difference between the 25% value and the 75% value in normal probability graph and is noticed as statistical work that is not influenced by peculiar values. Based on quartile deviation, the applicants of the present invention have defined the difference between the 16% value and the 84% value as 16% quartile deviation and plotted it into the vertical axis as 'Vth fluctuation'. The 16% quantile deviation corresponds to $\pm\sigma$ in normal probability distribution and therefore data plot used is obtained by multiplying each by a coefficient to make them into values deemed as $\pm\sigma$. According to the data, the fluctuation is about 4 times (in n-channel TFTs) or twice (in p-channel TFTs) larger when an acrylic film is used as the interlayer insulating film. It is obviously that the use of the acrylic film increases the fluctuation. The applicants of the present invention infer that the threshold voltage fluctuation is caused by electric charges trapped in the acrylic film due to plasma damage received during dry etching.

The present invention has been made in view of the above problems, and an object of the present invention is therefore to provide a technique of building thin film transistors in manufacturing a semiconductor display device that uses an organic resin film as an interlayer insulating film without allowing the threshold voltage to fluctuate among the thin film transistors, thereby improving the stability of the operation performance of the display device and enlarging the design margin in circuit design. Another object of the present invention is to improve the image quality of the display device.

In the present invention, an organic resin film containing a positive photosensitive acrylic resin is surrounded by a nitrogen-containing insulating film that transmits less moisture compared to organic resin film.

Specifically, a TFT is formed and then a nitrogen-containing inorganic insulating film that transmits less moisture compared to organic resin film is formed so as to cover the TFT. Next, organic resin including photosensitive acrylic resin is applied and an opening is formed by partially exposing the organic resin film to light. The organic resin film where the opening is formed is then covered with a nitrogen-containing inorganic insulating film that transmits less moisture than organic resin film does. Thereafter, the gate insulating film and the two layers of the nitrogen-containing inorganic insulating films are partially etched away in the opening of the organic resin film to expose the active layer of the TFT.

What is important in this etching is to avoid exposure of the organic resin film in region where a wiring, a pixel electrode, or the like is formed not to be affected by moisture and by surface irregularities in a later step. The organic resin film may also be covered with an inorganic insulating film completely in the rest of the region.

In general, inorganic insulating films receive less etching damage in dry etching compared to organic resin films represented by acrylic resin films and accordingly the surface is roughened less. The pixel electrode or the like that is formed later is therefore saved from surface irregularities and uneven thickness, thereby preventing uneven display.

Covering the organic resin film with the nitrogen-containing inorganic insulating film that transmits less moisture compared to the organic resin does also prevents the organic resin film from releasing moisture contained within. Also this prevents the organic resin film from swelling with water in an alkaline aqueous solution which is used in development and thus saves heat treatment time for removal of moisture after development. Accordingly, moisture in the organic resin film is further prevented from escaping into a film or electrode adjacent to the organic resin film and the long-term reliability of the panel is enhanced. Moreover, in the case of a light emitting device which uses a light emitting element represented by an organic light emitting diode (OLED), it prevents degradation in luminance of the light emitting element due to moisture released from the organic resin film.

Covering the entire organic resin film with an inorganic insulating film to leave no region exposed further prevents the organic resin film from swelling with water in the alkaline aqueous solution which is used in development and thus save heat treatment time for removal of moisture after the development. Accordingly, moisture in the organic resin film is further prevented from escaping into a film or electrode adjacent to the organic resin film and the long-term reliability of the panel is enhanced.

In the present invention, photosensitive acrylic resin is used for the organic resin film. Photosensitive organic resin is classified into a positive type and a negative type; if a portion of a resin film that is exposed to energy beam such as photo, electron and ion is removed, it is the positive type, and if the exposed portion remains whereas the rest is removed, it is the negative type.

BRIEF DESCRIPTION OF THE DRAWINGS

FIGS. 3A to 3C show sectional views of a contact hole.

FIGS. 5A and 5B show sectional views of a TFT and capacitor storage of a semiconductor display device of the present invention.

FIGS. 13A to 13C show diagrams showing a method of manufacturing a semiconductor display device of the present invention.

FIGS. 14A to 14C show diagrams showing a method of manufacturing a semiconductor display device of the present invention.

FIGS. 15A to 15C show diagrams showing a method of manufacturing a semiconductor display device of the present invention.

FIGS. 16A to 16C show diagrams showing a method of manufacturing a semiconductor display device of the present invention.

FIGS. 20A and 20B show a mask draft for a buffer and capacitor storage and a sectional view of the capacitor storage.

FIGS. 23A and 23B show diagrams showing a method of manufacturing a semiconductor display device of the present invention.

FIGS. 28A and 28B show sectional views of a semiconductor display device of the present invention.

FIG. 29 shows diagrams showing the relation between the channel length and threshold of TFTs.

FIGS. 36A to 36C show diagrams showing a method of manufacturing a semiconductor display device of the present invention.

FIGS. 37A to 37D show diagrams showing a method of manufacturing a semiconductor display device of the present invention.

FIGS. 38A to 38D show diagrams showing a method of manufacturing a semiconductor display device of the present invention.

DETAILED DESCRIPTION OF THE PREFERRED EMBODIMENT

Figure 1A:
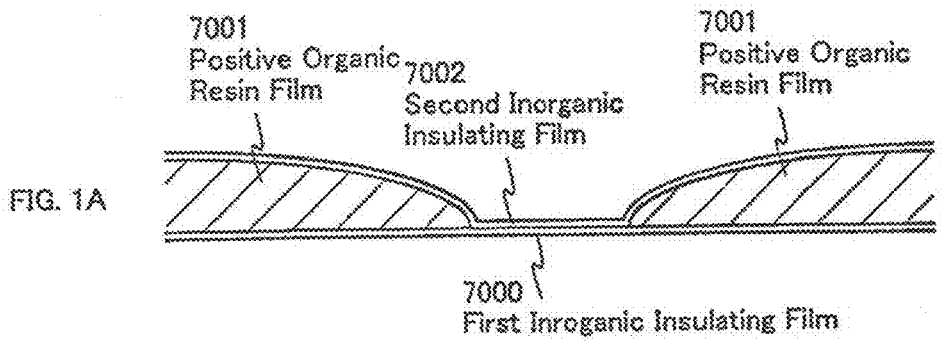
FIGS. 1A to 1D show sectional views of photosensitive acrylic films in openings.

Sectional views of an opening in positive acrylic resin and an opening in negative acrylic resin are shown in FIGS. 1A to 1D. In the case of positive acrylic resin, as shown in FIG. 1A, a first inorganic insulating film 7000 is formed before a positive acrylic organic resin film is formed and then a portion of the organic resin film where an opening is to be formed is exposed to light. Thereafter, the portion exposed to light is removed through development to expose the first inorganic insulating film 7000. Then a second inorganic insulating film 7002 is formed so as to cover the positive organic resin film with the opening (the film being denoted by 7001) and the exposed portion of the first inorganic insulating film 7000.

Figure 1B:
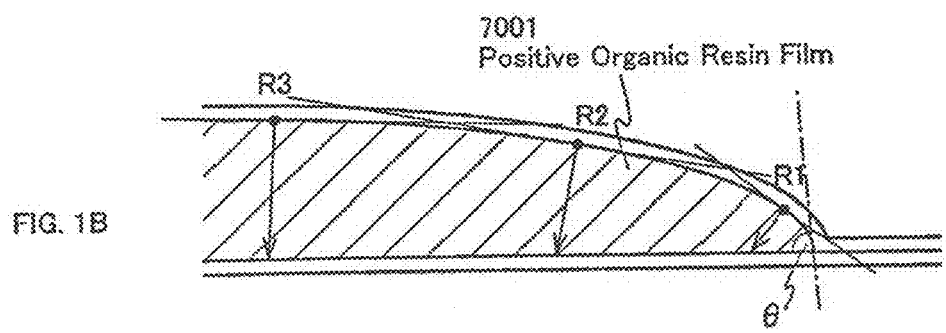

FIG. 1B shows an enlarged view of the section of the positive organic resin film 7001 with the opening. As shown in FIG. 1B, the opening in section forms a curve. Tangent lines of the curve at points on the surface of the positive organic resin film 7001 are slanted with respect to the substrate direction (horizontal direction) and the slant becomes smaller as the distance from the opening is increased. In other words, the radius of curvature measured at each of the contact points R1, R2, and R3 becomes continuously longer as the distance from the opening is increased, thereby describing a parabola that has its principal axis in a plane parallel to the substrate. For instance, the minimum radius of curvature at an end of a positive photosensitive acrylic film is approximately 3 to 30 µm, although depending on exposure conditions. At each of the contact points R1, R2, and R3, all the center of curvature are on the side of the positive organic resin film 7001 (substrate side).

When using positive acrylic, an angle θ of the tangent line at the contact point where the positive organic resin film 7001 fades into the opening can be set equal to or larger than 30° and equal to or smaller than 65° with respect to the substrate.

As described, in the case of a positive organic resin film, all the centers of curvature of the surface of the organic resin film in the opening are on the substrate side and there is little chance that defective etching leaves a part of the film in the portion that needs to be opened. Accordingly, less contact defects are caused and the yield is improved.

Figure 1C:
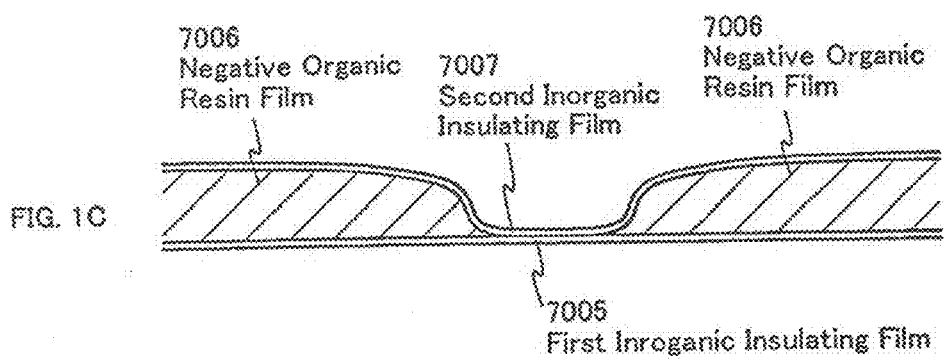

In the case of negative acrylic resin, as shown in FIG. 1C, a first inorganic insulating film 7005 is formed before a negative acrylic organic resin film is formed and then a portion of the organic resin film except a part where an opening is to be formed is exposed to light. Thereafter, the portion not exposed to light is removed through development to expose the first inorganic insulating film 7005. Then a second inorganic insulating film 7007 is formed so as to cover the negative organic resin film 7006 where the opening is formed and the exposed portion of the first inorganic insulating film 7005.

Figure 1D:
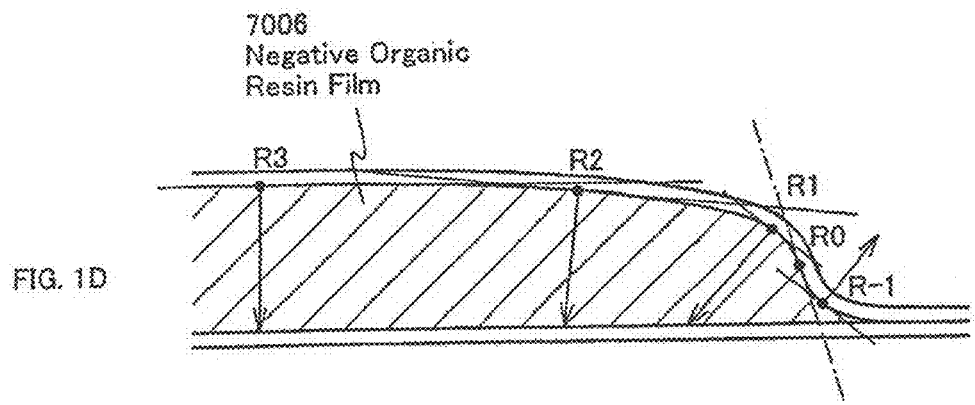

FIG. 1D is an enlarged view of the section of the negative organic resin film 7006 with the opening. As shown in FIG. 1D, the opening in section forms a curve. Tangent lines of the curve at points on the surface of the negative organic resin film 7006 are slanted with respect to the substrate direction (horizontal direction) and the slant becomes smaller as the distance is increased away from a contact point R0 in the opening. In other words, the radius of curvature measured at contact points R1, R2, and R3 becomes continuously longer as the distance from the contact point R0 is increased leaving the opening. Toward the center of the opening from the contact point R0, the slant of the tangent line becomes small and the radius of curvature is continuously increased. At the contact points R1, R2, and R3 outside of the contact point R0 in the opening, the center of curvature is on the side of the negative organic resin film 7006 (the substrate side). At a contact point R-1 that is between the contact point R0 and the center of the opening, the center of curvature is on the side opposite to the negative organic resin film 7006 (the side opposite to the substrate).

As described, in the case of a negative organic resin film, the center of curvature of the surface of the organic resin film from the contact point R0 toward the center of the opening is on the side opposite to the substrate. The longer the distance from the contact point R0 to a point where the negative organic resin film 7006 ceases, the smaller the area of the opening becomes and the higher the possibility of defective contact rises. The distance is changed by changing etching conditions and the thickness of the organic resin film before the opening is formed. FIG. 1 show the case of acrylic resin as an example. In the case of using a film of organic resin other than acrylic resin, the composition of the resin also changes the distance from the contact point R0 to the point where the organic resin film 7006 ceases. Therefore, negative photosensitive organic resin which forms the sectional shape shown in FIGS. 1C and 1D is made employable if the distance from the contact point R0 to the point where the negative organic resin film 7006 ceases is shortened to a length that ensures enough area for the opening, for example, about 1 µm.

Still, as a part of an interlayer insulating film, organic resin that can form the sectional shape shown in FIGS. 1A and 1B is preferred to organic resin which forms the sectional shape shown in FIGS. 1C and 1D. However, not all of positive photosensitive organic resin can form the sectional shape shown in FIGS. 1A and 1B; positive acrylic can form the sectional shape shown in FIGS. 1A and 1B whereas positive polyimide can not.

When using non-photosensitive organic resin, commonly dry etching is used to form an opening in the interlayer insulating film. Dry etching is an etching method that uses plasma of active radical or reactive gas. The interlayer insulating film is ten times as thick as a gate insulating film, and dry etching to form an opening therein takes time, keeping the process object exposed to plasma that much longer. If a substrate on which a TFT is formed is exposed to plasma for a long period of time, the TFT threshold is easily fluctuated toward the plus side because of so-called charging damage in which holes are trapped in a gate insulating film. By employing photosensitive organic resin and using wet etching to form an opening as in the present invention, the dry etching period is significantly shortened and fluctuation of TFT threshold is therefore prevented.

Furthermore, in the present invention, a gate electrode of a TFT and one electrode of a capacitor used in a driving circuit of a semiconductor display device are formed at the same time whereas a wiring electrically connected to the TFT and the other electrode of the capacitor are formed at the same time. Then two layers of inorganic insulating films in the opening of the organic resin film overlap each other and are sandwiched between two electrodes to form capacitor storage.

This capacitor storage is used in a protective circuit of the semiconductor display device of the present invention.

Static electricity generated by friction or other causes reaches as high voltage as several tens V, even several tens kV in some cases. When a human or object electrified touches a semiconductor display device, the charges may be discharged at once in as short a period as several µs to several ms through an input terminal, wiring, or circuit of the semiconductor display device. Such rapid electric discharge could degrade or break a very thin gate insulating film and a TFT or other semiconductor element with a very short channel length, which are used in circuits of the semiconductor display device.

In addition, noise is sometimes contained at a given frequency in a clock signal or the like that an input terminal of a semiconductor display device receives. The noise gives a voltage higher or lower than a desired voltage to a semiconductor element in an instant, thereby causing malfunction of the semiconductor element. In case of semiconductor display devices in particular, the noise can result in disturbed images.

The present invention uses the above capacitor storage for a capacitor of a protective circuit that protects a semiconductor element from degradation or damage caused by static electricity discharge and prevents malfunction of a semiconductor element due to noise. With the above structure, the protective circuit can readily be built on the same substrate where a pixel portion is formed, degradation or breakage of a semiconductor element by static electricity is prevented, and malfunction by noise is avoided to prevent disturbed images.

Figure 2:
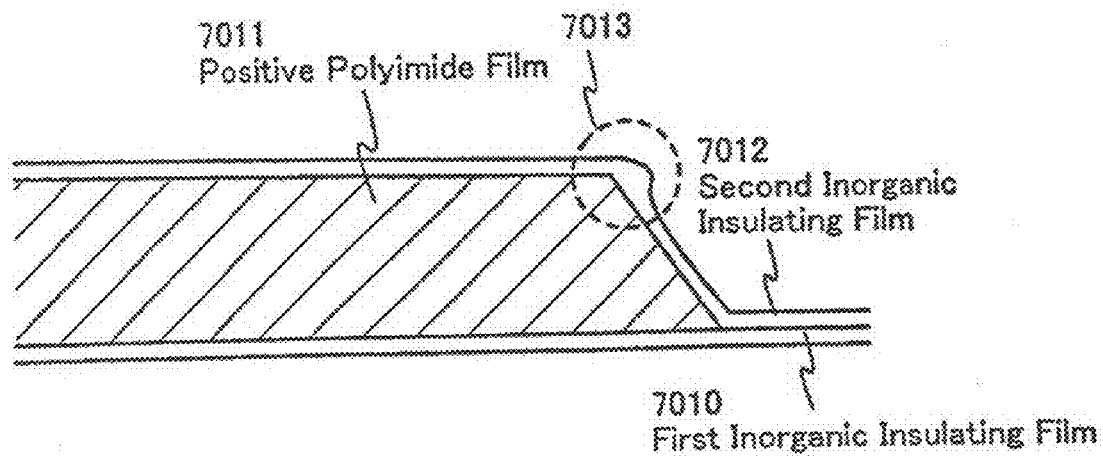
FIG. 2 shows a sectional view of a photosensitive positive polyimide fi an opening.

FIG. 2 shows an enlarged view of the section in an opening when a positive photosensitive polyimide is employed. Similar to the case where positive acrylic is used, a positive polyimide film is formed after a first inorganic insulating film 7010 is formed as shown in FIG. 2. A portion where the opening is to be formed is exposed to light and developed to form the opening, thereby exposing the first inorganic insulating film 7010. Then a second inorganic insulating film 7012 is formed so as to cover the positive polyimide film with the opening (the film being denoted by 7011) and the exposed portion of the first inorganic insulating film 7010.

As to the positive polyimide film 7011 with the opening, an end of the film is not sufficiently rounded in the opening. This makes a wiring thin when formed on the second inorganic insulating film 7012 at the end, and then the wiring resistance is increased. On the other hand, the insufficiently rounded end of the positive polyimide film 7011 in the opening may cause the second inorganic insulating film 7012 on an edge 7013 to be thicker than the rest when the second inorganic insulating film 7012 is formed by vapor phase growth. This is because molecules of the material that constitutes the thin film move, upon landing on a surface to be coated, over the surface seeking for a stable site and tend to gather in a portion shaped to have a sharp angle (a convex shape) such as an upper edge of a contact hole. This tendency is particularly notable in evaporation. When the thickness of the second inorganic insulating film 7012 is partially increased at the edge 7013, the wiring is thinned particularly at the end to bring an increase in wiring resistance.

Consequently, it is not preferable to use as a part of an interlayer insulating film of the present invention, positive photosensitive polyimide or other organic resin that does not form a curve at an end in the opening as the sectional shape shown in FIG. 2.

Next a description is given on the section near a contact hole which is opened by etching an inorganic insulating film. After the state shown in FIG. 1A is reached, a resist mask 7021 is formed and a contact hole 7023 is formed by dry etching of the first inorganic insulating film 7000, the second inorganic insulating film 7002, and a gate insulating film 7022, which is formed between the first inorganic insulating film and a semiconductor film, as shown in FIG. 3A.

FIG. 3B shows the vicinity of the contact hole viewed from above the substrate after the resist mask 7021 is removed for clearer view. A sectional view taken along the line A-A' in FIG. 3B corresponds to FIG. 3A.

The contact hole 7023 is formed in the opening 7024, which is formed in the positive organic resin film 7001. Then a conductive film 7025 is formed on the second inorganic insulating film 7002 to cover the contact hole 7023 as shown in FIG. 3C. The conductive film 7025 is patterned to form a wiring.

FIG. 4 shows the positional relation between the wiring, the opening 7024 of the positive organic resin film 7001 and the contact hole 7023 respectively. FIG. 4A is a top view showing the vicinity of the contact hole 7023. FIG. 4B is a sectional view taken along the line A-A' in FIG. 4A.

The wiring 7026 obtained by patterning the conductive film 7075 is connected through the contact hole 7023 that is formed about the center of the opening 7024 to a semiconductor film 7300 which is formed under the gate insulating film 7022.

As described, the contact hole 7023 has to be confined within the opening 7024 in order to avoid exposing the positive organic resin film 7001 in the contact hole 7023 after the contact hole 7023 is formed.

Figure 4A:
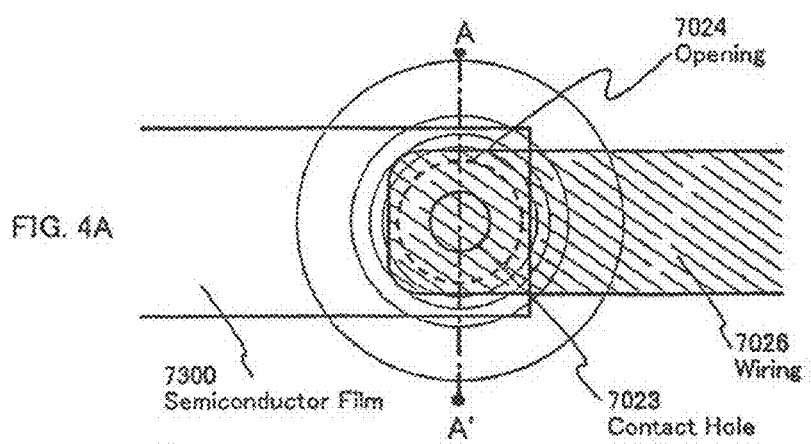
FIGS. 4A to 4D show diagrams showing the positional relation between a contact hole and a wiring.
Figure 4B:
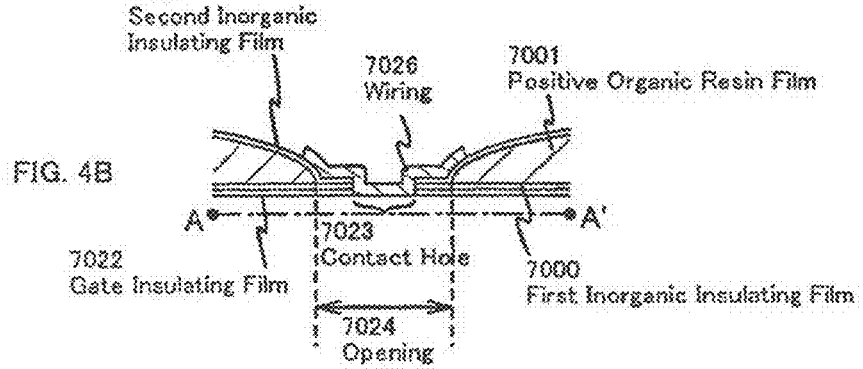

The contact hole 7023 in FIGS. 4A and 4B is positioned about the center of the opening 7024, but the present invention is not limited to this structure. The contact hole 7023 may be off the center of the opening 7024 as long as it is confined within the opening 7024.

Figure 4C:
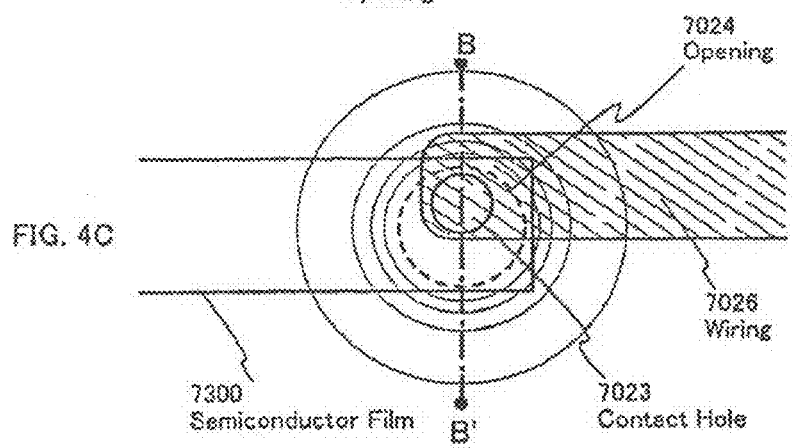
Figure 4D:
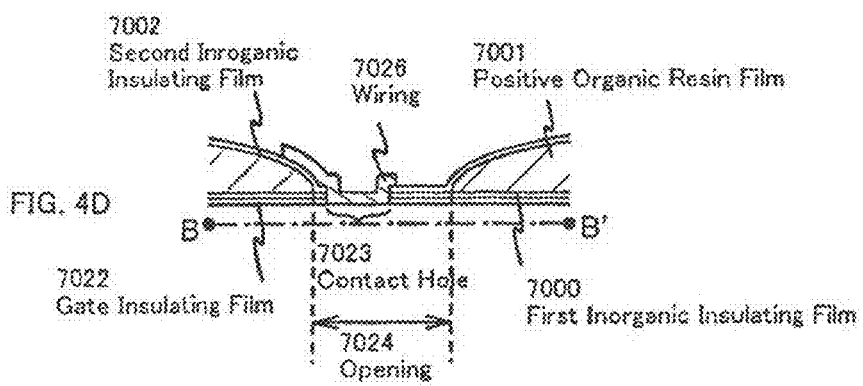

FIG. 4C is a top view showing the vicinity of the contact hole 7023 in the case where the contact hole 7023 is off the center of the opening 7024. FIG. 4D is a sectional view taken along the line B-B' in FIG. 4C.

The wiring 7026 obtained by patterning the conductive film 7025 is connected to the semiconductor film (not shown in the drawing) formed under the gate insulating film 7022 through the contact hole 7023 that is in an upper part of the opening 7024 in the drawing.

FIGS. 4A to 4D show contact between the wiring and the semiconductor film and the same applies to contact between the wiring and a gate electrode.

Next, a description will be given with reference to FIG. 5 on the structure of a TFT and a capacitor in a semiconductor display device of the present invention.

In FIG. 5A, a TFT 8001 is formed on an insulating surface 8000. The TFT 8001 is of top gate type, and has a semiconductor film 8002, a gate insulating film 5003 that is in contact with the semiconductor film 8002, and a gate electrode 8004 that is in contact with the gate insulating film 8003. The semiconductor film 8002 is in contact with the insulating surface 8000. The semiconductor film 8002 has a channel formation region 8005 and impurity regions 8006 that sandwich the channel formation region 8005.

A first capacitor electrode 8007 is formed on the gate insulating film 8003 from a conductive film that is used to form the gate electrode 8004.

A first inorganic insulating film 8008 is formed so as to cover the TFT 8001 and the first capacitor electrode 8007. The first inorganic insulating film 8008 is an insulating film containing nitrogen and transmits less moisture than an organic resin film which is formed later does.

Photosensitive organic resin is applied to the top fate of the first inorganic insulating film 8008 and baked. A portion of the resin film where an opening is to be formed is exposed to light and developed to obtain an organic resin film 8009 with an opening. At this point, a part of the first inorganic insulating film 8008 is exposed in the opening.

A second inorganic insulating film 8010 is formed to cover the organic resin film 8009 and the portion of the first inorganic insulating film 8008 that is exposed in the opening. The second inorganic insulating film 8010 is, similar to the first inorganic insulating film 8008, an insulating film containing nitrogen and transmits less moisture than an organic resin film which is formed later does.

The first inorganic insulating film 8008 and the second inorganic insulating film 8010 are used as dielectric of capacitors. Therefore, if the first and second inorganic insulating films are too thick, the capacitance value of the capacitors is reduced and treatment time for forming the films is prolonged. On the other hand, too thin first and second inorganic insulating films have only a small degree of effect in preventing permeation of moisture. Preferably, the first inorganic insulating film 8008 and the second inorganic insulating film 8010 each have a thickness of about 10 to 200 nm and the total thickness of the two layers is preferably about 20 to 400 nm.

A contact hole is formed by dry etching through the gate insulating film 8003, the first inorganic insulating film 8008, and the second inorganic insulating film 8010 so that a part of the semiconductor film is exposed in the opening of the organic resin film 8009. During the dry etching, the semiconductor film 8002 serves as an etching stopper.

The first inorganic insulating film 8008 and the second inorganic insulating film 8010 existing above the first capacitor electrode 8007 are kept covered with a resist mask in order to avoid being etched during the dry etching.

The resist mask is then removed using a developer. A developer in general is an alkaline aqueous solution and contains a large amount of moisture. In the present invention, the organic resin film 8009 is covered with the first inorganic insulating film 8008 and the second inorganic insulating film 8010 to avoid direct exposure to a developer. Therefore, moisture in the developer is mostly prevented from entering the organic resin film 8009 and hardly causes swelling. Accordingly, heat treatment for removal of moisture after the resist mask is removed using the developer can be finished in a shortened period of time.

Then a conductive film is formed on the second inorganic insulating film 8010 so as to cover the contact hole. The conductive film is etched to form a wiring 8011 which is connected to the semiconductor film 8002, and the second capacitor electrode 8012. The second capacitor electrode 8012 overlaps the first capacitor electrode 8007 sandwiching between the first inorganic insulating film 8008 and the second inorganic insulating film 8010. The second capacitor electrode 8012, the first inorganic insulating film 8008, the second inorganic insulating film 8010, and the first capacitor electrode 8007 form capacitor storage 8013.

The present invention is characterized by using this capacitor storage 8013 as a capacitor included in a protective circuit of the semiconductor display device. Also, the transistor structured in the protective circuit is used as a TFT of the protective circuit as above.

As the end of the opening in the organic resin film 8009 is more gently curved in section, the gate electrode comes nearer to the end of the opening. However, the gate electrode is prevented from touching the wiring or the like formed in the opening even when the gate electrode pushes up through the end of the opening and is exposed because the second inorganic insulating film is formed on the organic resin film 8009 in the present invention.

The TFT 8001 may either be of top gate type or bottom gate type.

In addition to the capacitor storage of FIG. 5A, capacitor storage may be formed between the semiconductor film and the first capacitor electrode 8007. FIG. 28A shows an example in which first capacitor storage 8053 is formed by overlapping a capacitor semiconductor film 8050 and a first capacitor electrode 8051 with a gate insulating film 8052 interposed therebetween. Similar to FIG. 5A, second capacitor storage 8057 is formed by overlapping the first capacitor electrode 8051 and a second capacitor electrode 8054 with a first inorganic insulating film 8055 and a second inorganic insulating film 8056 interposed therebetween. By forming upper capacitance and lower capacitance as this, a higher capacitance value is obtained using the same area.

Alternatively, a so-called dual gate TFT may be employed in which two gate electrodes overlap each other with a channel formation region sandwiched therebetween. FIG. 28B is a sectional view of a semiconductor device using a dual gate TFT. A TFT 8600 has a first gate electrode 8601, a first gate insulating film 8602, a semiconductor film 8603, a second gate insulating film 8604, and a second gate electrode 8605. The first gate electrode 8601 overlaps a channel formation region 8606 of the semiconductor film 8603 with the first gate insulating film 8602 interposed between the two. The second gate electrode 8605 overlaps the channel formation region 8606 with the second gate insulating film 8604 sandwiched therebetween. Moreover the first gate electrode 8601 and the second gate electrode 8605 overlap sandwiching the channel formation region 8606.

If the same level of voltage is applied to the first gate electrode and the second gate electrode, a depletion layer spreads as fast as when the semiconductor film is actually thinned. Therefore, the sub-threshold coefficient (S value) can be reduced while the ON current is raised. Furthermore, interface scatter can be reduced and the trans-conductance (gm) is increased. By applying a common voltage to the first or second gate electrode, the threshold fluctuation is reduced compared to the ease in which there is only one electrode and OFF current can be reduced as well.

The first gate insulating film 8602 is in contact with a first capacitor electrode 8610 that is formed from the same conductive film as the first gate electrode 8601. The second gate insulating film 8604 is in contact with the first gate insulating film. A second capacitor electrode 8611 is formed from the same conductive film as the second gate electrode 8604 and is in contact with the second gate insulating film. The first capacitor electrode 8610 and the second capacitor electrode 8611 overlap each other with the first gate insulating film 8602 and the second gate insulating film 8604 interposed therebetween, and first capacitor storage 8612 is formed in the portion where these electrodes overlap.

The second capacitor electrode 8611 is in contact with a first inorganic insulating film 8614 in an opening of an organic resin film 8613. A second inorganic insulating film 8615 is formed so as to have a contact with the first inorganic insulating film 8614. A third capacitor electrode 8616 is formed so as to have a contact with the second inorganic insulating film 8615. The second capacitor electrode 8611 and the third capacitor electrode 8616 overlap each other with the first inorganic insulating film 8614 and the second inorganic insulating film 8615 interposed therebetween, and second capacitor storage 8617 is formed in the portion where these electrodes overlap. By forming an upper capacitor and a lower capacitor as this, the capacitance value obtained from the same area is increased.

FIG. 5B shows the structure of a semiconductor display device of the present invention which uses a bottom gate TFT.

In FIG. 5B, a TFT 8101 is formed on an insulating surface 8100. The TFT 8101 is of bottom gate type, and has a semiconductor film 8102, a gate insulating film 8103 that is in contact with the semiconductor film 8102, and a gate electrode 8104 that is in contact with the gate insulating film. The gate electrode 8104 is in contact with the insulating surface 8100. The semiconductor film 8102 has a channel formation region 8105 and impurity regions 8106 that sandwich the channel formation region. Denoted by 8115 is an insulating film used as a mask when the semiconductor film is doped with an impurity, and the insulating film is called here as a channel protecting film.

A first capacitor electrode 8107 is formed on the insulating surface 8100 from the same conductive film as the gate electrode 8104.

A first inorganic insulating film 8108 is formed so as to cover the TFT 8401 and the first capacitor electrode 8107. Then photosensitive organic resin is applied to the top face of the first inorganic insulating film and baked. A portion of the resin film where an opening is to be formed is exposed to light and developed to obtain an organic resin film 8109 with an opening. At this point, a part of the first inorganic insulating film 8108 is exposed in the opening.

A second inorganic insulating film 8110 is formed to cover the organic resin film 8109 and the portion of the first inorganic insulating film 8108 that is exposed in the opening. The second inorganic insulating film 8110 is, similar to the first inorganic insulating film 8108, an insulating film containing nitrogen and transmits less moisture than an organic resin film which is formed later does.

The first inorganic insulating film 8108 and the second inorganic insulating film 8110 are used as dielectric of capacitors. Therefore, if the first and second inorganic insulating films are too thick, the capacitance value of the capacitors is reduced and treatment time for forming the films is prolonged. On the other hand, too thin first and second inorganic insulating films have only a small degree of effect in preventing permeation of moisture. In the bottom gate TFT, the gate insulating film 8103 is also between the first capacitor electrode 8107 and a second capacitor electrode 8112 and is used as a part of the dielectric. Therefore, it is necessary to determine the thicknesses of the first inorganic insulating film 8108 and the second inorganic insulating film 8110, taking into account the thickness of the gate insulating film 8103. Preferably, the first inorganic insulating film 8108 and the second inorganic insulating film 8110 each have a thickness of about 10 to 200 nm, and the total thickness of the three layers, namely, the first and second inorganic insulating films plus the gate insulating film, is preferably about 30 to 500 nm.

A contact hole is formed by dry etching through the gate insulating film 8103, the first inorganic insulating film 8108, and the second inorganic insulating film 8110 so that a part of the semiconductor film is exposed in the opening of the organic resin film 8109. During the dry etching, the semiconductor film 8102 serves as an etching stopper.

The first inorganic insulating film 8108 and the second inorganic insulating film 8110 existing above the first capacitor electrode 8107 are kept covered with a resist mask during the dry etching in order to avoid being etched.

The resist mask is then removed using a developer. A developer in general is an alkaline aqueous solution and contains a large amount of moisture. In the present invention, the organic resin film 8109 is covered with the first inorganic insulating film 8108 and the second inorganic insulating film 8110 to avoid direct exposure to a developer. Therefore, moisture in the developer is mostly prevented from entering the organic resin film 8109 and hardly causes swelling. Accordingly, heat treatment for removal of moisture after the resist mask is removed using the developer can be finished in a shortened period of time.

Then a conductive film is formed on the second inorganic insulating film 8110 so as to cover the contact hole. The conductive film is etched to form a wiring 8111 which is connected to the semiconductor film 8102, and the second capacitor electrode 8112. The second capacitor electrode 8112 overlaps the first capacitor electrode 8107 sandwiching between the first inorganic insulating film 8108 and the second inorganic insulating film 8110. The second capacitor electrode 8112, the first inorganic insulating film 8108, the second inorganic insulating film 8110, and the first capacitor electrode 8107 form capacitor storage 8113.

Figure 6:
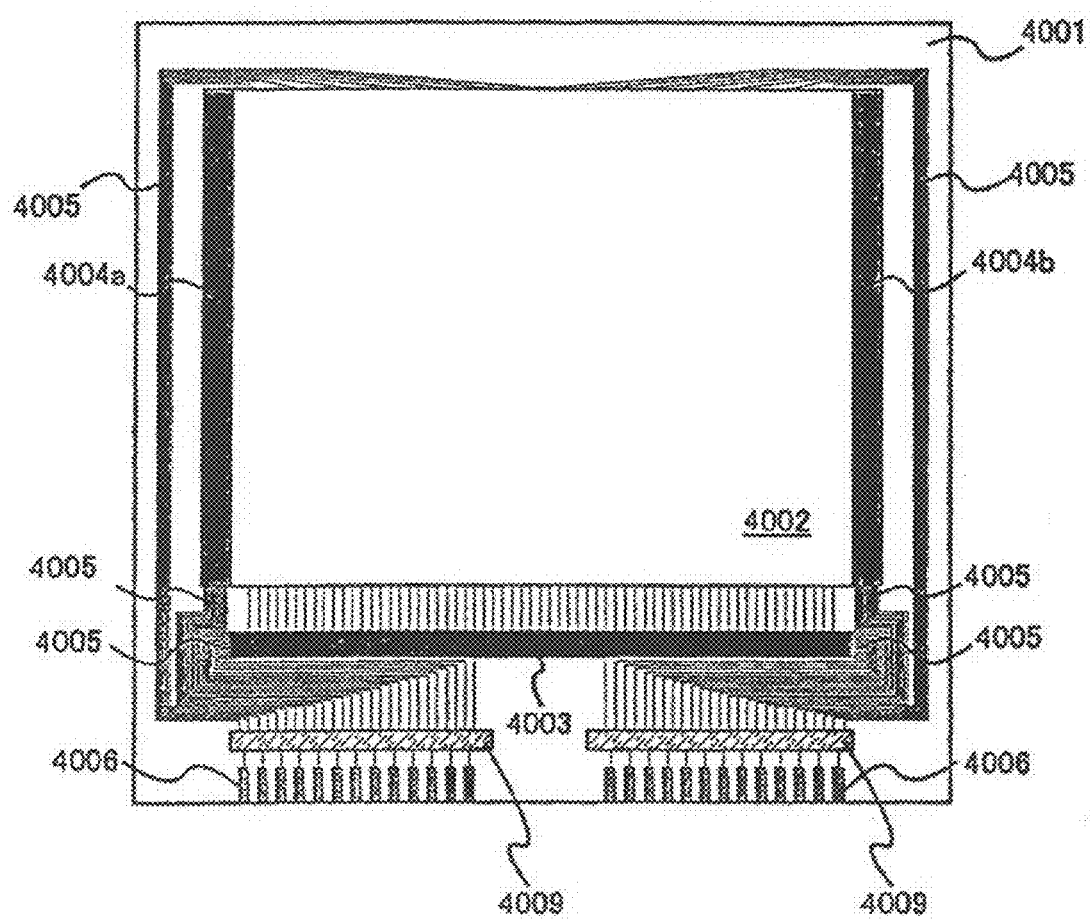
FIG. 6 shows a block diagram of driving circuits in a semiconductor display device of the present invention.

The description given next is about the structure of a protective circuit of a semiconductor display device of the present invention. FIG. 6 is a top view of an element substrate of a semiconductor display device of the present invention on which a semiconductor element is formed.

The element substrate is obtained by forming, on a substrate 4001, a pixel portion 4002, a signal line driving circuit 4003, a first scanning line driving circuit 4004a, and a second scanning line driving circuit 4004b. In the present invention, the number of signal line driving circuits and the number of scanning line driving circuits are not limited to those in FIG. 6. How many signal line driving circuits and scanning line driving circuits are to be provided can be set at a designer's discretion.

Denoted by 4005 is a lead wiring for supplying power supply voltage or various signals to the pixel portion 4002 and the first and second scanning line driving circuits 4004a and 4004b.

A signal inputted to an input terminal 4006 is supplied to the lead wiring 4005 after its noise is removed by a protective circuit 4009. The protective circuit 4009 also prevents static electricity discharged from the input terminal 4006 from being sent to downstream circuits.

Figure 7:
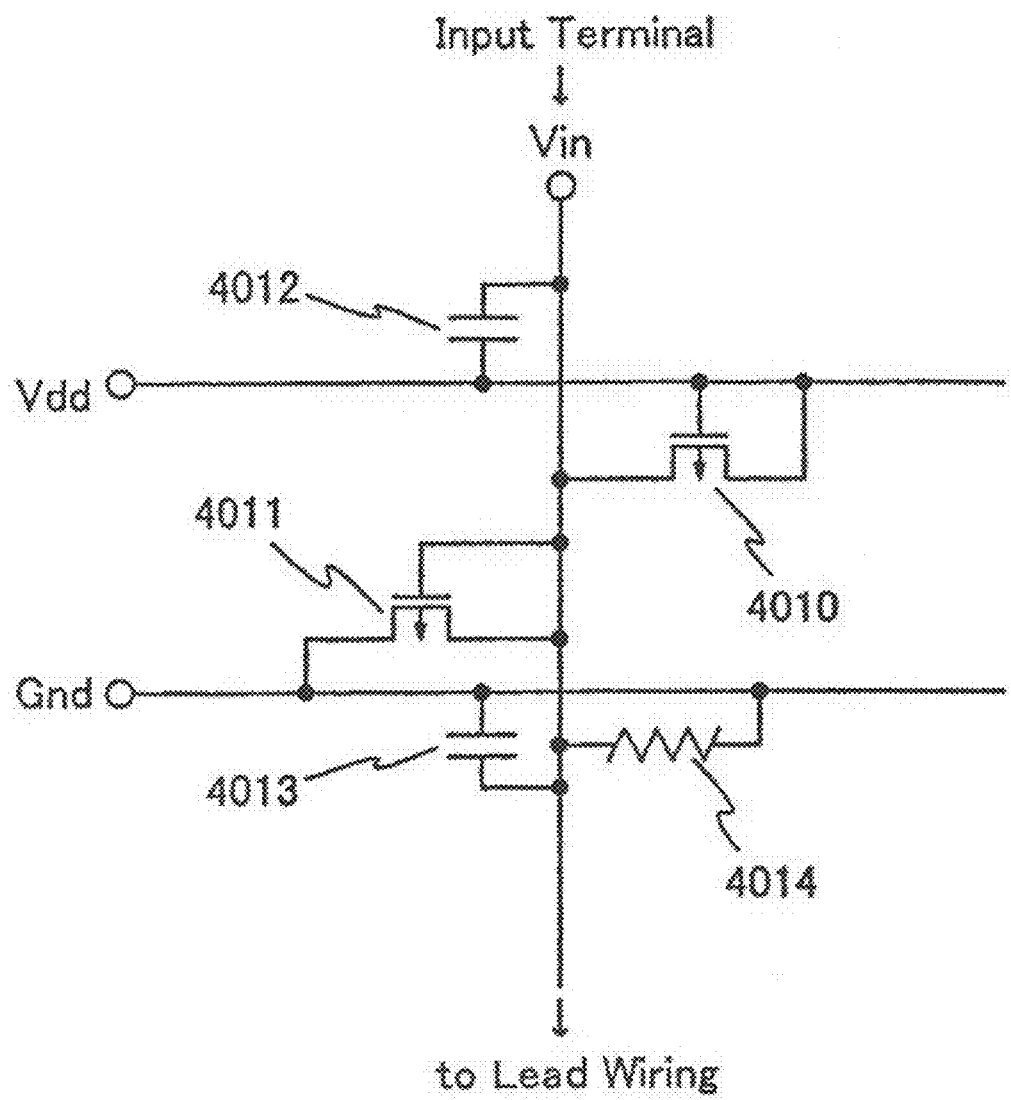
FIG. 7 shows a circuit diagram of a protective circuit.

FIG. 7 is an equivalent circuit diagram of the protective circuit 4009. The protective circuit shown in FIG. 7 is merely an example of the protective circuit of the semiconductor display device of the present invention, and the present invention is not limited to this structure.

The protective circuit shown in FIG. 7 is for one input terminal, and has two p-channel TFTs 4010 and 4011, two capacitor storage 4012 and 4013, and a resistor 4014. Although p-channel TFTs are used in FIG. 7, n-channel TFTs may be employed instead. The two p-channel TFTs 4010 and 4011 may be multi-channel TFTs in which a channel formation region is divided into two or more regions.

A gate of the p-channel TFT 4010 receives a power supply voltage Vdd. One of its two impurity regions receives the power supply voltage Vdd whereas the other receives a voltage Vin from the input terminal.

In this specification, voltage means an electric potential difference from a ground voltage Gnd unless otherwise stated.

A gate of the other p-channel TFT, i.e., the TFT 4011, receives the voltage Vin from the input terminal. One of its two impurity regions receives the ground voltage Gnd whereas the other receives the voltage Vin from the input terminal.

The capacitor storage 4012 has two electrodes (a first capacitor electrode and a second capacitor electrode) and one of them receives the voltage Vin from the input terminal whereas the other receives the power supply voltage Vdd. The capacitor storage 4013 has two electrodes (a first capacitor electrode and a second capacitor electrode) and one of them receives the voltage Vin from the input terminal whereas the other receives the ground voltage Gnd.

The resistor 4014 has two terminals and one of the terminals receives the voltage Vin from the input terminal whereas the other terminal receives the ground voltage Gnd. The resistor 4014 is provided to make the voltage of the lead wiring drop to Gnd when the input terminal stops receiving the voltage Vin, and its resistance has to be set sufficiently larger than the wiring resistance of the lead wiring.

Next, the operation of the protective circuit shown in FIG. 7 will be described. The description here takes as an example a case in which a voltage of a clock signal at a certain frequency is inputted as the input voltage Vin to the input terminal. The voltage of the clock signal oscillates between the voltage Vdd and the voltage Gnd.

Figure 9A:
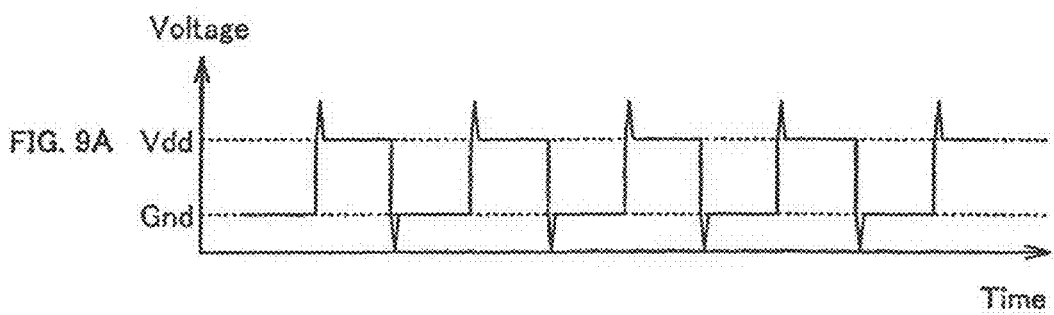
FIGS. 9A and 9B show timing charts of clock signals.

FIG. 9A is a timing chart of the input voltage Vin when the clock signal contains noise. The input voltage Vin temporarily rises higher than Vdd or drops lower than Gnd upon the moment of its rise and fall.

When the input voltage Vin rises higher than the voltage Vdd, the voltage Vdd applied to the gate and one of the impurity regions of the p-channel TFT 4010 shown in FIG. 7 becomes lower than the voltage Vin applied to the other impurity region. This turns the p-channel TFT 4010 on. The p-channel TFT 4011 remains turned off since the voltage Vin applied to its gate and one of the impurity regions is sufficiently higher than the voltage Gnd applied to the other impurity region.

Figure 8A:
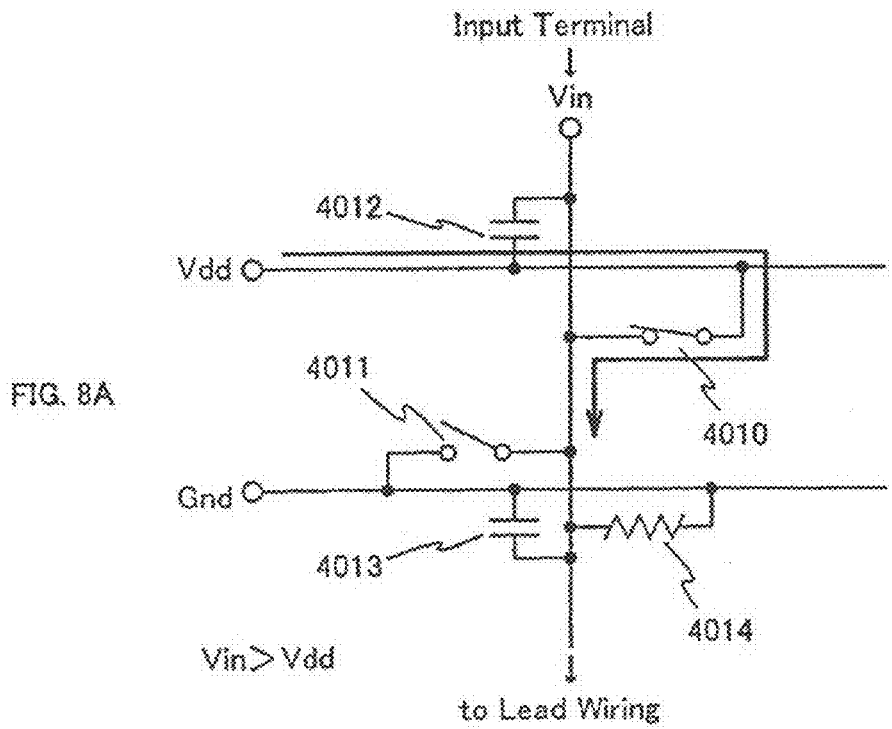
FIGS. 8A and 8B show diagrams showing the operation of a protective circuit.

FIG. 8A gives a brief illustration on connection in the protective circuit when the input voltage Vin becomes higher than the voltage Vdd. In FIG. 8A, the p-channel TFTs 4010 and 4011 are shown simply as switches. When the p-channel TFT 4010 is turned on whereas the p-channel TFT 4011 is turned off, the power supply voltage Vdd is given to the lead wiring through the p-channel TFT 4010. Accordingly, the voltage given to the lead wiring does not exceed Vdd even when noise raises the voltage from the input terminal above Vdd.

When the input voltage Vin becomes lower than the voltage Gnd, on the other hand, the voltage Vdd applied to the gate and one of the impurity regions of the p-channel TFT 4010 shown in FIG. 7 is sufficiently higher than the voltage Vin applied to the other impurity region. This turns the p-channel TFT 4010 off. On the other hand, the p-channel TFT 4011 is turned on since the voltage Vin applied to its gate and one of the impurity regions becomes lower than the voltage Gnd applied to the other impurity region.

Figure 8B:
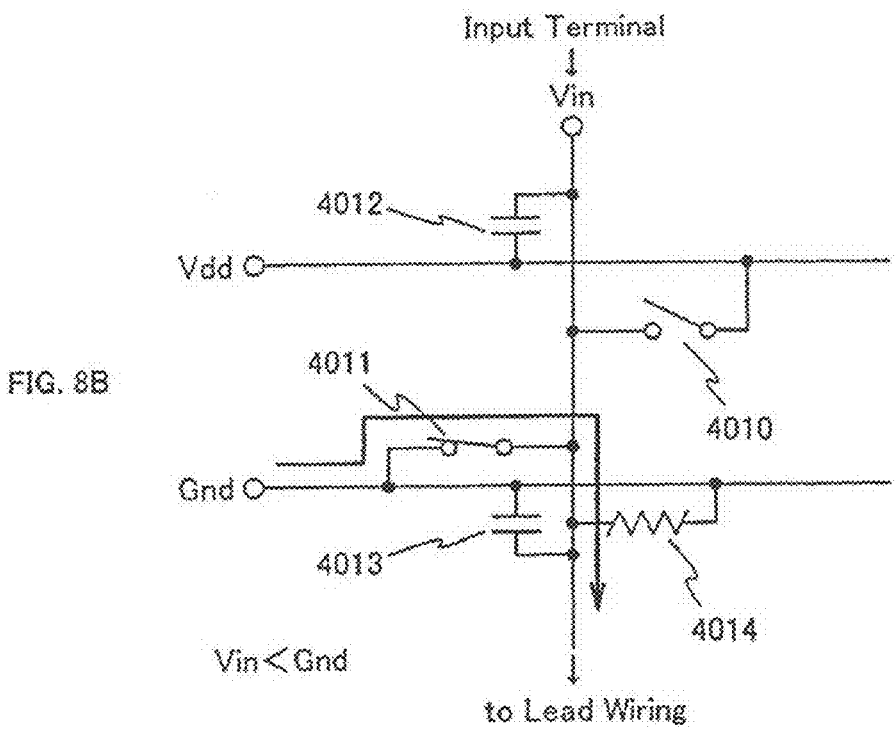

FIG. 8B gives a brief illustration on connection in the protective circuit when the input voltage Vin becomes lower than the voltage Gnd. In FIG. 8B, the p-channel TFTs 4010 and 4011 are shown simply as switches. When the p-channel TFT 4010 is turned off whereas the p-channel TFT 4011 is turned on, the power supply voltage Gnd is given to the lead wiring through the p-channel TFT 4011. Accordingly, the voltage given to the lead wiring does not become lower than Gnd even when noise lowers the voltage from the input terminal below Gnd.

Furthermore, the capacitor storage 4012 and 4013 can dull the pulse-like noise down to the voltage from the input terminal and can avoid do a certain degree a rapid change in voltage due to noise.

Figure 9B:
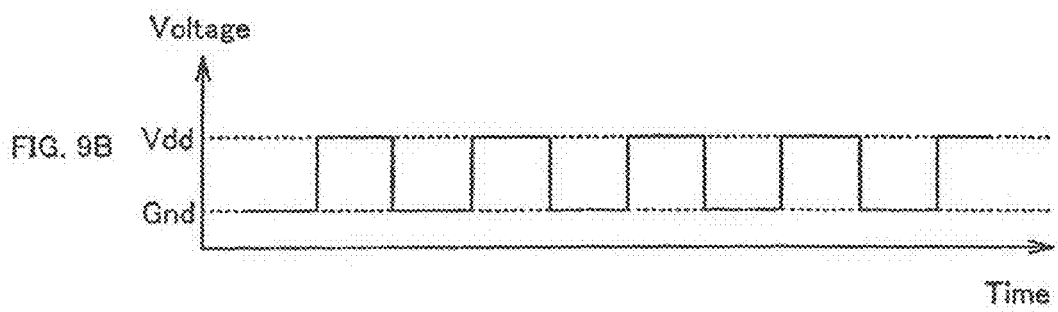

Therefore, the voltage of the lead wiring is kept within a range between the voltage Gnd and the power supply voltage Vdd as shown in FIG. 9B, and the wiring is protected against application of extraordinary high or low voltage outside this range.

With the protective circuit provided in the input terminal to which a signal is inputted, when no signal is putted, the voltage of every lead wiring to which a signal is given is kept at a fixed level (here, Gnd). In other words, the protective circuit has the function of a short circuit ring which can bring wirings to the short circuit state when no signal is inputted. Electrostatic discharge damage due to voltage difference between lead wirings is thus prevented. When a signal is inputted, the resistance of the resistor 4014 is sufficiently large and therefore the voltage of a signal given to the lead wiring is not pulled down by the ground voltage.

In the protective circuit shown in FIG. 7, the larger the ON current of the p-channel TFTs 4010 and 4011 is, the quicker the voltage of the lead wiring is set and kept to the power supply voltage Vdd when the input voltage Vin exceeds the power supply voltage Vdd. On the other hand, when the input voltage Vin becomes lower than the voltage Gnd, the voltage of the lead wiring is set and kept to the voltage Grid quickly.

Figure 10:
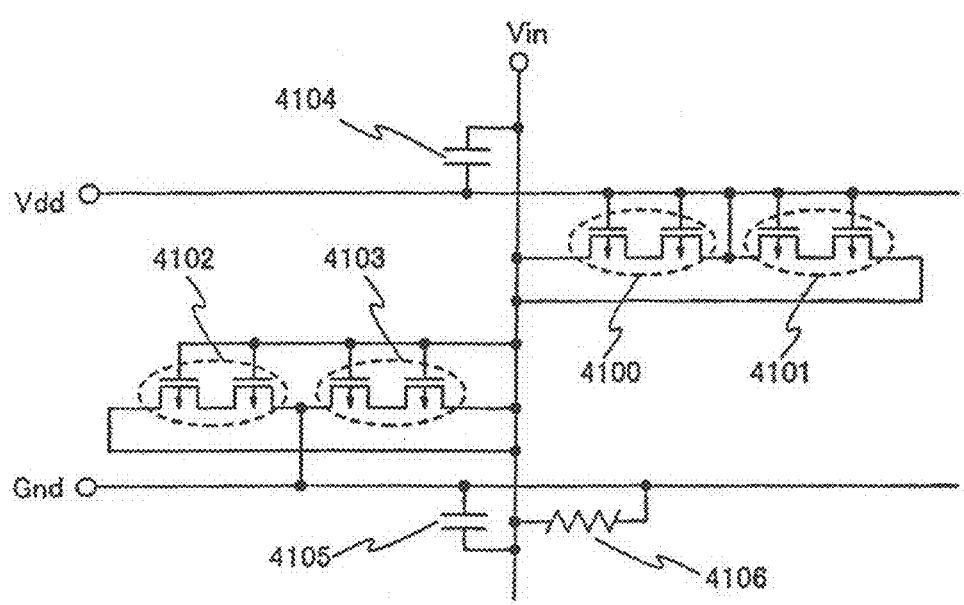
FIG. 10 shows a circuit diagram of a protective circuit.

FIG. 10 shows an example in which the p-channel TFTs 4010 and 4011 of the protective circuit of FIG. 7 are each substituted by two double-gate TFTs. The protective circuit shown in FIG. 10 has double-gate p-channel TFTs 4100 to 4103, capacitor storage 4104 and 4105, and a resistor 4106.

In a double-gate, triple-gate, or other multi-gate TFT, two, three, or more channel formation regions are formed in one active layer, and every-channel formation region is interposed between an impurity region functioning as source and an impurity region functioning as drain. Such multi-gate TFT can be substituted by serially-connected TFTs in which one or more channel formation regions are formed in one active layer and gates are connected to one another.

In the p-channel TFTs 4100 and 4101, the power supply voltage Vdd is given to a gate and one of impurity regions, and the input voltage Vin is given to the other impurity region. In the p-channel TFTs 4102 and 4103, the input voltage Vin is given to a gate and one of impurity regions and the voltage Gnd is given to the other impurity region.

The capacitor storage 4104 has two electrodes (a first capacitor electrode and a second capacitor electrode), and one of them receives the voltage Vin from the input terminal whereas the other receives the power supply voltage Vdd. The capacitor storage 4105 has two electrodes (a first capacitor electrode and a second capacitor electrode), and one of them receives the voltage Vin from the input terminal whereas the other receives the ground voltage Gnd.

The resistor 4106 has two terminals, and one of the terminals receives the voltage Vin from the input terminal whereas the other terminal receives the ground voltage Gnd. The resistor 4106 is provided to make the voltage of the lead wiring drop to Gnd when the input terminal stops receiving the voltage Vin, and its resistance has to be set sufficiently larger than the wiring resistance of the lead wiring.

In the protective circuit shown in FIG. 7 or 10, a power supply voltage Vss, which is not equal to the ground voltage and lower than the voltage Vdd, may be used instead of the ground voltage Gnd.

Figure 11:
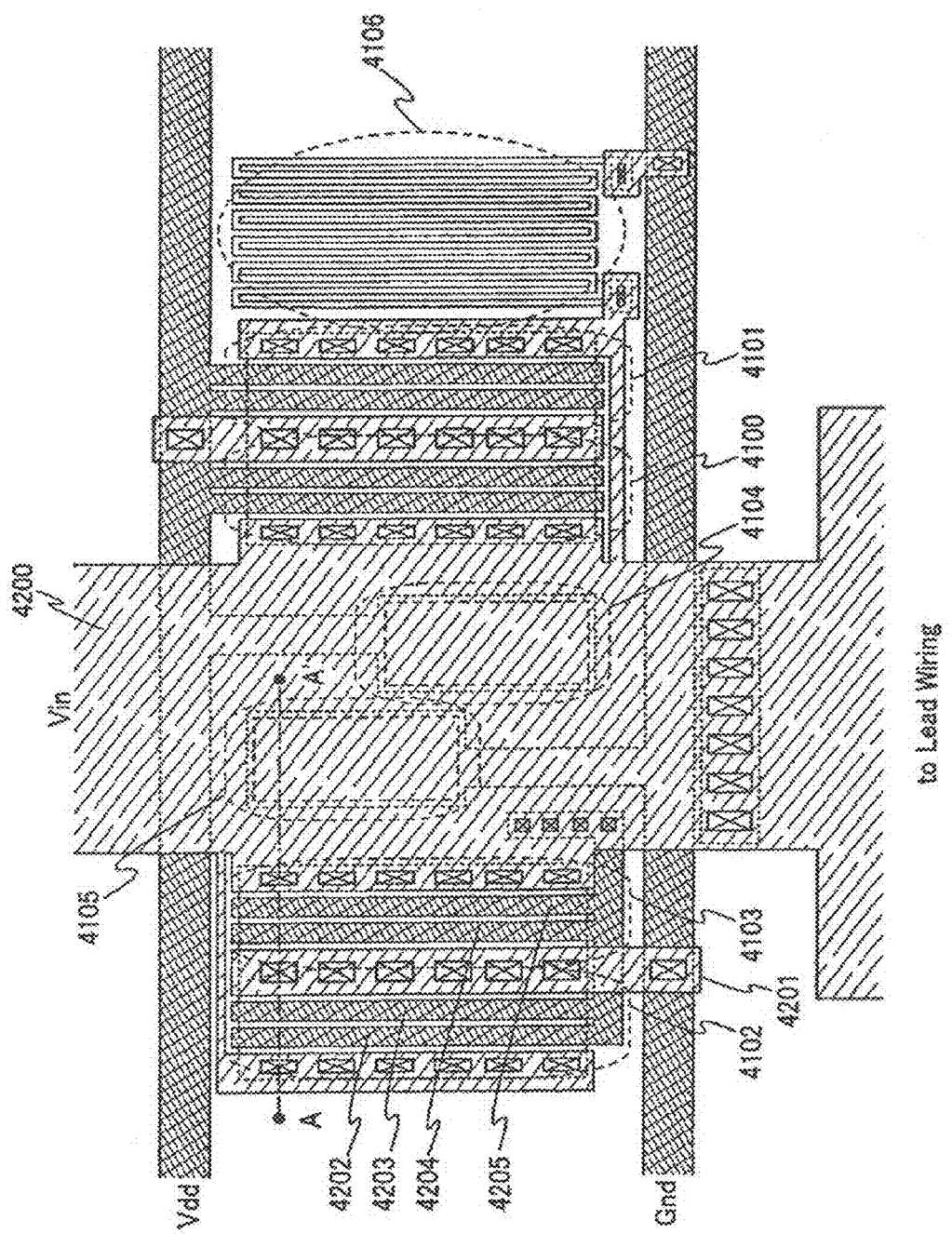
FIG. 11 shows a mask draft for a protective circuit.
Figure 12:
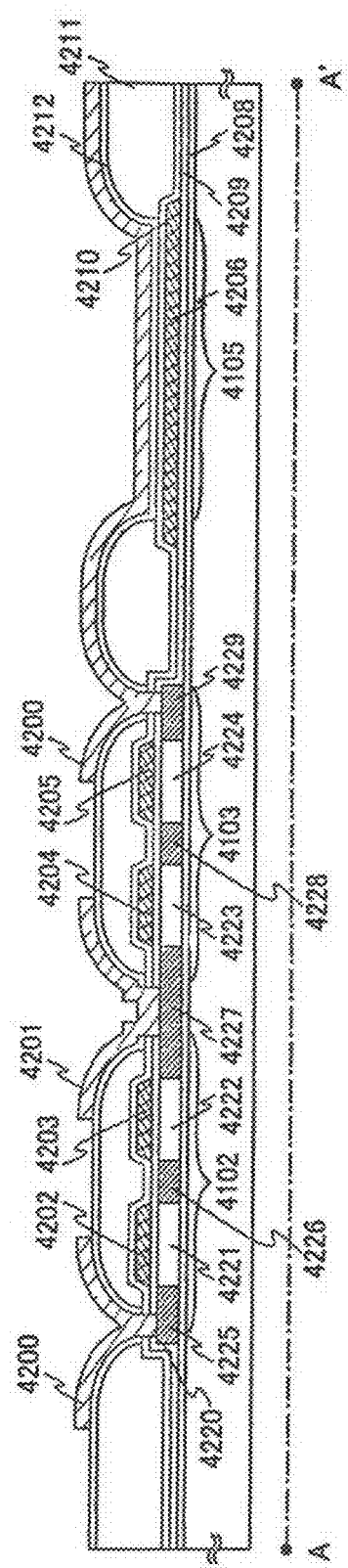
FIG. 12 shows a sectional view of capacitor storage of a protective circuit.

FIG. 11 shows an example of a top view of the protective circuit shown in FIG. 10. A sectional view taken along the line A-A' in FIG. 11 corresponds to FIG. 12. A semiconductor film 4220 is formed on a base film 4208 which is composed of an insulating film. The semiconductor film 4220 has impurity regions 4225 to 4229 and channel formation regions 4221 to 4224 between the impurity regions. A gate insulating film 4209 covers the semiconductor film 4220.

Gate electrodes 4202 to 4205 are formed above the channel formation regions 4221 to 4224 so that the gate insulating film 4209 is sandwiched between the channel formation regions and the gate electrodes. A first capacitor electrode 4206 is formed on the gate insulating film 4209 from the same conductive film that is used to form the gate electrodes 4202 to 4205.

The gate electrodes 4202 to 4205 are all electrically connected. The semiconductor film 4220, the gate insulating film 4209, and the gate electrodes 4202 to 4205 constitute the TFTs 4102 and 4103.

Then a first inorganic insulating film 4210 is formed so as to cover the TFTs 4102 and 4103 and the first capacitor electrode 4206. An organic resin film 4211 with openings is formed covering the first inorganic insulating film 4210. The organic resin film 4211 is a photosensitive positive acrylic film and the opening is formed by exposure to light and subsequent development. The first inorganic insulating film 4210 is exposed in the openings of the organic resin film 4211.

Then a second inorganic insulating film 4212 is formed on the organic resin film 4211 covering the openings. RF sputtering is used to form the second inorganic insulating film 4212.

The gate insulating film 4209, the first inorganic insulating film 4210, and the second inorganic insulating film 4212 are etched by dry etching to form contact holes in the openings of the organic resin film 4211. The impurity regions 4225, 4227, and 4229 are partially exposed in the contact holes. In the dry etching, measures have to be taken to avoid etching portions of the first inorganic insulating film 4210 and the second inorganic insulating film 4212 that are above the first capacitor electrode 4206. Also, the organic resin film 4211 must not be exposed in the openings.

A conductive film is formed on the second inorganic insulating film 4212 to cover the contact holes and is patterned to form a wiring 4200 and a wiring 4201. The wiring 4200 is connected to the impurity regions 4225 and 4229 that function as source or drain. The wiring 4201 is connected to the impurity region 4227 that functions as source or drain.

A part of the wiring 4200 functions as a second capacitor electrode and overlaps the first capacitor electrode 4206 in the opening of the organic resin film 4211 with the first inorganic insulating film 4210 and the second inorganic insulating film 4212 sandwiched between the capacitor electrodes.

In the present invention, the surface of the organic resin film is prevented from being roughened through dry etching by covering the organic resin film with an inorganic insulating film. The pixel electrode or the like that is formed later is therefore saved from surface irregularities and uneven thickness, thereby preventing uneven display.

Covering the organic resin film with a nitrogen-containing inorganic insulating film that transmits less moisture than the organic resin film does also prevents the organic resin film from releasing its moisture whereas it prevents the organic resin film from absorbing moisture and swelling. Corrosion of the wirings by moisture released from the organic resin film is therefore avoided. In the case of a light emitting device that uses a light emitting element represented by an organic light emitting diode (OLED), it also prevents moisture released from the organic resin film from degrading the luminance of the light emitting element.

Moreover, by covering the entire organic resin film with an inorganic insulating film so that none of the organic resin film is exposed, the organic resin film is prevented from swelling with water in an alkaline aqueous solution which is used in development and heat treatment for removal of moisture after the development can be finished in a shortened period of time. This is more effective in preventing the organic resin film from releasing its moisture into adjacent films or electrodes. Therefore, the long-term reliability of the panel can be enhanced.

When non-photosensitive organic resin is employed, commonly dry etching is used to form an opening in an interlayer insulating film. Dry etching is an etching method that uses plasma of active radical or reactive gas. The interlayer insulating film is ten times as thick as a gate insulating film, and dry etching to form an opening therein takes time. If a substrate on which a TFT is formed is exposed to plasma for a long period of time, the TFT threshold is easily fluctuated toward the plus side because of so-called charging damage in which holes are trapped in a gate insulating film. By employing photosensitive organic resin and using wet etching to form an opening as in the present invention, the dry etching period is significantly shortened and fluctuation of TFT threshold is therefore prevented.

The capacitor of the protective circuit which protects the semiconductor element against degradation or breakage brought by static electricity discharge and which prevents malfunction of a semiconductor element clue to noise is composed of the above capacitor storage. The above structure makes it easy to form the protective circuit on the same substrate where the pixel portion is formed and prevents degradation or breakage of a semiconductor element due to static electricity as well as malfunction by noise to avoid image disturbance.

The surface of the organic resin film is prevented from being roughened through dry etching by covering the organic resin film with an inorganic insulating film. Surface irregularities of a pixel electrode or other components formed later are thus avoided as well as uneven thickness of the pixel electrode, making it possible to prevent uneven display.

Covering the organic resin film with a nitrogen-containing inorganic insulating film that transmits less moisture than the organic resin film does also prevents the organic resin film from releasing its moisture whereas it prevents the organic resin film from absorbing moisture and swelling. Corrosion of the wirings by moisture released from the organic resin film is therefore avoided. In the case of a light emitting device that uses a light emitting element represented by an organic light emitting diode (OLED), it also prevents moisture, which is released from the organic, resin, film from degrading the luminance of the light emitting element.

Moreover, by covering the entire organic resin film with an inorganic insulating film so that none of the organic resin film is exposed, the organic resin film is prevented from swelling with water in an alkaline aqueous solution which is used in development and the heat treatment time for removal of moisture after the development can be shortened. This is more effective in preventing the organic resin him from releasing its moisture into adjacent films or electrodes and therefore the long-term reliability of the panel can be enhanced.

When non-photosensitive organic resin is employed, commonly dry etching is used to form an opening in the interlayer insulating film. Dry etching is an etching method that uses plasma of active radical or reactive gas. The interlayer insulating film is ten times as thick as a gate insulating film and dry etching to form an opening therein takes time. If a substrate on which a TFT is formed is exposed to plasma for a long period of time, the TFT threshold is easily fluctuated toward the plus side because of so-called charging damage in which holes are trapped in a gate insulating film. By employing photosensitive organic resin and using wet etching to form an opening as in the present invention, the dry etching period is significantly shortened and fluctuation of TFT threshold is therefore prevented.

The capacitor of the protective circuit which protects the semiconductor element against degradation or breakage brought by static electricity discharge and which prevents malfunction of a semiconductor element due to noise, is composed of the above capacitor storage. This makes it easy to form the protective circuit on the same substrate where the pixel portion is formed and prevents degradation or breakage of a semiconductor element due to static electricity as well as malfunction by noise.

As described above, research by the applicant of the present invention shows a fact that, when a resin film is used as an interlayer insulating film and a contact hole is formed using dry etching, thin film transistors obtained are largely fluctuated in threshold voltage (Vth). For instance, the data shown in FIG. 29 are results of investigation on fluctuation in threshold voltage among thin film transistors formed on an SOI substrate. Black circular marks in the graph express in a case where the interlayer insulating film has a laminate structure consisting of a silicon nitride (SiN) film and an acrylic film. White triangular marks in the graph express in a case where the interlayer insulating film has a laminate structure consisting of a silicon nitroxide (SiNO) film and a silicon oxynitride (SiON) film. The contact hole is opened using dry etching in either case. The difference between SiNO and SiON used herein is that nitrogen atomic % is larger than oxygen atomic % in the former whereas oxygen atomic % is larger than nitrogen atomic % in the latter.

The data in FIG. 29 are made into a graph through estimation by statistical work of threshold voltage fluctuation, in which the horizontal axis shows the channel length (how far carriers move) and the vertical axis shows the Vth fluctuation. In recent years, statistical work called 'quartile deviation' becomes widely recognized. Quartile deviation shows the difference between the 25% value and the 75% value in normal probability graph and is noticed as statistical work that is not influenced by peculiar values. Based on quartile deviation, the applicants of the present invention have defined the difference between the 16% value and the 84% value as 16% quantile deviation and plotted it into the vertical axis as 'Vth fluctuation'. The 16% quantile deviation corresponds to $\pm\sigma$ in normal probability distribution and therefore data plot used is obtained by multiplying each by a coefficient to make them into values deemed as $\pm 3\sigma$. According to the data, the fluctuation is about 4 times (in n-channel TFTs) or twice (in p-channel TFTs) larger when an acrylic film is used as the interlayer insulating film. It is obviously that the use of the acrylic film increases the fluctuation. The applicants of the present invention infer that the threshold voltage fluctuation is caused by electric charges trapped in the acrylic film due to plasma damage received during dry etching.

EMBODIMENTS

Embodiments of the present invention will be described below.

Embodiment 1

In this embodiment, a manufacturing method of a light emitting device which is one of the semiconductor display devices of the present invention will be described. Note that, in this embodiment, a method of manufacturing a pixel portion and a storage capacitor included in a protective circuit at the same time will be described in detail.

First, as shown in FIG. 13A, a base film 5002 including an insulating film such as a silicon oxide film, a silicon nitride film, or a silicon oxynitride film is formed on a substrate 5001 including glass such as barium borosilicate glass or aluminoborosilicate glass represented by #7059 glass, #1737 glass, and the like of Corning Corporation. For example, a silicon oxynitride film 5002a manufactured from $SiH_4$, $NH_3$, and $N_2O$ is formed with a thickness of 10 to 200 nm (preferably 50 to 100 nm) by the plasma CVD method, and a silicon oxynitride hydrogenate film 5002b manufactured from $SiR_4$ and $N_2O$ is likewise formed with a thickness of 50 to 200 nm (preferably 100 to 150 nm) in a laminated shape. Although the base film 5002 is shown as having a two layer structure in this embodiment, it may be formed as a single layer film of the insulating film or a structure in which the insulating film is laminated in two or more layers.

Island-shaped semiconductor layers 5003 and 5004 are formed of a crystalline semiconductor film which is manufactured by crystallizing a semiconductor film having an amorphous structure with the laser crystallization method or a publicly known thermal crystallization method. These island-shaped, semiconductor layers 5003 and 5004 are formed with a thickness of 25 to 80 nm (preferably 30 to 60 nm). A material of the crystalline semiconductor film is not limited but is preferably formed of silicon, silicon germanium (SiGe), or the like.

In order to manufacture the crystalline semiconductor film with the laser crystallization method, an excimer laser, a YAG laser, or a $YVO_4$ laser of a pulse oscillation type or a continuous light emitting type is used. In the case of using these lasers, it is favorable to use a method of condensing laser beams, which are radiated from a laser oscillator in a linear shape by using an optical system, and then irradiating them on a semiconductor film. Although conditions of crystallization are appropriately selected by an operator in the case of using the excimer laser, it is favorable to set a pulse oscillation frequency to 300 Hi and a laser energy density to 100 to 400 $mJ/cm^2$ (representatively, 200 to 300 $mJ/cm^2$). In addition, in the case of using the YAG laser, it is favorable to use a second higher harmonic and set the pulse oscillation frequency to 30 to 300 kHz and the laser energy density to 300 to –600 $mJ/cm^2$ (representatively, 350 to 500 $mJ/cm^2$). Then, the laser beams condensed in a linear shape are irradiated over an entire surface of a substrate with a width of 100 to 1000 μm, for example, 400 p.m. At this point, an overlap ratio of the linear laser beams is set to 50 to 90%.

Note, that not only silicon but also silicon germanium may be used in the semiconductor film. In the case of using the silicon germanium, a concentration of the germanium is preferably about 0.01 to 4.5 atomic %.

Subsequently, a gate insulating film 5007 covering the island-shaped semiconductor layers 5003 and 5004 is formed. The gate insulating film 5007 is formed of an insulating film containing silicon with a thickness of 40 to 150 nm using the plasma CVD method or the sputtering method. In this embodiment, the gate insulating film 5007 is formed of a silicon oxynitride film with a thickness of 120 nm. It is needless to mention that the gate insulating film is not limited to such a silicon oxynitride film and other insulating film containing silicon may be used in a single layer or a laminated layer structure. For example, in the case of using a silicon oxide film, the silicon oxide film is formed by mixing TEOS (Tetraethyl Orthosilicate) and $O_2$ with the plasma CVD method, setting a reactive pressure and a substrate temperature thereof to 40 Pa and 300 to 400° C., respectively, and discharging the mixed TEOS and $O_2$ at a high frequency (13.56 MHz), a power flux density of 0.5 to 0.8 W/cm². The silicon oxide film manufactured in this way can thereafter obtain favorable characteristics as a gate insulating film through thermal annealing at 400 to 500° C. In addition, aluminum nitride can be used as a gate insulting film. Since the aluminum nitride has relatively high thermal conductivity, heat generated by a TFT can be diffused efficiently. Further, after forming silicon oxide, silicon oxynitride, or the like which does not contain aluminum, a film laminated aluminum nitride thereon may be used as a gate insulating film.

Then, a first conductive film 5008 and a second conductive film 5009 for forming a gate electrode on the gate insulating film 5007 are formed. In this embodiment, the first conductive film 5008 is formed of Ta with a thickness of 50 to 100 nm and the second conductive film 5009 is formed of W with a thickness of 100 to 300 nm.

A Ta film is formed by sputtering a target of Ta with Ar. In this case, if an appropriate amount of Xe or Kr is added to Ar, an internal stress of the Ta film can be eased to prevent exfoliation of the film. In addition, a Ta film of a α phase has a resistivity of approximately 20 μΩcm and can be used for a gate electrode, but a Ta film of a β phase has a resistivity of approximately 180 μΩcm and is not suitable to use as a gate electrode. In order to form the Ta film of the α phase, if tantalum nitride having a crystal structure close to the α phase of Ta is formed as a base of Ta with a thickness of approximately 10 to 50 nm, the Ta film of the α phase can be obtained easily.

When a W film is formed, it is formed by the sputtering method targeting W. Besides, the W film can also be formed by thermal CVD method using tungsten hexafluoride ($WF_6$). In any case, it is necessary to realize a low resistivity in order to use the W film as a gate electrode, and it is desirable to set a resistivity of the W film to 20 μΩcm or less. Reduction of a resistivity can be realized in the W film by increasing a size of a crystal grain. However, when a large quantity of impurity components such as oxygen is contained in W, crystallization is hindered and a resistivity of the W film is increased. Consequently; when the W film is formed by the sputtering method, the W film is formed using a W target with a purity of 99.99 or 99.9999% and giving careful consideration such that impurities are not mixed from a chemical vapor at the time of film formation, whereby a resistivity of 9 to 20 μm can be realized.

Note that, although the first conductive film 5008 is assumed to be Ta and the second conductive film 5009 is assumed to be W in this embodiment, both the conductive films are not specifically limited but may be formed of an element selected out of Ta, W, Ti, Mo, Al, and Cu, or an alloy material or a compound material containing the element as a main component. In addition, a semiconductor film represented by a polysilicon film doped with an impurity element such as phosphorus may be used. As examples of a combination other than this embodiment, a combination of the first conductive film formed of tantalum nitride (TaN) and the second conductive film formed of W, a combination of the first conductive film formed of tantalum nitride (TaN) and the second conductive film formed of Al, and a combination of the first conductive film formed of tantalum nitride (TaN) and the second conductive film formed of Cu are preferable. In addition, a semiconductor film represented by a polysilicon film doped with an impurity element such as phosphorus or an AgPdCu alloy may be used as the first conductive film and the second conductive film.

In addition, the gate electrode is not limited to the two-layer structure but may be a three-layer structure of, for example, a tungsten film, a film of an alloy of aluminum and silicon (Al—Si), and a titanium nitride film laminated one after another. Further, when the gate electrode is formed in the three-layer structure, tungsten nitride may be used instead of tungsten, a film of an alloy of aluminum and titanium (Al—Ti) may be used instead of the film of the alloy of aluminum and silicon (Al—Si), and a titanium film may be used instead of the titanium nitride film.

Note that it is important to appropriately select an optimum etching method or a type of an etchant depending upon materials of conductive films.

Next, a mask 5010 with resist is formed, and first etching treatment is performed in order to form an electrode and a wiring. In this embodiment, the first etching treatment is performed by using an ICP (Inductively Coupled Plasma) etching method, mixing $CF_4$ and $Cl_2$ in a gas for etching, and inputting an RF (13.56 MHz) power of 500 W in an electrode of a coil type at a pressure of 1 Pa to generate plasma. An RF (13.56 MHz) power of 100 W is also inputted on the substrate side (sample stage), and a substantially negative self-bias voltage is applied thereto. When $CF_4$ and $Cl_2$ are mixed, both of the W film and the Ta film are etched to the same degree.

With the above-mentioned etching conditions, ends of the first conductive film and the second conductive film are formed in a taper shape according to an effect of the bias voltage applied to the substrate side by making a shape of the mask with resist suitable. An angle of the taper portion becomes 15 to 45°. In order to etch a gate insulating without leaving a residuum on the gate insulating film, it is favorable to increase etching time at a rate of approximately 10 to 20%. Since a selection ratio of a silicon oxynitride film with respect to the W film is 2 to 4 (representatively, 3), a surface where the silicon oxynitride film is exposed is etched by approximately 20 to 50 nm by over etching treatment. In this way, conductive layers of a first shape 5011 to 5014 (first conductive layers 5011*a* to 5014*a* and second conductive layers 5011*b* to 5014*b*) consisting of the first conductive layer and the second conductive layer are formed by the first etching treatment. At this point, in the gate insulating film 5007, a region not covered by the conductive layers of the first shape 5011 to 5014 is etched by approximately 20 to 50 nm, and a thinned region is formed (FIG. 13B).

Then, first doping treatment is performed to add an impurity element for giving an N type is added (FIG. 13C). A method of doping may be an ion dope method or an ion implantation method. As conditions of the ion dope method, a doze quantity is set to $1\times10^{13}$ to $5\times10^{14}$ atoms/cm², and an acceleration voltage is set to 60 to 100 keV. As the impurity element giving the N type, an element belonging to the XV group, typically, phosphorus (P) or arsenic (As) is used. In this embodiment, phosphorus (P) is used. In this case, the conductive layers 5011 to 5013 becomes a mask against the impurity element giving the N type, and first impurity regions 5017 to 5021 are formed in a self-aligning manner. The impurity element giving the N type is added to the first impurity regions 5017 to 5021 in a concentration range of $1\times10^{20}$ to $1\times10^{21}$ atoms/cm$^3$.

Next, second etching treatment is performed as shown in FIG. 14A. Similarly, the second etching treatment is performed by using the ICP (Inductively Coupled Plasma) etching method, mixing CF$_4$, Cl$_2$ and O$_2$ in an etching gas, and inputting a RF (13.56 MHz) power of 500 W in an electrode of a coil type at a pressure of 1 Pa to generate plasma. A RF (13.56 MHz) power of 50 W is inputted on the substrate side (sample stage), and a self-bias voltage lower than that in the first etching treatment is applied thereto. The W film is subjected to the anisotropic etching under such conditions and Ta which is the first conductive film is subjected to the anisotropic etching at an etching speed, which is slower than that for etching the W film, to corm conductive layers of a second shape 5026 to 5029 (first conductive layers 5026a to 5029a and second conductive layers 5026b to 5029b). At this point, in the gate insulating film 5007, a region not covered by the conductive layers of the second shape 5026 to 5029 are further etched by approximately 20 to 50 nm and a thinned region is formed.

An etching reaction of the W film and the Ta film due to the mixed gas of CF$_4$ and Cl$_2$ can be surmised from a radical or an ion type to be generated and a vapor pressure of a reaction product. Comparing vapor pressures of fluorides and chlorides of W and Ta are compared, WF$_6$ which is a fluoride of W has an extremely high vapor pressure and the other fluorides and chlorides WCl$_5$, TaF$_5$, and TaCl$_5$ have similar vapor pressures of the same degree. Therefore, both of the W film and the Ta film ace etched with the mixed gas of CF$_4$ and Cl$_2$. However, when an appropriate quantity of O$_2$ is added to this mixed gas, CF$_4$ and O$_2$ react with each other to change to CO and F, and a large quantity of an F radical or an F ion is generated. As a result, an etching speed of the W film having a high vapor pressure of a fluoride increases. On the other hand, Ta has relatively little increase in an etching speed even if F increases. In addition, since Ta is more likely to be oxidized compared with W, a surface of Ta is oxidized by adding O$_2$. Since an oxide of Ta does not react with fluorine or chlorine, the etching speed of the Ta film further decreases. Therefore, it becomes possible to differentiate etching speeds of the W film and the Ta film, and to make the etching speed of the W film higher than that of the Ta film.

Then, as shown in FIG. 14B, second doping treatment is performed. In this case, an impurity element giving the N type is doped with conditions that a doze quantity is decreased to be lower than that in the first doping treatment and an acceleration is increased to be higher than that in the first doping treatment. For example, the second doping treatment is performed with the acceleration voltage of 70 to 120 keV and the doze quantity of $1\times10^{13}$ atoms/cm$^2$ to form a new impurity region on the inner side of the first impurity regions which are formed in the island-shaped semiconductor layer in FIG. 13C. The doping is performed such that the impurity element is also added to a region on the lower side of the second conductive layers 5026a to 5028a using the conductive layers of the second shape 5026 and 5028 as a mask against the impurity element. In this way, third impurity regions 5032 to 5037 overlapping the second conductive layers 5026a to 5028a and second impurity regions 5042 to 5047 between the first impurity regions and the third impurity regions are formed. The impurity element giving the N type is adapted to have a concentration of $1\times10^{17}$ to $1\times10^{19}$ atoms/cm$^3$ in the second impurity regions and $1\times10^{16}$ to $1\times10^{18}$ atoms/cm$^3$ in the third impurity regions.

Then, as shown in FIG. 14C, fourth impurity regions 5052 to 5057 of an opposite conductive type of the first conductive type are formed in the island-shaped semiconductor layer 5004 forming the p-channel TFT. The impurity regions are formed in a self-aligning manner using the second conductive layer 5028b as a mask against an impurity element. At this point, the island-shaped semiconductor layer 5003 and the first capacitor electrode 5029 forming the n-channel TFT are coated entirely with a resist mask 5200. Although phosphorus is added at different concentrations in the respective impurity regions 5052 to 5057, the impurity regions are formed by an ion dope method using diborane (B$_2$H$_6$) and are adapted to have an impurity concentration of $2\times10^{20}$ to $2\times10^{21}$ atoms/cm$^3$ in any region.

The impurity regions are formed in the respective island-shaped semiconductor layers in the above-mentioned process. The second conductive layers 5026 to 5028 overlapping the island-shaped semiconductor layers function as the gate electrode. In addition, the second conductive layer 5029 functions as the first electrode for capacitor.

Then, with an object of conductive type control, a process for activating the impurity elements added to the respective island-shaped semiconductor layer is performed. This process is performed by a thermal anneal method using an anneal furnace. Besides, a laser anneal method or a rapid thermal anneal method (RTA method) can be applied. In the thermal anneal method, the process is performed in a nitrogen atmosphere with an oxygen concentration of 1 ppm or less, preferably 0.1 ppm or less, at a temperature of 400 to 700° C., representatively, 500 to 600° C. In this embodiment, heat treatment is performed at 500° C. for four hours. However, when the wiring material used in the second conductive layers 5026 to 5029 is susceptible to heat, it is preferable to form an interlayer insulating film (containing silicon as a main component) in order to protect the wiring and the like, and then activate the film.

Moreover, a process for performing heat treatment at a temperature of 300 to 450° C. for 1 to 12 hours in an atmosphere containing 3 to 100% of hydrogen to hydrogenate the island-shaped semiconductor layer is performed. This process is a process for terminating dangling bond of a semiconductor layer with thermally excited hydrogen. As other means of hydrogenation, plasma hydrogenation (using hydrogen excited by plasma) may be performed.

Subsequently, as shown in FIG. 15A, a first inorganic insulating film 5060 consisting of silicon oxynitride with a thickness of 10 to 200 nm is formed using the CVD method. Note that the first inorganic insulating film is not limited to a silicon oxynitride film, and any inorganic insulating film containing nitrogen may be used as the first inorganic insulating film as long as the film can suppress penetration of moisture shifting from an organic resin film which is formed later. For example, silicon nitride, aluminum nitride, or aluminum oxynitride can be used.

Note that aluminum nitride has a relatively high thermal conductivity and can effectively diffuse heat generated in a TFT or a light emitting element.

Next, an organic resin film 5061 consisting of a positive photosensitive organic resin is formed on the first inorganic insulating film 5060. Although the organic resin film 5061 is formed using positive photosensitive acrylic in this embodiment, the present invention is not limited to this.

In this embodiment, the organic resin film 5061 is formed by applying positive photosensitive acrylic with a spin coat method and baking the same. Note that a film thickness of the organic resin film 5061 is set to be approximately 0.7 to 5 μm (preferably, 2 to 4 μm) after baking.

Next, a part where an opening is to be formed is exposed to light using a photo mask. Then, after developing with a developer containing TMAH (tetramethyl ammonium hydroxide) as a main component, the substrate is dried, and baking is performed at 220° C. for one hour approximately. Then, as shown in FIG. 15B, the opening is formed in the organic resin film 5061, and a part of the first inorganic insulating film 5060 is exposed in the opening.

Note that, since the positive photosensitive acrylic is colored light brown, it is subjected to decolorizing treatment when light emitted from a light emitting element travels to the substrate side. In this case, before baking, the entire photosensitive acrylic after development is exposed to light again. In the exposure at this point, slightly stronger light is irradiate compared with the exposure for forming the opening or irradiation time is extended such that the exposure can be performed completely. For example, when a positive acrylic resin with a film thickness of 2 μm is decolorized, in case of a nonmagnification projection aligner (more specifically, MPA manufactured by Canon Inc.) utilizing multi-wavelength light consisting of a g ray (436 nm), an h ray (405 nm), and an i ray (365 nm) which are spectrum light of an ultrahigh pressure mercury vapor lamp is used, the light is irradiated for approximately 60 sec. The positive acrylic resin is completely decolorized by this exposure.

In addition, although baking is performed at the temperature of 220° C. after development in this embodiment, baking may be performed at a high temperature of 220° C. after performing baking at a low temperature of 100° C. as prebaling after development.

Then, as shown in FIG. 15C, covering the opening in which a part of the first inorganic insulating film 5060 is exposed and the organic resin film 5061, a second inorganic insulating film 5062 consisting of silicon nitride is formed using an RF sputtering method. A film thickness of the second inorganic insulating film 5062 is desirable to be approximately 10 to 200 nm. In addition, the second inorganic insulating film is not limited to a silicon oxynitride film, and any inorganic insulating film containing nitrogen may be used as the second inorganic insulating film as long as the film can suppress penetration of moisture shifting from the organic resin film 5061. For example, silicon nitride, aluminum nitride, or aluminum oxynitride can be used.

Note that in a silicon oxynitride film or an aluminum oxynitride film, a ratio of atomic % of oxygen and nitrogen thereof greatly relates to a barrier property of the same. The higher the ratio of nitrogen to oxygen is, the higher the barrier property is. In addition, more specifically, a ratio of nitrogen is desirable to be higher than a ratio of oxygen.

In addition, a film formed using the RF sputtering method is high in denseness and excellent in the barrier property. As conditions of the RF sputtering, for example, when a silicon oxynitride film is formed, with a Si target, gases of $N_2$, Ar, and $N_2O$ are flown such that a flow ratio thereof becomes 31:5:4, and the film is formed with a pressure of 0.4 Pa and an electric power of 3000 W. In addition, for example, when a silicon nitride film is formed, with a Si target, gases of $N_2$ and Ar are flown such that a flow ratio in a chamber becomes 20:20, and the film is formed with a pressure of 0.8 Pa, an electric power of 3000 W, and a film formation temperature of 215° C.

A first interlayer insulating film is formed of this organic resin film 5061, the first inorganic insulating film 5060, and the second inorganic insulating film.

Next, as shown in FIG. 16A, in the opening of the organic resin film 5061, a contact hole is formed in the gate insulating film 5007, the first inorganic insulating film 5060, and the second inorganic insulating film 5062 using the dry etching method.

By the opening of this contact hole, a part of the first impurity regions 5017 and 5019 and the fourth impurity regions 5052 and 5057 are exposed. Conditions of this dry etching are appropriately set according to materials of the gate insulating film 5007, the first inorganic insulating film 5060, and the second inorganic insulating film 5062. In this embodiment, since silicon oxide is used for the gate insulating film 5007, silicon oxynitride is used for the first inorganic insulating film 5060, and silicon nitride is used for the second inorganic insulating film 5062. First, the second inorganic insulating film 5062 consisting of silicon nitride and the first inorganic insulating film 5060 consisting of silicon oxynitride are etched using $CF_4$, $O_2$, and He as etching gases. Thereafter, the gate insulating film 5007 consisting of silicon oxide is etched using $CHF_3$.

Note that, at the time of this dry etching, since the first inorganic insulating film 5060 and the second inorganic insulating film 5062 on the first capacitor electrode 5029 are used as a dielectric body of a storage capacitor, the films are protected by a resist mask or the like so as not to be etched.

In addition, it is essential to prevent the organic resin film 5061 from being exposed in the opening at the time of etching.

Next, a conductive film is formed on the second inorganic insulating film 5062 so as to cover the contact hole and patterned, whereby wirings 5064 to 5067 connected to the first impurity regions 5017 and 5019 and the fourth impurity regions 5052 and 5057, a leading out wiring 5068 to be electrically connected to an input terminal, and a second capacitor electrode 5069 are formed. Note that a storage capacitor 5070 is formed in a part where the second capacitor electrode 5069 and the first capacitor electrode 5029 overlap each other with the first inorganic insulating film 5060 and the second inorganic insulating film 5062 between them in the opening of the organic resin film 5061.

Although the conductive film is shown as having a three layer structure in which a Ti film with a thickness of 100 nm, an Al film with a thickness of 300 nm, and a Ti film with a thickness of 150 nm are continuously formed by the sputtering method on the second inorganic insulating film 5062 in this embodiment, the present invention is not limited to this structure. These may be formed of a conductive film with a single layer or may be formed of a conductive film with plural layers other than three layers. In addition, a material is not limited to this.

For example, these may be formed using a conductive film in which an Al film containing Ti is laminated after forming the Ti film or may be formed using a conductive film in which an Al film containing W is laminated after forming the Ti film.

Next, a pixel electrode 5072 being in contact with the wiring 5067 is formed by forming a transparent conductive film, for example, an ITO film with a thickness of 110 nm and patterning the same. The pixel electrode 5072 is arranged so as to be in contact with and overlap the wiring 5067, whereby contact between them is realized. In addition, a transparent conductive film containing indium oxide mixed with 2 to 20% of zinc oxide (ZnO) may be used. This pixel electrode 5072 becomes an anode of the light emitting element (FIG. 16B).

Next, a photosensitive organic resin of a negative type or a positive type is formed and a part to be opened is exposed to light, whereby a second interlayer insulating film 5073 having an opening is formed. Note that, a part of the pixel electrode 5072 and a part of the leading out wiring 5068 are exposed by this process.

Since roundness can be given to a section of the opening by using the photosensitive organic resin, coverage of an electroluminescence layer and a cathode which are formed later can be made satisfactorily, and a defect called shrink in which a light emitting area decreases can be reduced.

Then, a third interlayer insulating film 5074 consisting of silicon nitride is formed on the second interlayer insulating film 5073 using the RF sputtering method so as to cover the exposed parts of the pixel electrode 5072 and leading out wiring 5068. Note that the third interlayer insulating film 5074 is not limited to silicon nitride, and any inorganic insulating film containing nitrogen may be used as long as penetration of moisture shifting from the second interlayer insulating film 5073 can be suppressed. For example, silicon nitride, aluminum nitride, or aluminum nitride oxide can be used.

Then, by patterning the third interlayer insulating film 5074, a part of the pixel electrode 5072 and a part of the leading out wiring 5068 are exposed in the opening of the second interlayer insulating film 5073.

At the time of this etching, it is essential to make an arrangement such that the second interlayer insulating film 5073 is not exposed in the contact hole.

Next, the electroluminescence layer 5075 is formed by the evaporation method and a cathode (MgAg electrode) 5076 is further formed by the evaporation method. At this point, it is desirable to apply heat treatment to the pixel electrode 5072 prior to forming the electroluminescence layer 5075 and the cathode 5076 and completely remove moisture. Note that, although the MgAg electrode is used as a cathode of the OLED in this embodiment, other publicly known materials may be used as long as it forms a conductive film with a small work function. For example, Ca, Al, CaF, MgAg, or AlLi may be used.

Note that AlLi is used as a cathode, Li in AlLi can be prevented from entering the substrate side of the third interlayer insulating film 5074 by the third interlayer insulating film 5074 containing nitrogen.

Figure 30A:
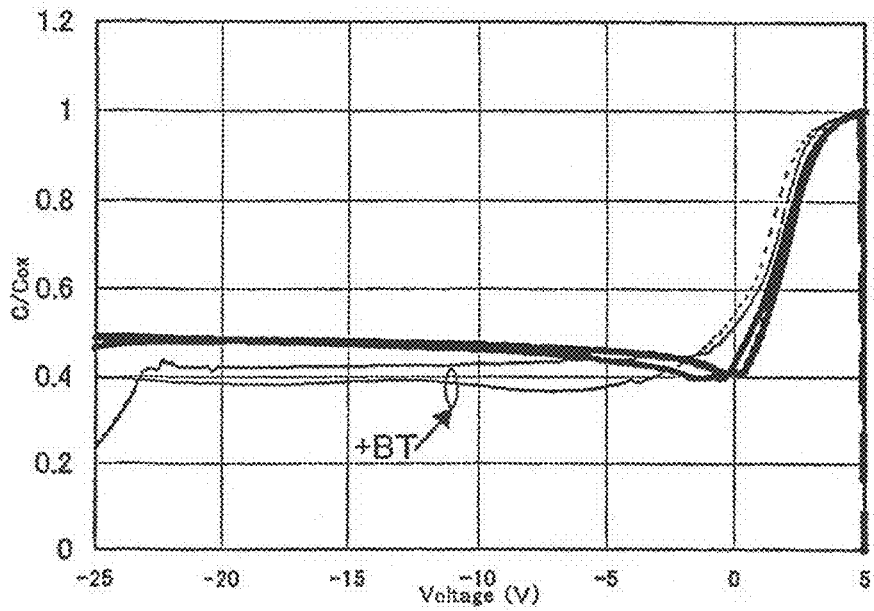
FIGS. 30A and 30B show diagrams showing the C-V characteristic of TFTs.
Figure 30B:
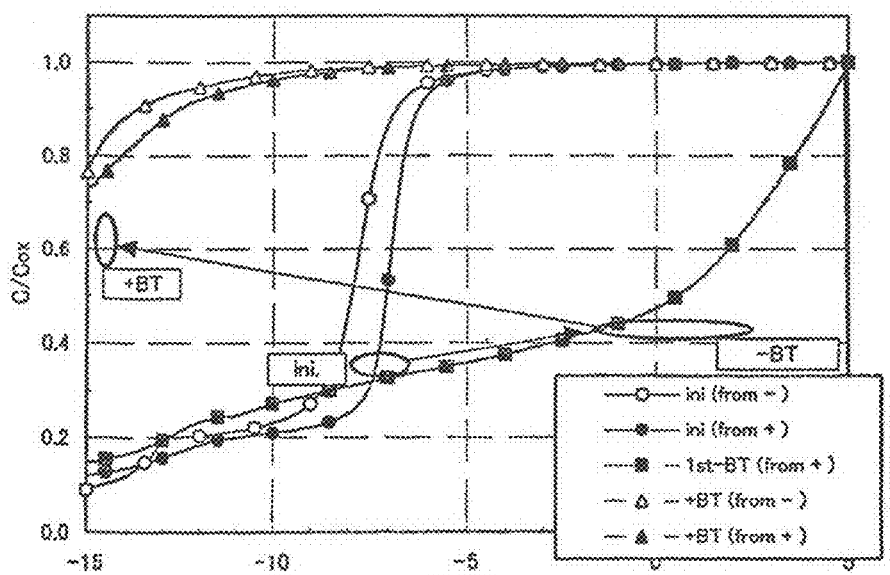

Here, data indicating a blocking effect of a silicon nitride film, which is formed by the sputtering method with high frequency discharge, against lithium is shown in FIGS. 30A and 30B. FIG. 30A shows a C-V characteristic of an MOS structure with a silicon nitride film formed by the sputtering method with the high frequency discharge (represented as RF-SP SiN) as a dielectric body. Note that "Li-dip" means a solution containing lithium was spin-coated on the silicon nitride film, which means that the silicon nitride film was intentionally contaminated by lithium for an experiment. In addition, FIG. 30B shows a C-V characteristic of an MOS structure with a silicon nitride film formed by the plasma CVD method (represented as CVD SiN) as a dielectric body for comparison. Note that, in data of FIG. 30B, an alloy film in which lithium is added to aluminum as a metal electrode is used. As a result of applying a usual BT experiment to these films (more specifically, heating treatment was performed for one hour at a temperature of ±150° C. in addition to voltage application of 1.7 MV), large change was observed in the C-V characteristic of the silicon nitride film formed by the plasma CVD method and contamination by lithium was confirmed, in contrast with a result that almost no change was observed in the C-V characteristic of the silicon nitride film formed by sputtering method with the high frequency discharge. These data indicate that the silicon nitride film formed by the sputtering method with the high frequency discharge has a very effective blocking effect against lithium diffusion.

Note that a publicly known material can be used as the electroluminescence layer 5075. Although a two layer structure consisting of a hole transporting layer and an emitting layer is provided as an electroluminescence layer in this embodiment, any one of a hole injection layer, an electron injection layer, and an electron transporting layer may be provided. In this way, various examples have been reported concerning a combination, and any structure of the examples may be used.

For example, SAlq, CAlq, and the like may be used as the electron transporting layer or the hole blocking layer.

Note that it is sufficient that a film thickness of the electroluminescence layer 5075 is 10 to 400 nm (typically 60 to 150 nm) and a thickness of the cathode 5076 is 80 to 200 nm (typically, 100 to 150 nm).

Figure 17A:
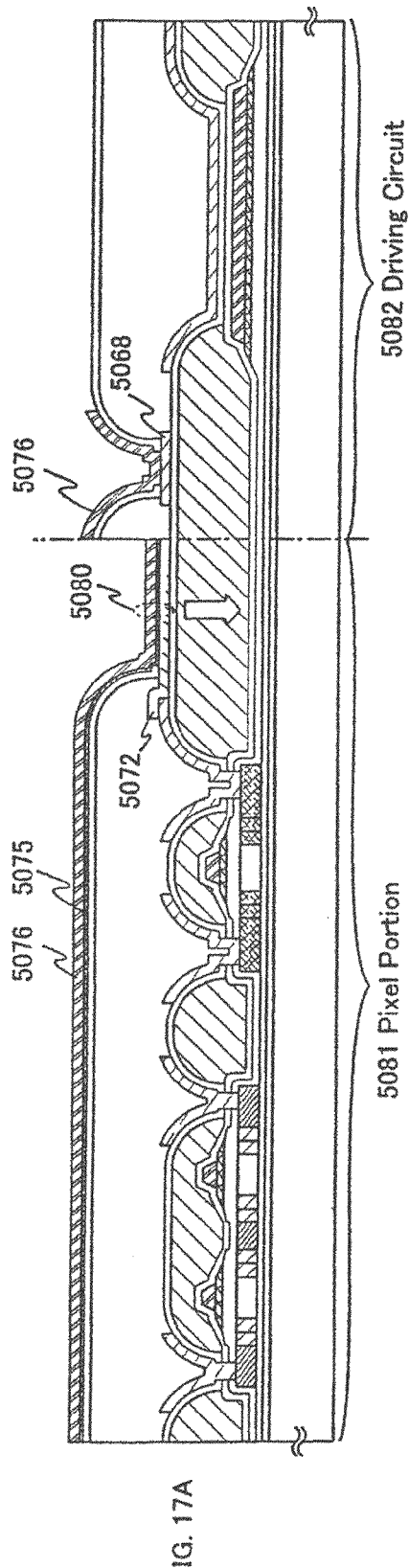
FIGS. 17A and 17B show diagrams showing a method of manufacturing a semiconductor display device of the present invention.

In this way, a light emitting device with a structure as shown in FIG. 17A is obtained. In FIG. 17A, reference numeral 5081 denotes a pixel portion and 5082 denotes a driving circuit or other circuits. Note that a part 5080 where the pixel electrode 5072, the electroluminescence layer 5075, and the cathode 5076 overlap each other is equivalent to the OLED.

Figure 17B:
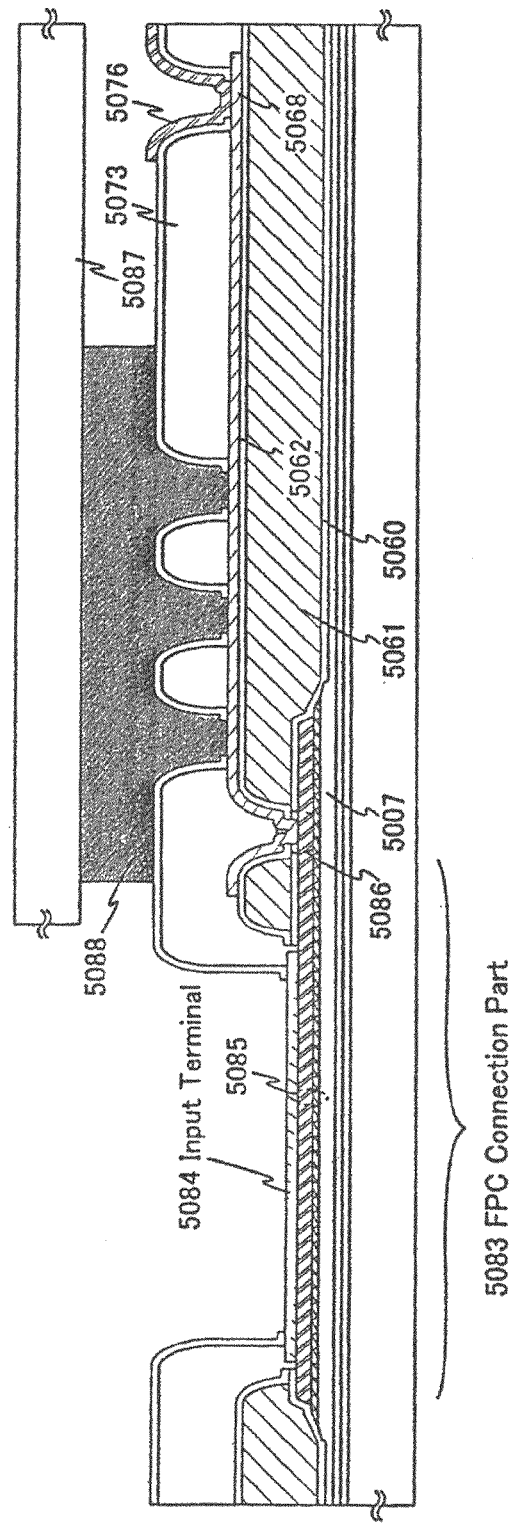

In addition, a part of the cathode 5076 is connected to the leading out wiring 5068. The leading out wiring 5068 is electrically connected to a terminal to be connected to the FPC. A sectional structure of the part to be connected to the FPC (FPC connection part) 5083 is shown in FIG. 17B.

A lead wiring 5085 formed from the same conductive layer as the gate electrode is formed on the gate insulating film 5007. Then, the lead wiring 5085 is connected to the leading out wiring 5068 via a contact hole 5086 formed in the first inorganic insulating film 5060 and the second inorganic insulating film 5062 in the opening of the organic resin film 5061.

Then, on the lead wiring 5085, an opening of the organic resin film 5061 is provided and the first inorganic insulating film 5060 and the second inorganic insulating film 5062 are etched to be removed, whereby the lead wiring 5085 is exposed. Thereafter, an input terminal 5084 formed from the same transparent conductive film as the pixel electrode 5072 is formed on the lead wiring 5085.

A terminal of the FPC is connected to the terminal 5084 via a conductive resin having anisotropy.

Reference numeral 5087 denotes a cover material, which is high in air tightness and is sealed by a sealing material 5088 emitting less gas. Note that, as shown in FIG. 17B, in order to increase adhesion of the cover material 5087 and the element substrate on which the light emitting element is formed, unevenness may be provided by forming plural openings in the surface of the second interlayer insulating film 5073 in a part on which the sealing material 5088 is applied.

Note that the structure and the specific manufacturing method of the TFT described in this embodiment are only an example, and the present invention is not limited to this structure.

Embodiment 2

In an active matrix semiconductor display device, a pixel portion has a plurality of pixels and a video signal is supplied through a signal line to a pixel that is chosen by a signal inputted to a scanning line. This embodiment gives a description on an example in which capacitor storage is used to reduce amplitude of noise of a signal inputted from a scanning line driving circuit to the scanning line.

First, the structure of a general active matrix liquid-crystal display device is described. Although the description in this embodiment takes as an example a liquid crystal display device, the structure of the present invention is also applicable to other active matrix semiconductor display devices.

Figure 18A:
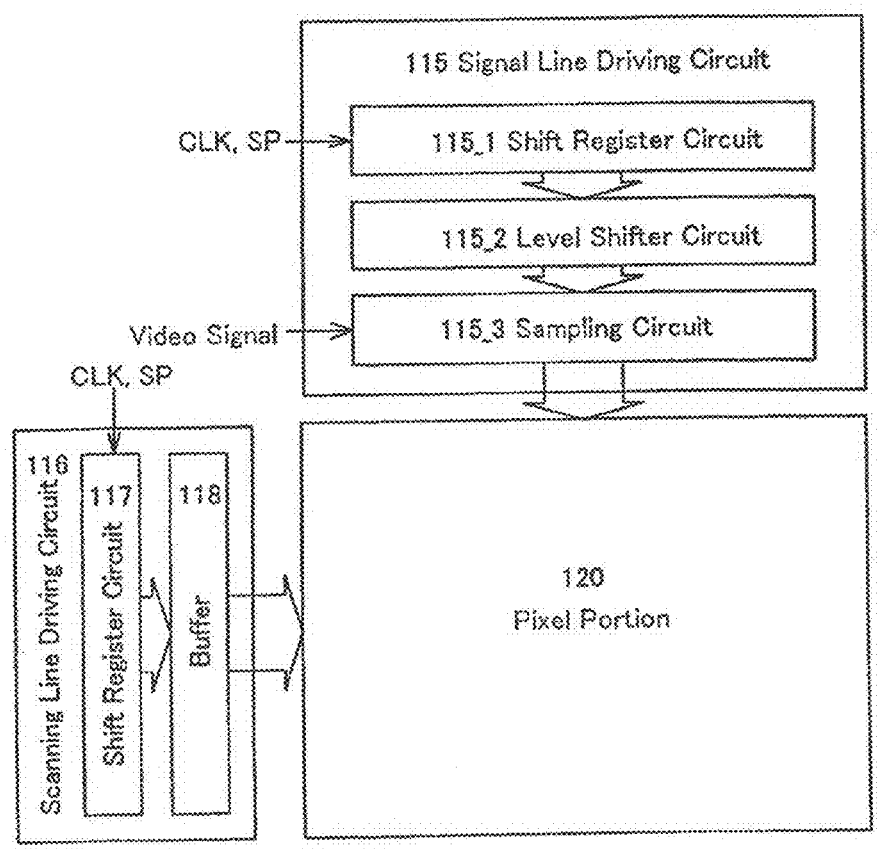
FIGS. 18A and 18B show block diagrams showing the structure of a semiconductor display device of the present invention and a circuit diagram of a pixel portion.

FIG. 18A is a block diagram of a semiconductor display device of the present invention. Denoted by 115 is a signal line driving circuit, 116, a scanning line driving circuit, and 120, a pixel portion. The signal line driving circuit 115 has a shift register circuit 115_1, a level shifter circuit 115_2, and a sampling circuit 115_3. In FIG. 18A, the level shifter circuit 115_2 is placed between the shift register circuit 115_1 and the sampling circuit 115_3. Alternatively, the level shifter circuit 115_2 may be incorporated in the shift register circuit 115_1.

As a clock signal (CLK) and a start pulse signal (SP) are supplied to the shift register circuit 115_1, the shift register circuit 115_1 generates a timing signal for controlling the timing of sampling a video signal.

The timing signal generated is supplied to the level shifter circuit 115_2. The level shifter circuit 115_2 amplifies the amplitude of the voltage of the timing signal supplied.

The timing signal amplified by the level shifter circuit 115_2 is inputted to the sampling circuit 1153. A video signal inputted to the sampling circuit 115_3 is sampled in sync with the timing signal inputted to the sampling circuit 115_3, and then inputted to the pixel portion 120 through a signal line.

On the other hand, the scanning line driving circuit 116 has a shift register circuit 117 and a buffer 118. A level shifter circuit may be added thereto in some cases.

In the scanning line driving circuit 116, a timing signal from the shift register circuit 117 is inputted to the buffer 118 to be sent to a corresponding scanning line.

Figure 18B:
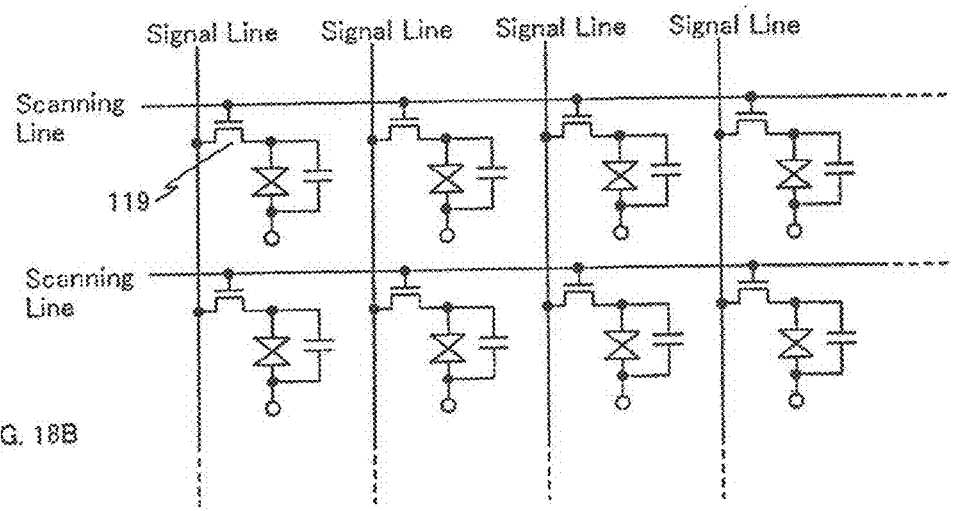

FIG. 18B shows a part of the pixel portion. A gate electrode of a pixel TFT 119 of every pixel in one line is connected to each scanning line. Every pixel TFT 119 in one line of pixels has to be turned on simultaneously and therefore the buffer 118 employed has to be capable of dealing with large current flow.

In this embodiment, a capacitor structured as shown in the embodiment mode is formed between a wiring that supplies the voltage Vdd to the buffer 118 and a scanning line. In this way, the amplitude of noise in a selection signal inputted to the scanning line is reduced.

Figure 19:
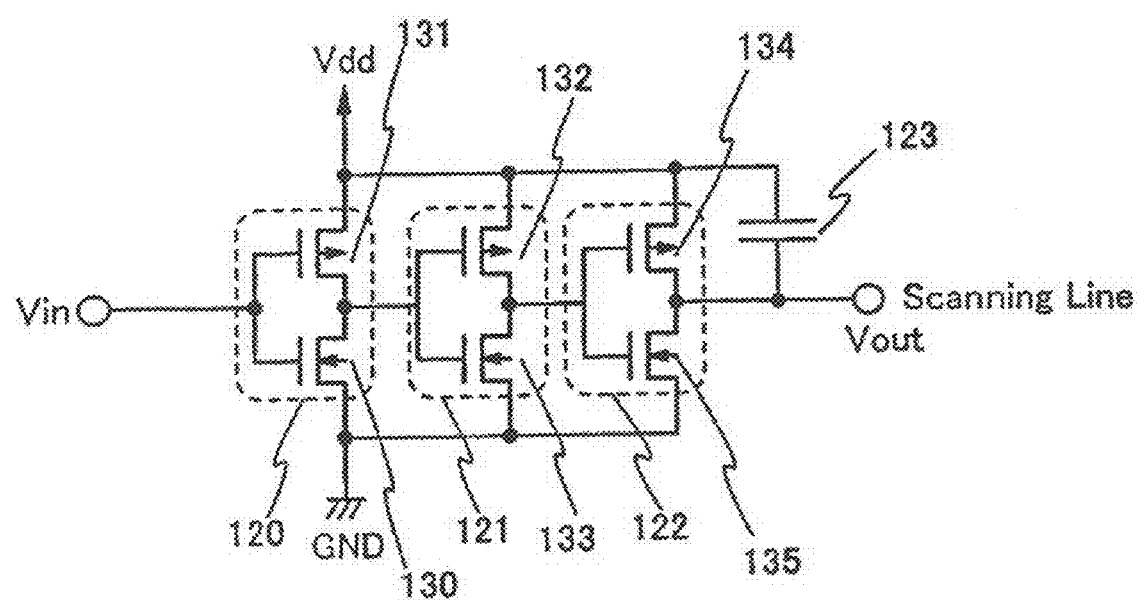
FIG. 19 shows a circuit diagram of a buffer, a scanning line, and capacitor storage.

FIG. 19 shows the structure of the buffer 118 of the scanning line driving circuit according to this embodiment. The buffer 118 is composed of three inverters 120 to 122. The inverter 120 has an n-channel TFT 130 and a p-channel TFT 131. The inverter 121 has an n-channel TFT 132 and a p-channel TFT 133. The inverter 122 has an n-channel TFT 134 and a p-channel TFT 135.

Capacitor storage 123 has two electrodes (a first capacitor electrode and a second capacitor electrode), and one of the electrodes receives the power supply voltage Vdd whereas the other electrode is electrically connected to a scanning line.

FIG. 20A is a top view of the buffer of this embodiment which is shown in FIG. 19. FIG. 20B corresponds to a sectional view taken along the line A-A' in FIG. 20A. A wiring 143 to which the power supply voltage Vdd is supplied functions as the second capacitor electrode of the capacitor 123. The capacitor 123 is formed in a portion where the first capacitor electrode 140 overlaps the wiring 143 sandwiching between a first inorganic insulating film 141 and a second inorganic insulating film 142 in an opening of an organic resin film 145.

This embodiment can be combined with Embodiment 1.

Embodiment 3

In this embodiment, a structure of a light emitting device having a sectional structure different from that of the light emitting device shown in Embodiment 1 will be described.

Figure 21A:
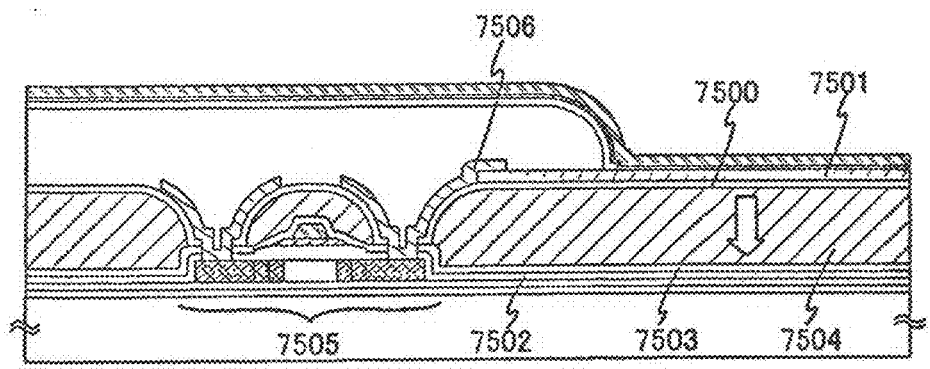
FIGS. 21A to 21D show sectional views of a semiconductor display device of the present invention.

In a light emitting device shown in FIG. 21A, after forming a second inorganic insulating film 7500, a transparent conductive film is formed and patterned before forming a contact hole, whereby a pixel electrode 7501 is formed. Then, a gate insulating film 7502, a first inorganic insulating film 7503, and the second inorganic insulating film 7500 are etched in an opening of an organic resin film 7504 to form the contact hole, and a wiring 7506 electrically connecting a TFT 7505 and the pixel electrode 7501 is formed.

In this way, by forming the pixel electrode 7501 before forming the wiring 7506, a process of polishing a surface of the pixel electrode before forming the wiring 7506 can be provided.

Figure 21B:
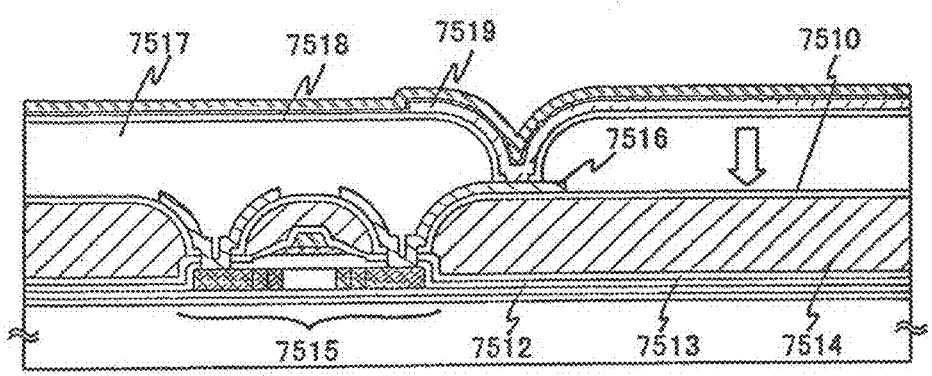

In a light emitting device shown in FIG. 21B, after forming a second inorganic insulating film 7510, a gate insulating film 7512, a first inorganic insulating film 7513, and the second inorganic insulating film 7510 are etched in an opening of an organic resin film 7514 to form a contact hole, and a wiring 7516 electrically connecting to a TFT 7515 is formed.

Then, a second interlayer insulating film 7517 is formed covering the wiring 7516 and the second inorganic insulating film 7510. The second interlayer insulating film 7517 may be a positive photosensitive organic resin film or a negative photosensitive organic resin film. In FIG. 21B, the second interlayer insulating film 7517 is formed using positive acrylic.

Then, an opening is formed in the second interlayer insulating film 7517 by exposing it to light to expose a part of the wiring 7516. Thereafter, a third interlayer insulating film 7518 is formed on the second interlayer insulating film 7517 covering the opening, and a part of the third interlayer insulating film 7518 is removed in the opening to expose a part of the wiring 7516. At this point, an arrangement is made such that the second interlayer insulating film 7517 is not exposed in the opening.

Then, a transparent conductive film is formed on the third interlayer insulating film 7518 and patterned, whereby a pixel electrode 7519 connected to the wiring 7516 is formed.

Figure 21C:
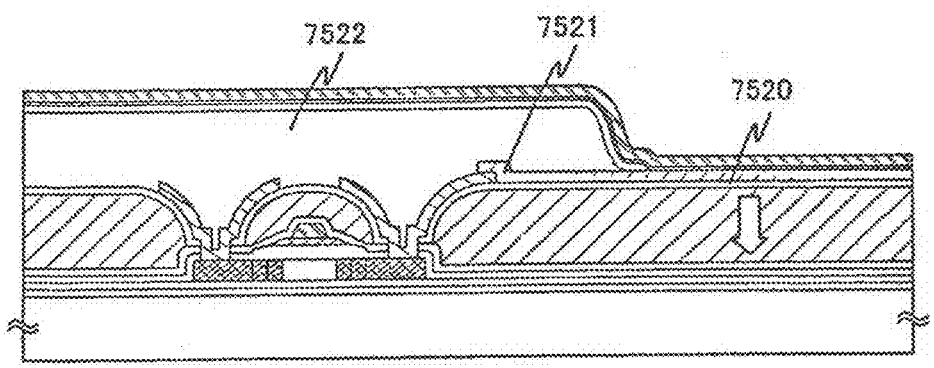

A light emitting device shown in FIG. 21C indicates an example in which, after forming a pixel electrode 7521 on a second inorganic insulating film 7520, a third interlayer insulating film 7522 is formed using negative acrylic. When the third interlayer insulating film 7522 is formed using negative acrylic, it is unnecessary to perform exposure with the object of decolorizing the third interlayer insulating film 7522.

Figure 21D:
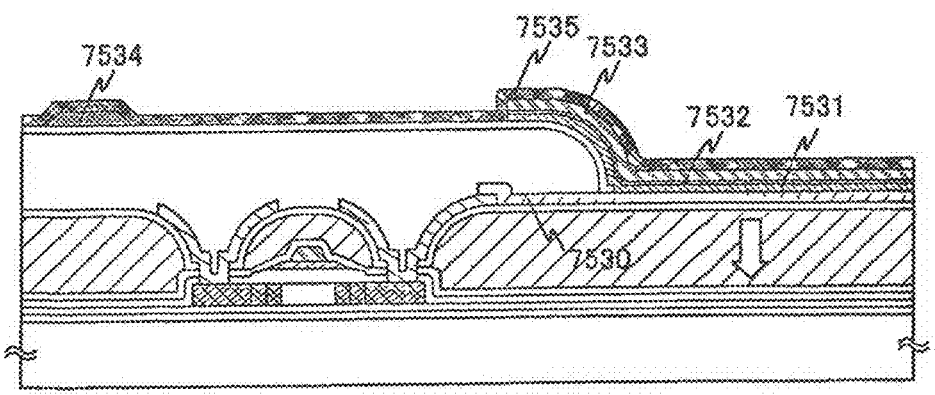

FIG. 21D illustrates an example in which the PEDOT film is removed by patterning in case that polythiophene (PEDOT) as a hole injection layer is used in a part of an electroluminescence layer of a light emitting element.

Since the polythiophene (PEDOT) is generally formed as a film using the spin coating method, even a part which is not desired to be formed as a film, is formed as a film. Thus, after forming a PEDOT film 7531 on a pixel electrode 7530, a light emitting layer 7532 and a cathode 7533 are formed by evaporation using a mask for evaporation. Although a paraphenylenevinylene (PPV) film is used as the light emitting layer in this embodiment, any film may be used as long as it can be formed by the evaporation method. In addition, although Ca is used as the cathode 7533 in this embodiment, any material may be used as long as it is a material with a small work function and can be formed by the evaporation method.

Next, PEDOT is patterned by ashing using oxygen plasma with the cathode 7533 as a mask.

Next, a capacitor electrode 7534 is formed. A capacitor electrode is an electrode provided for lowering a resistance of a cathode and consists of a metal material having a resistance lower than that of the cathode. The capacitor electrode 7534 is obtained by forming a conductive film consisting of the metal material having a resistance lower than that of the cathode, and then patterning them.

Then, a protective film 7535 electrically connecting the capacitor electrode 7534 and the cathode 7533 is formed by evaporation using a mask for evaporation. The protective film 7535 consists of a metal material, which may be the same as the material for the cathode 7533.

Note that, in FIG. 21D, an example of patterning a hole injection layer with a cathode of a light emitting element as a mask is shown. However, this embodiment is not limited to this structure. An electroluminescence layer other than the hole injection layer may be patterned with the cathode as a mask.

Figure 22A:
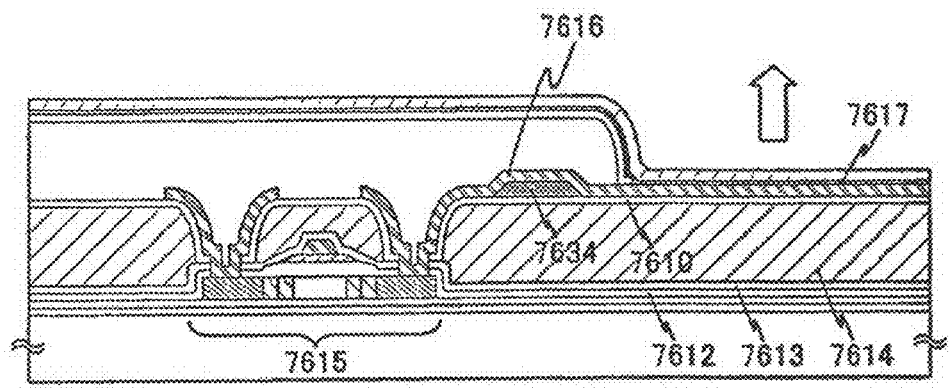
FIGS. 22A and 22B show sectional views of a semiconductor display device of the present invention.

In a light emitting device shown in FIG. 22A, after forming a second inorganic insulating film 7610, a conductive film consisting of a metal material having a resistance lower than that of a cathode is formed and patterned, whereby an capacitor electrode 7634 is formed. Then, a gate insulating film 7612, a first inorganic insulating film 7613, and the second inorganic insulating film 7610 are etched in an opening of an organic resin film 7614 to form a contact hole, and a wiring 7616 electrically connecting a TFT 7615 and an capacitor electrode 7634 is formed.

The wiring 7616 is in contact with an electroluminescence layer 7617 in a part thereof and functions as a cathode.

Figure 22B:
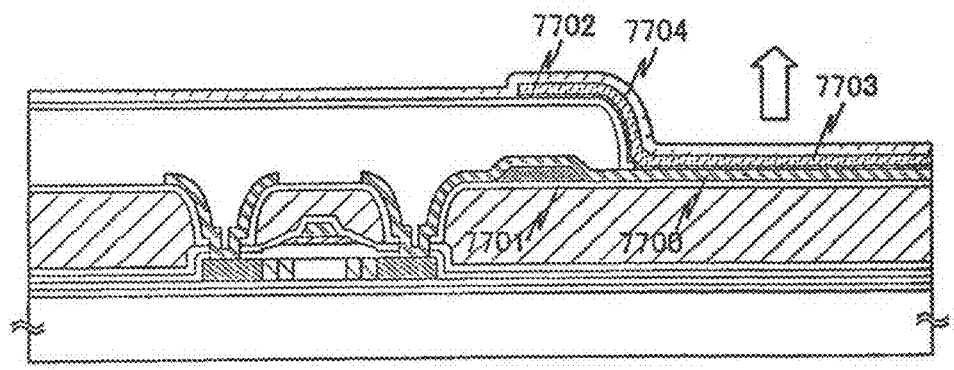

In a light emitting device shown in FIG. 22B, after forming a cathode 7700 on a second inorganic insulating film 7701, an electroluminescence layer 7702 and an ITO film 7703 are formed. At this point, a work function can be reduced by adding Li to the ITO film 7703. Then, anew ITO film 7704 is formed separately to cover the ITO film 7703 added with Li.

In addition, this embodiment can be conducted by combining with Embodiment 2.

Embodiment 4

In this embodiment, electric connection between a capacitor electrode for lowering a resistance of a cathode and an input terminal to be connected to a terminal of an FPC will be described.

FIG. 23A shows a sectional view of a light emitting device at a point when an capacitor electrode 6202 is formed on the third interlayer insulating film 6201 after a third interlayer insulating film 6201 is formed on a second interlayer insulating film 6200 having an opening. The capacitor electrode 6202 is formed of a material having a wiring resistance lower than that of a cathode to be formed later.

Note that an electrode for FPC 6204 formed of the same conductive film as a gate electrode 6203 of a TFT is formed in an opening of the second interlayer insulating film 6200. In addition, an input terminal 6205 formed of the same transparent conductive film as a pixel electrode 6206 is formed on the electrode for FPC 6204.

At the point of FIG. 23A, the input terminal 6205 is covered by the third interlayer insulating film 6201 in an FPC connection part 6215.

Next, as shown in FIG. 23B, a part of the third interlayer insulating film 6201 is etched to be removed, whereby the input terminal 6205 and the pixel electrode 6206 are partly exposed. At this point, the second interlayer insulating film 6200 is set not to be exposed.

After laminating an electroluminescence layer 6210 and a cathode 6211 on the pixel electrode 6206, a protective film 6212 connecting the input terminal 6205 and the cathode 6211 is formed.

In the above-mentioned structure, when the capacitor electrode 6202 is formed by etching, since the pixel electrode 6206 is covered by the third interlayer insulating film 6201, the surface of the pixel electrode can be prevented from being roughened by the etching.

Figure 24:
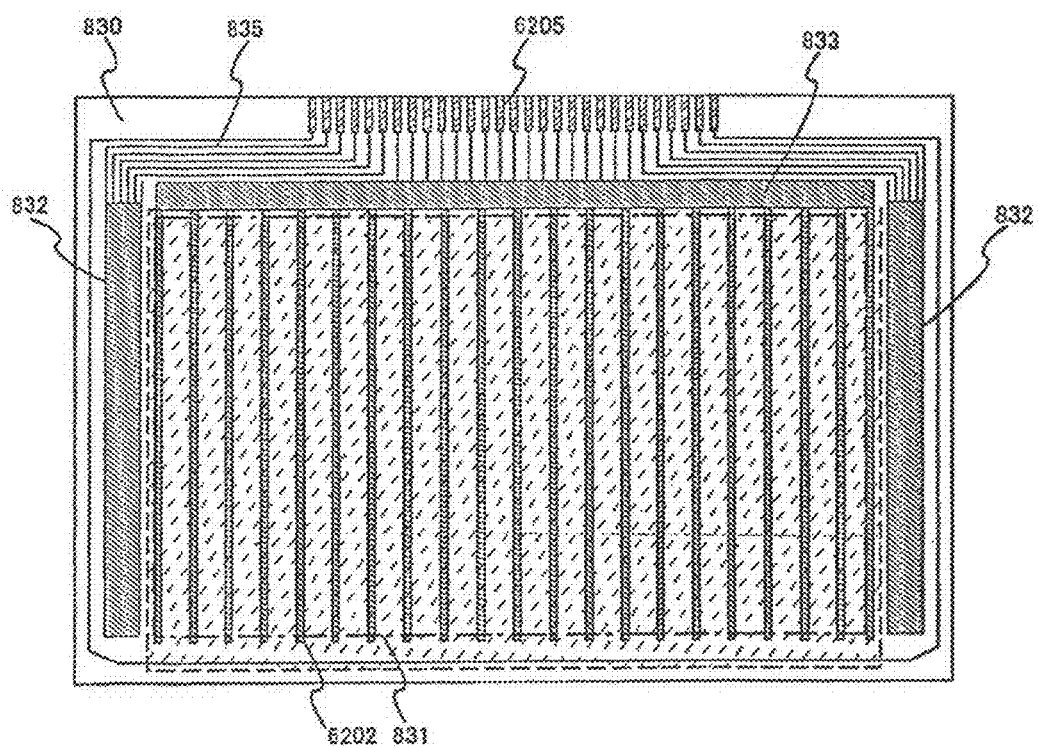
FIG. 24 shows a top view of a semiconductor display device of the present invention.

FIG. 24 shows a top view of a substrate (element substrate), on which light emitting elements are formed, of the light emitting device of this embodiment. A state in which a pixel portion 831, scanning line driving circuits 832, a signal line driving circuit 833, and the input terminals 6205 are formed on a substrate 830 is shown. The input terminals 6205 and the respective driving circuits, a power supply line and opposed electrodes formed in the pixel portion are connected by lead wirings 835. The light emitting elements are formed the respective adjacent capacitor electrodes 6202 which are laid out in a stripe shape.

In addition, an IC chip on which a CPU or a memory is formed may be implemented on an element substrate by a COG (Chip on Glass) method or the like, if necessary.

Also, this embodiment can be conducted by freely combining with Embodiment 2.

Embodiment 5

In this embodiment, a structure of a liquid crystal display device, which is one of the semiconductor display devices of the present invention, will be described.

Figure 25:
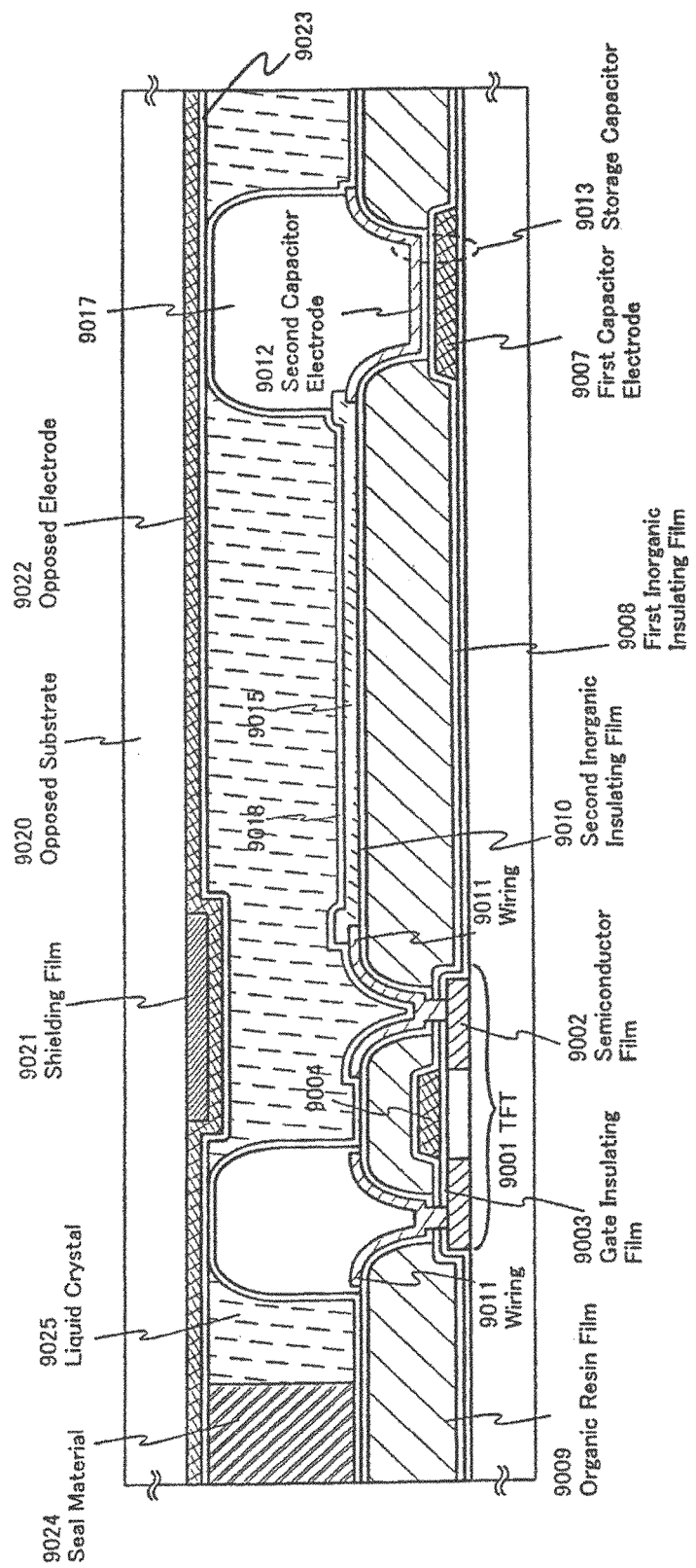
FIG. 25 shows a sectional view of a semiconductor display device of the present invention.

A sectional view of the liquid crystal display device of this embodiment is shown in FIG. 25. In FIG. 25, a TFT 9001 is formed on an insulating surface. The TFT 9001 is a top gate type and has a semiconductor film 9002, a gate insulating film 9003 which is in contact with the semiconductor film 9002, and a gate electrode 9004 which is in contact with the gate insulating film.

On the other hand, a first capacitor electrode 9008 formed on the gate insulating film 9003 can be formed from the same conductive film as the gate electrode 9004.

Further, a first inorganic insulating film 9008 is formed so as to cover the TFT 9001 and the first capacitor electrode 9007. The first inorganic insulating film 9008 is an insulating film containing nitrogen and has a characteristic that it is less likely to penetrate moisture than an organic resin film to be formed later.

Then, after applying a photosensitive organic resin on the first inorganic insulating film, the photosensitive organic resin is baked and a part to be opened is exposed to light and developed, whereby an organic resin film 9009 having the opening is formed. At this point, a part of the first inorganic resin film 9008 is exposed in the opening.

Then, a second inorganic insulating film 9010 is formed covering the organic resin film 9009 and the part of the first inorganic insulating film 9008 exposed in the opening. The second inorganic insulating film 9010, like the first inorganic insulating film 9008, is an insulating film containing nitrogen and has a characteristic that it is less likely to penetrate moisture than an organic resin film to be formed later.

Then, in the opening of the organic resin film 9009, the gate insulating film 9003, the first inorganic insulating film 9008, and the second inorganic insulating film 9010 are subjected to dry etching such that a part of the semiconductor film 9002 is exposed, and a contact hole is formed. The semiconductor film 9002 has an effect as an etching stopper.

At this point, the first inorganic insulating film 9008 and the second inorganic insulating film 9010 existing on the first capacitor electrode 9007 are covered by a resist mask so as not to be etched.

Then, a conductive film is formed on the second inorganic insulating film 9010 so as to cover the contact hole. The conductive film is etched, whereby wirings 9011 connected to the semiconductor film 9002 and a second capacitor electrode 9012 are formed. The second capacitor electrode 9012 overlaps the first capacitor electrode 9007 sandwiching between the first inorganic insulating film 9008 and the second inorganic insulating film 9010. A storage capacitor 9013 is formed of the second capacitor electrode 9012, the first inorganic insulating film 9008, the second inorganic insulating film 9010, and the first capacitor electrode 9007.

Then, a transparent conductive film is formed on the second inorganic insulating film 9010 so as to cover the wirings 9011 and the second capacitor electrode 9012 and patterned, whereby a pixel electrode 9015 is formed. The pixel electrode 9015 is connected to one of the wirings 9011 and the second capacitor electrode 9012.

Then, positive acrylic is applied on the second inorganic insulating film 9010 covering the pixel electrode 9015, the wirings 9011, and the second capacitor electrode 9012 and baked, then partially exposed to light and developed, whereby a third interlayer insulating film 9017 having an opening is formed. Although positive acrylic is used for the third interlayer insulating film 9017 in this embodiment, negative acrylic may be used. The pixel electrode 9015 is exposed in the opening. The third interlayer insulating film 9017 is used as a spacer for keeping a fixed interval between substrates. A thickness thereof is desirably approximately 0.7 μm to several μm, although it depends upon a type of liquid crystal.

Then, an orientation film 9018 is formed. Usually, a polyimide resin is used for an orientation film for a liquid crystal display device. After forming the orientation film, rubbing treatment is applied to the orientation film such that liquid crystal molecules are oriented with a certain constant pre-tilt angle.

A light shielding film 9021, an opposed electrode 9022, and an orientation film 9023 are formed on an opposed substrate 9020 on an opposed side. As the light shielding film 9021, a Ti film, a Cr film, an Al film, or the like are formed with a thickness of 150 to 300 nm. Then, the pixel portion, the element substrate on which the driving circuits are formed, and the opposed substrate are stuck together by a seal material 9024. A filler (not shown) is mixed in the seal material 9024, and two substrates are stuck together with a uniform interval by this filler and the third interlayer insulating film 9017. Thereafter, liquid crystal 9025 is injected between both the substrates. A publicly known liquid crystal material can be used as a liquid crystal material. For example, other than TN liquid crystal, no-threshold anti-ferroelectric mixed liquid crystal showing electro-optical response property, with which a transmissivity continuously changes with respect to an electric field, can also be used. Some no-threshold anti-ferroelectric mixed liquid crystal shows a V-shaped electro-optical response property. In this way, an active matrix liquid crystal display device shown in FIG. 25 is completed.

The liquid crystal display device described in this embodiment is only an example of the liquid crystal devices of the present invention, and the present invention is not limited to the structure shown in FIG. 25.

Also, this embodiment can be conducted by freely combining with Embodiment 2.

Embodiment 6

In this embodiment, a structure of a driving circuit of a liquid crystal display device, which is one of the semiconductor display devices of the present invention, will be described.

Figure 26:
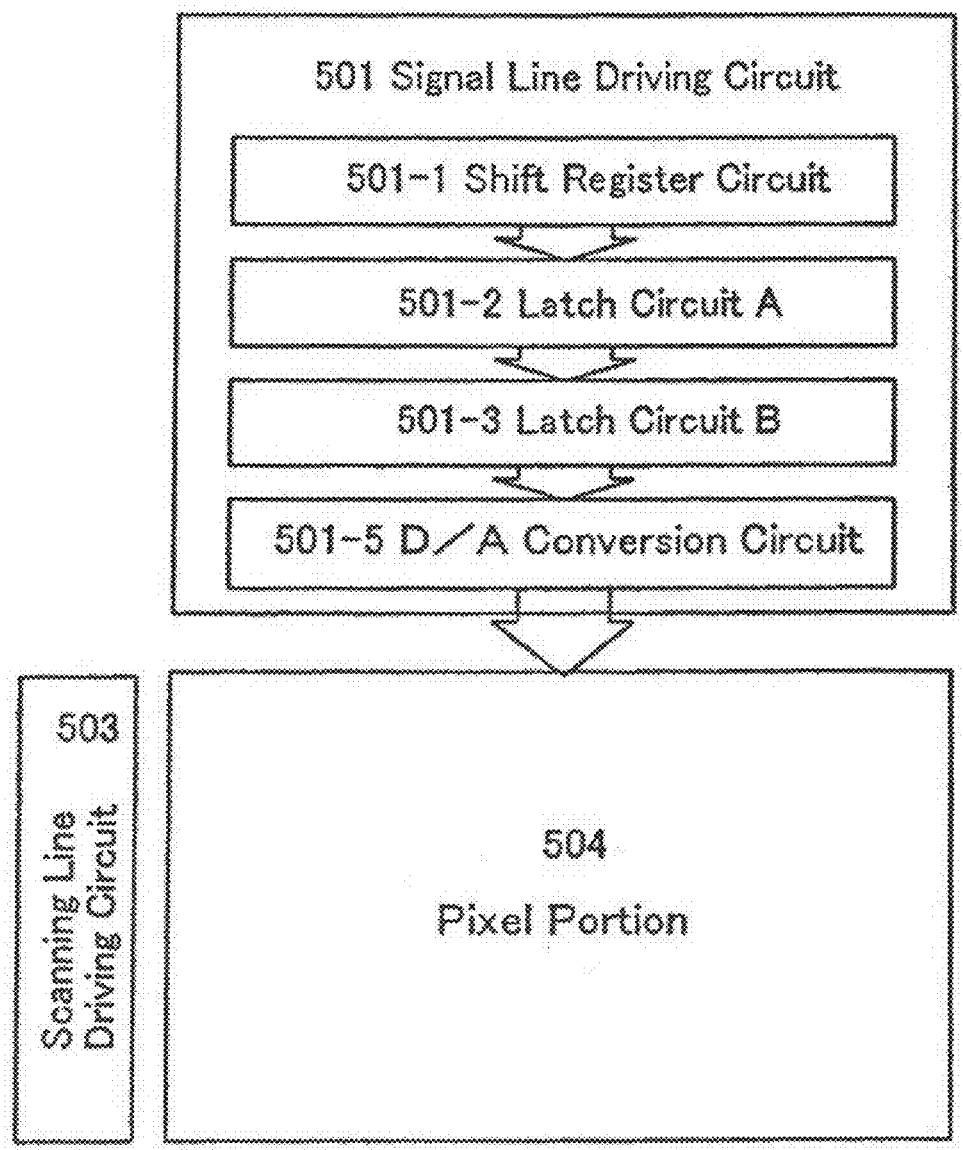
FIG. 26 shows a block diagram of driving circuits in a semiconductor display device of the present invention.

FIG. 26A is a schematic block diagram of an active matrix liquid crystal display device of this embodiment. Reference numeral 501 denotes a signal line driving circuit; 503, a scanning line driving circuit; and 504, a pixel portion.

The signal line driving circuit 501 has a shift register circuit 501-1, a latch circuit A 501-2, a latch circuit B 501-3, and a D/A conversion circuit (DAC) 501-5. Besides, the signal line driving circuit 501 has a buffer circuit and a level shift circuit (both of which are not shown). In addition, for convenience of description, a level shift circuit is included in the DAC 501-5.

In addition, reference numeral 503 denotes the scanning line driving circuit, which may have a shift register circuit, a buffer circuit, and a level shifter circuit.

The pixel portion 504 has plural pixels. A TFT serving as a switching element is arranged in each pixel. One of a source and a drain of each pixel TFT is connected to a signal line and the other is connected to a pixel electrode. In addition, the gate is electrically connected to the scanning line. Each pixel TFT controls supply of a video signal to the pixel electrode electrically connected to each pixel TFT. The video signal is supplied to each pixel electrode, a voltage is applied to liquid crystal sandwiched between each pixel electrode and an opposed electrode to drive the liquid crystal.

First, operations of the signal line driving circuit 501 will be described. In the shift register circuit 501-1, a timing signal for controlling timing at which a digital video signal is latched by the latch circuit A 501-2 is generated based upon an inputted clock signal and a start pulse.

In the latch circuit A 501-2, the digital video signal is latched synchronizing with the generated timing signal. When the digital video signal is latched in all stages of the latch circuit A 501-2, a latch signal is supplied to the latch circuit B 501-3 in accordance with operation timing of the shift register circuit 501-1. At this instance, the digital video signal latched by the latch circuit A 501-2 is transmitted to the latch circuit B 501-3 all at once and latched by latch circuits of all the stages of the latch circuit B 501-3.

In the latch circuit A 501-2 which has completed transmitting the digital video signal to the latch circuit B 501-3, the digital video signal is latched sequentially based upon a timing signal from the shift register circuit 501-1.

On the other hand, the digital video signal latched in the latch circuit B 501-3 is supplied to the D/A conversion circuit (DAC) 501-5. The DAC 501-5 converts the digital video signal into an analog video signal and supplies the analog signal to each signal line sequentially.

In the scanning line driving-circuit 503, a timing signal from a shift register circuit (not shown) is supplied to a buffer circuit (not shown) and to a corresponding scanning line. Since gate electrodes of pixel TFTs for one line are connected to the scanning line and all the pixel TFTs for one line have to be turned ON simultaneously, a buffer circuit with a large current capacity is used for the above-mentioned buffer circuit.

In this way, switching of a corresponding pixel TFT is performed by a scanning signal from the scanning line driving circuit, an analog video signal (gradation voltage) from the signal line driving circuit is supplied to the pixel TFT to drive liquid crystal molecules.

In the liquid crystal display device of this embodiment, in case that the D/A conversion circuit 501-5 is a capacity dividing type, it may have a capacitor of the structure described in the embodiment mode.

Note that, although the signal line driving circuit and the scanning line driving circuit described in this embodiment are used as driving circuits of a liquid crystal display device, the driving circuits may be used as driving circuits of a light emitting device or other semiconductor display devices.

Embodiment 7

The semiconductor display device manufactured by the present invention can be applied to various electronic apparatuses. Examples of the electronic apparatuses can be given as portable information terminals (electronic books, mobile computers, cellular phones, or the like), video cameras, digital cameras, personal computers, TV receivers, cellular phones, projection display apparatuses, or the like. Specific examples of these electronic apparatuses are shown in FIGS. 27A to 27H.

Figure 27A:
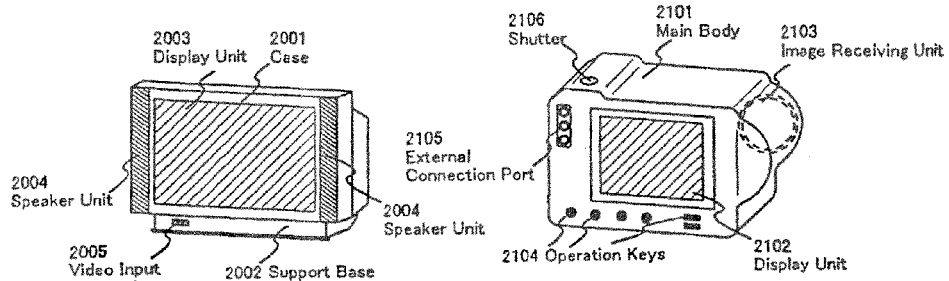
FIGS. 27A to 27H show diagrams showing electronic apparatuses using a semiconductor display device of the present invention.

FIG. 27A shows a display device including a case 2001, a support base 2002, a display unit 2003, speaker units 2004, a video input terminal 2005, etc. The display device of the present invention is completed by using the semiconductor display device of the present invention to the display unit 2003. The display device refers to all display devices for displaying information, including ones for personal computers, for TV broadcasting reception, and for advertisement.

Figure 27B:
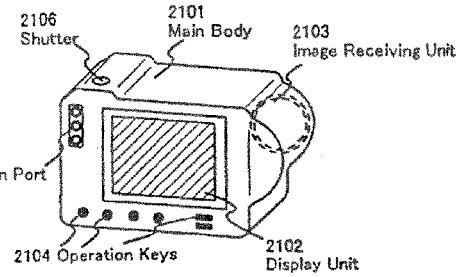

FIG. 27B shows a digital still camera including a main body 2101, a display unit 2102, an image receiving unit 2103, operation keys 2104, an external connection port 2105, a shutter 2106, etc. The digital still camera of the present invention is completed by using the semiconductor display device of the present invention to the display unit 2102.

Figure 27C:
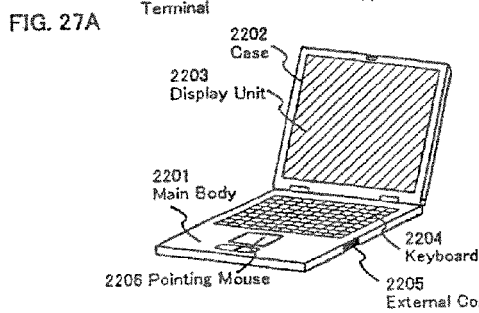

FIG. 27C shows a note-type personal computer including a main body 2201, a case 2202, a display unit 2203, a keyboard 2204, an external connection port 2205, a pointing mouse 2206, etc. The laptop of the present invention is completed by using the semiconductor display device of the present invention to the display unit 2203.

Figure 27D:
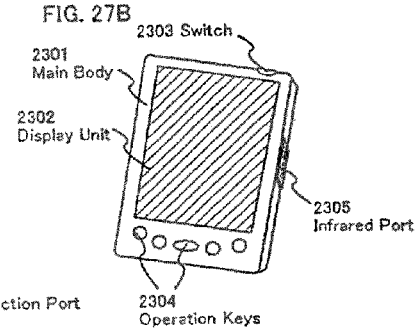

FIG. 27D shows a mobile computer including a main body 2301, a display unit 2302, a switch 2303, operation keys 2304, an infrared port 2305, etc. The mobile computer of the present invention is completed by using the semiconductor display device of the present invention to the display unit 2302.

Figure 27E:
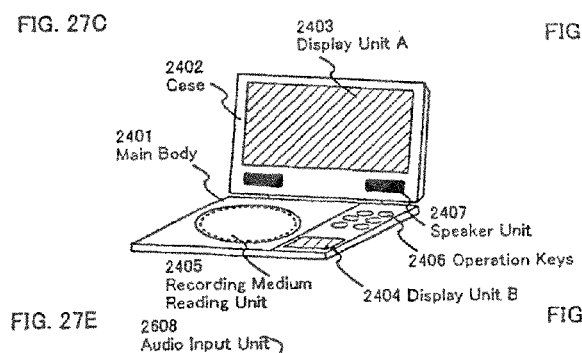

FIG. 27E shows a portable image reproducing apparatus having a recording medium (a DVD player, to be specific). The apparatus includes a main body 2401, a case 2402, a display unit A 2403, a display unit B 2404, a recording medium (DVD or the like) reading unit 2405, operation keys 2406, speaker units 2407, etc. The display unit A 2403 mainly displays image information whereas the display unit B 2404 mainly displays text information. Domestic video games and the like are also included in the image reproducing apparatus having a recording medium. The portable image reproducing apparatus of the present invention is completed by using the semiconductor display device of the present invention to the display units A 2403 and B 2404.

Figure 27F:
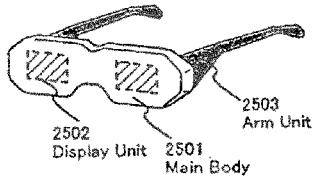

FIG. 27F shows a goggle type display (head mounted display) including a main body 2501, display units 2502, and arm units 2503. The goggle type display of the present invention is completed by using the semiconductor display device of the present invention to the display units 2502.

Figure 27G:
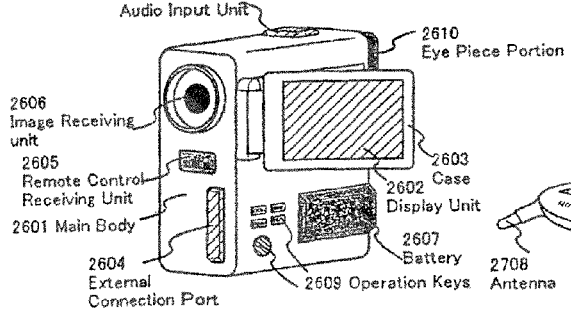

FIG. 27G shows a video camera including a main body 2601, a display unit 2602, a case 2603, an external connection port 2604, a remote control receiving unit 2605, an image receiving unit 2606, a battery 2607, an audio input unit 2608, operation keys 2609, eye piece portion 2610 etc. The video camera of the present invention is completed by using the semiconductor display device of the present invention to the display unit 2602.

Figure 27H:
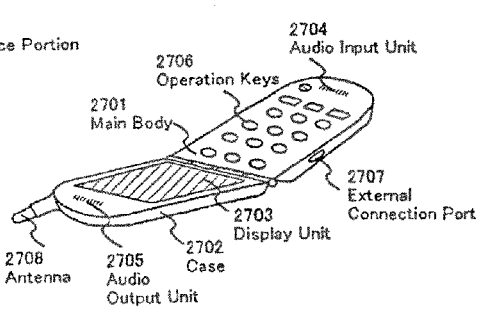

FIG. 27H shows a cellular phone including a main body 2701, a ease 2702, a display unit 2703, an audio input unit 2704, an audio output unit 2705, operation keys 2706, an external connection port 2707, an antenna 2708, etc. The display unit 2703 displays white letters on a black background, therefore the cellular phone consumes less power. The cellular phone of the present invention is completed by using the semiconductor display device of the present invention to the display unit 2703.

As described above, the application range of the present invention is so wide that can be applied to electronic apparatuses in any field. This embodiment can be conducted by combining with any configuration shown in Embodiments 1 to 6.

Embodiment 8

Figure 31A:
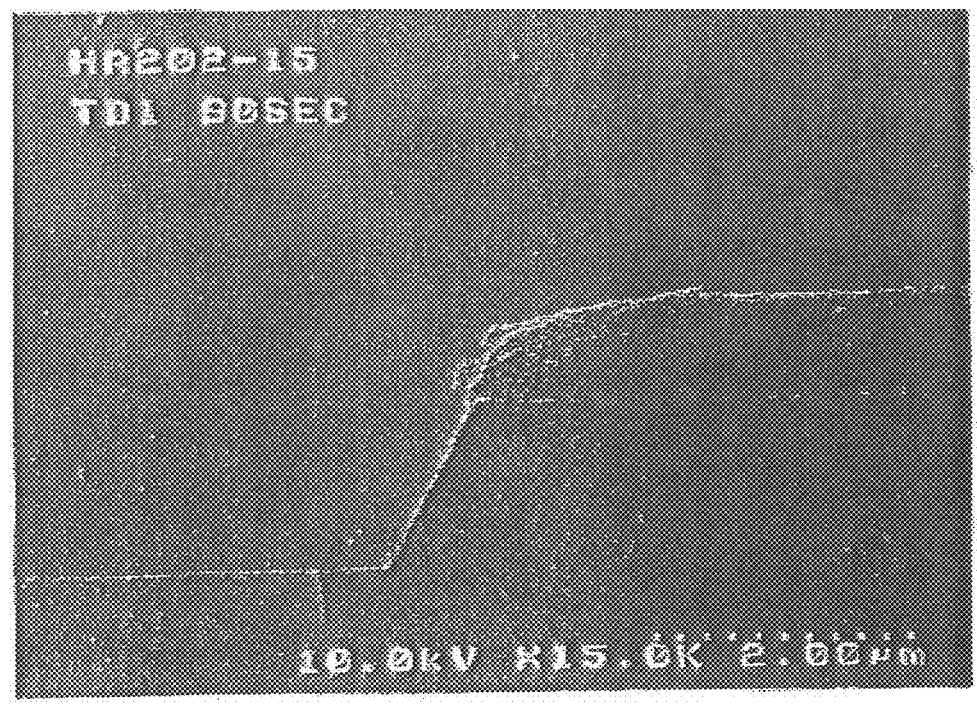
FIGS. 31A and 31B show sectional views of a non-photosensitive acrylic film in an opening.
Figure 31B:
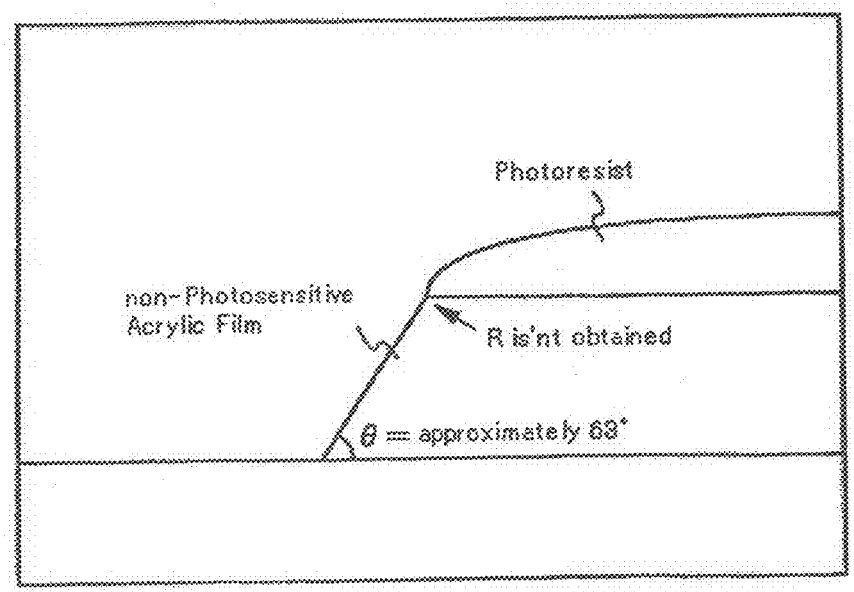

A photograph shown in FIG. 31A is a sectional SEM (scanning electron microscope) photograph in a state in which dry etching treatment is applied to a non-photosensitive acrylic film (film thickness: approximately 1.3 μm) to pattern it. FIG. 31B is a schematic view of FIG. 31A. When the dry etching treatment is applied to the non-photosensitive acrylic film as in the past, a curved surface is hardly formed in an upper part of the pattern, and an upper end substantially without a curvature radius (R) is obtained. In addition, although a taper angle (contact angle) is approximately 63° in a lower part of the pattern, no curved surface is observed in this lower end either.

Figure 32A:
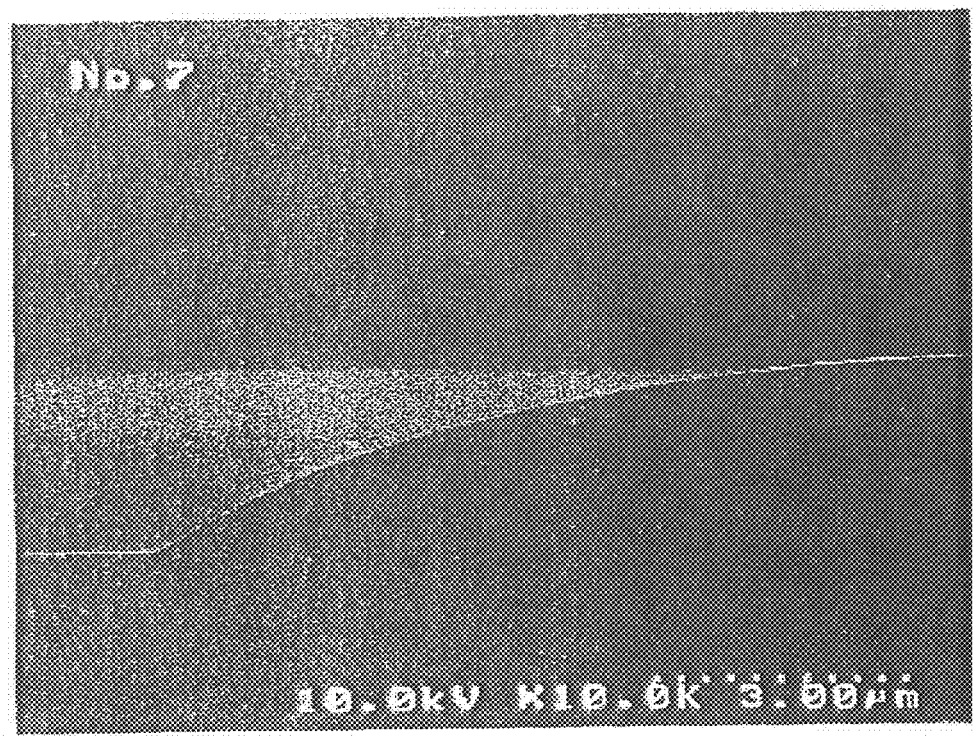
FIGS. 32A and 32B show sectional views of a positive photosensitive acrylic film in an opening.
Figure 32B:
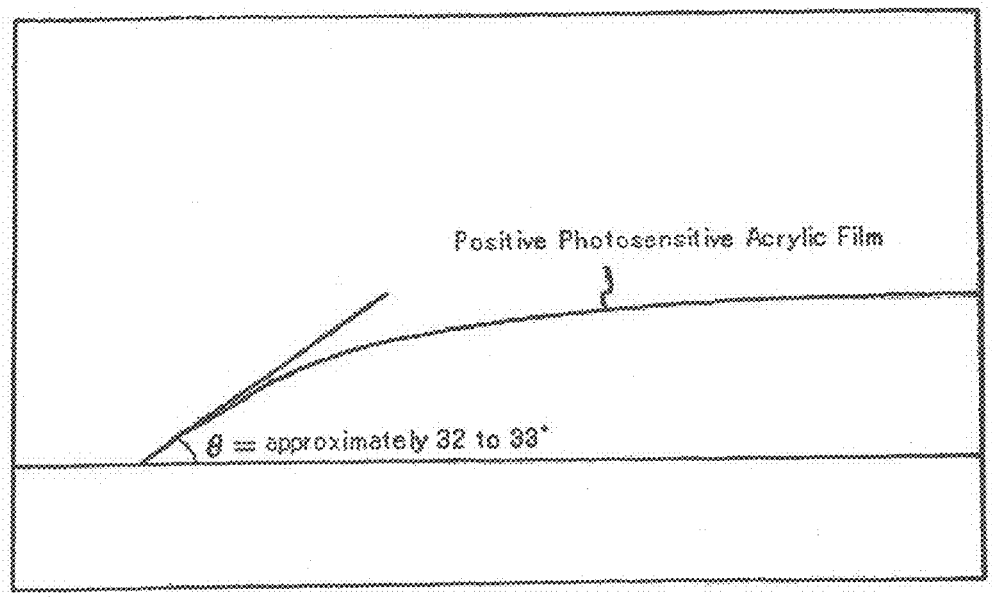

Next, a photograph shown in FIG. 32A is a sectional SEM photograph in a state in which exposure and development treatment are applied to a positive photosensitive acrylic film (film thickness: approximately 2.0 μm) to pattern it. FIG. 32B is a schematic view of FIG. 32A. A sectional shape of the positive photosensitive acrylic film has an extremely gentle curved surface after etching treatment with a developer, and a curvature radius (R) changes continuously. In addition, as a contact angle, a value as small as approximately 32 to 33° is obtained. That is, it is just like the shape shown in FIG. 1B. It can be said that it is a very useful shape in manufacturing the thin film transistor and the semiconductor display device of the present invention. It is needless to mention that, although a value of the contact angle changes depending upon etching conditions, a film thickness, and the like, it only has to satisfy 30°<θ<65° as described above.

Figure 33A:
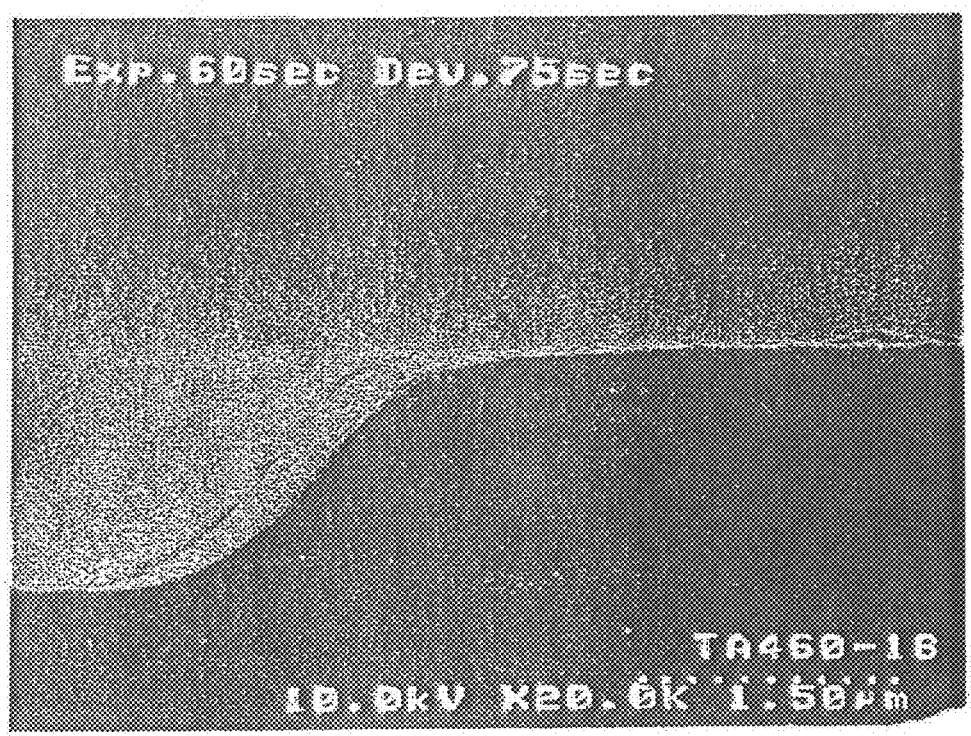
FIGS. 33A and 33B show sectional views of a negative photosensitive acrylic film in an opening.
Figure 33B:
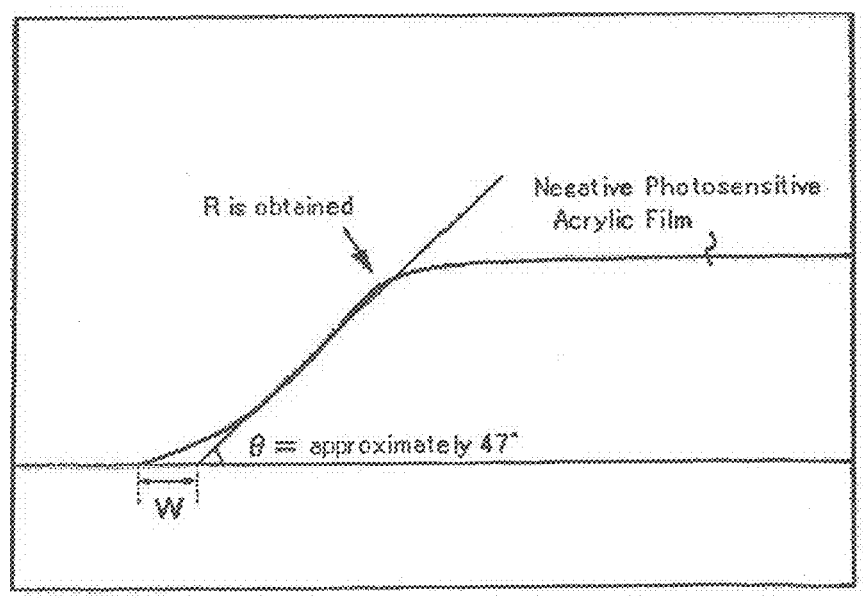

Next, a photograph shown in FIG. 33A is a sectional SEM photograph in a state in which exposure and development treatment are applied to a negative photosensitive acrylic film (film thickness: approximately 1.4 μm) to pattern it. FIG. 33B is a schematic view of FIG. 33A. A sectional shape of the negative photosensitive acrylic film has a gentle S-shaped curved surface after etching treatment with a developer and is curved with a certain curvature radius (R) in an upper end of the pattern. In addition, as a contact angle, a value of approximately 47° is obtained. In this case, a length of a part of a tail represented by W in FIG. 33B is a problem. In particular, in a contact hole (opening) requiring fine machining, if this tail part becomes long, it is likely that a state in which an electrode or a wiring in a lower layer is not exposed in the contact hole occurs, and disconnection due to contact failure is feared. However, a possibility of such disconnection decreases if the length (W) of this tail part is 1 μm or less (preferably, a length less than a radius of the contact hole).

Figure 34A:
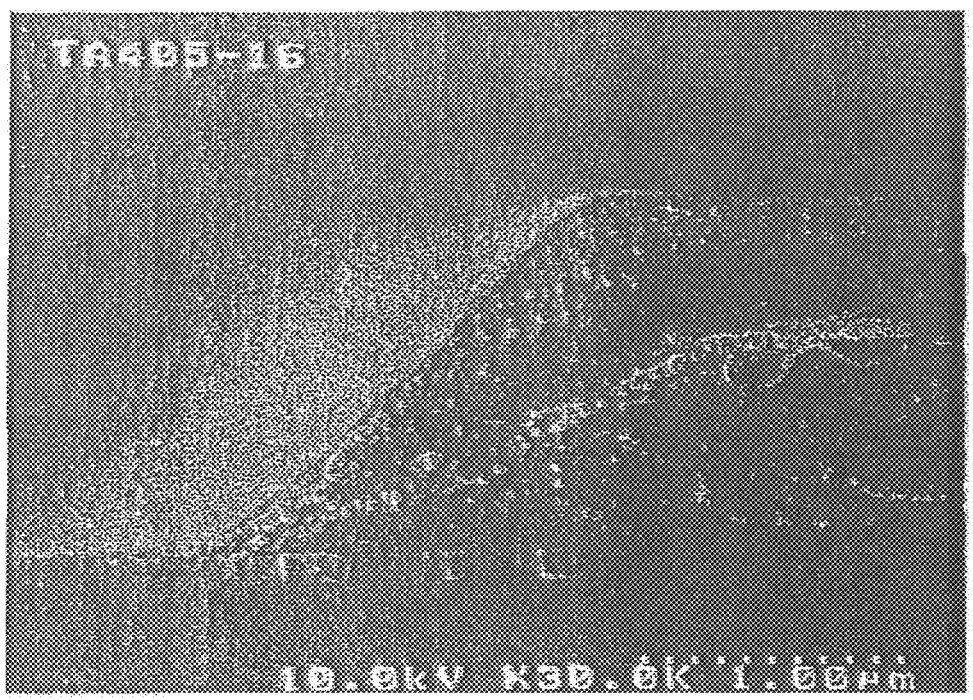
FIGS. 34A and 34B show sectional views of a positive photosensitive polyimide film in an opening.
Figure 34B:
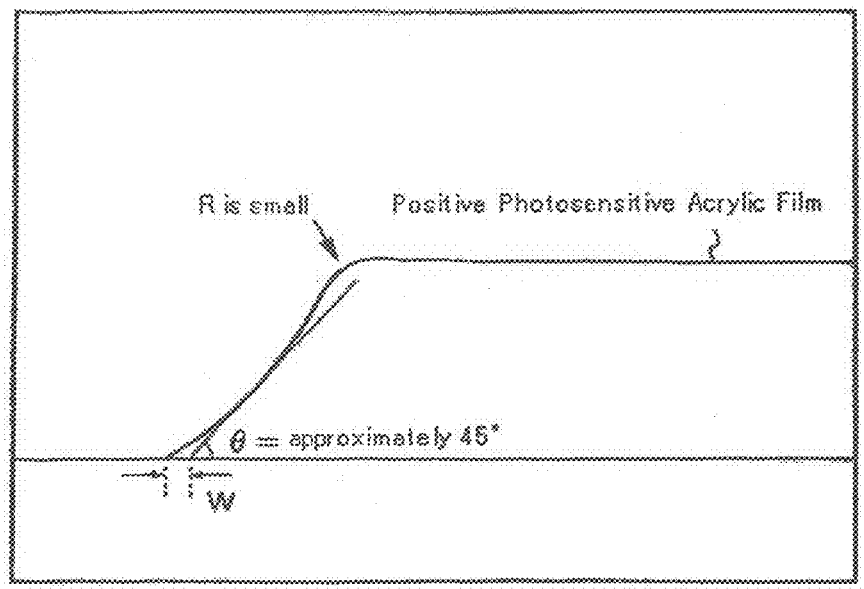

Next, a photograph shown in FIG. 34A is a sectional SEM photograph in a state in which exposure and development treatment are applied to a positive photosensitive polyimide film (film thickness: approximately 1.5 μm) to pattern it. FIG.

34B is a schematic view of FIG. 33A. A sectional shape of the positive photosensitive polyimide film has a slight tail part (represented by a length W) and a curved upper end after etching treatment with a developer. However, a certain curvature radius (R) thereof is small.

Observing the above-mentioned sectional shapes, considerations as described blow can be made. After forming a contact hole (opening), when a metal film to be an electrode or a wiring is formed, the sputtering method, the evaporation method, or the CVD method is used. It is known that, when material molecules constituting a thin film deposit on a surface to be formed, the material molecules move on the surface to find a stable site, and tend to gather in a part of a shape having an acute angle (shape to be a convex part) like an upper end of the contact hole. In particular, this tendency is conspicuous in the evaporation method. Thus, when a sectional shape of the opening is the shape as shown in FIG. 31A, since the material molecules concentrate on the edge of the opening, a film thickness increases in that part locally and a projected part of an eave shape is formed. This projected part is not preferable because it becomes a cause of a failure such as disconnection (step breakage) later. Therefore, it can be said that the non-photosensitive acrylic film shown in FIG. 31A and the positive photosensitive polyimide film shown in FIG. 34A are materials disadvantageous from the viewpoint of a coverage.

In addition, in the shape with the tail part formed in the lower end of the contact hole as shown in FIGS. 33A and 34A, it is likely that the tail part may cover the bottom surface of the contact hole to cause connection failure according to circumstances. Therefore, it can be said that the films having such a shape is a disadvantageous material from the viewpoint of a contact property. It is needless to mention that there is no problem if the length of the tail part is 1 μm or less (preferably, a length less than the radius of the contact hole).

Embodiment 9

This embodiment gives a description on a method of manufacturing a semiconductor display device of the present invention. In this embodiment, a partial sectional structure in each step is shown for a portion 9200 to be connected with an FPC (FPC connection portion), a first capacitor electrode 9222, a pixel portion 9220, and a protective circuit 9201.

First, a TFT 9202 is formed on a substrate and a lead wiring 9221 is formed on a gate insulating film 9204. The TFT 9202 has a semiconductor film 9203, the gate insulating film 9204 that is in contact with the semiconductor film 9203, and a gate electrode 9205 that is in contact with the gate insulating film 9204. The lead wiring 9221 and the first capacitor electrode 9222 are formed from the same conductive film as the gate electrode 9205.

This embodiment uses SiON for the gate insulating film 9204. For a method of forming the gate insulating film and its thickness, see the description in Embodiment 1.

A first inorganic insulating film 9206 is formed to cover the lead wiring 9221, the first capacitor electrode 9222, and the TFT 9202. This embodiment uses SiN for the first inorganic insulating film 9206. For a method of forming the first inorganic insulating film 9206 and its thickness, see the description in Embodiment 1.

Figures 35A, 35B, 35C:
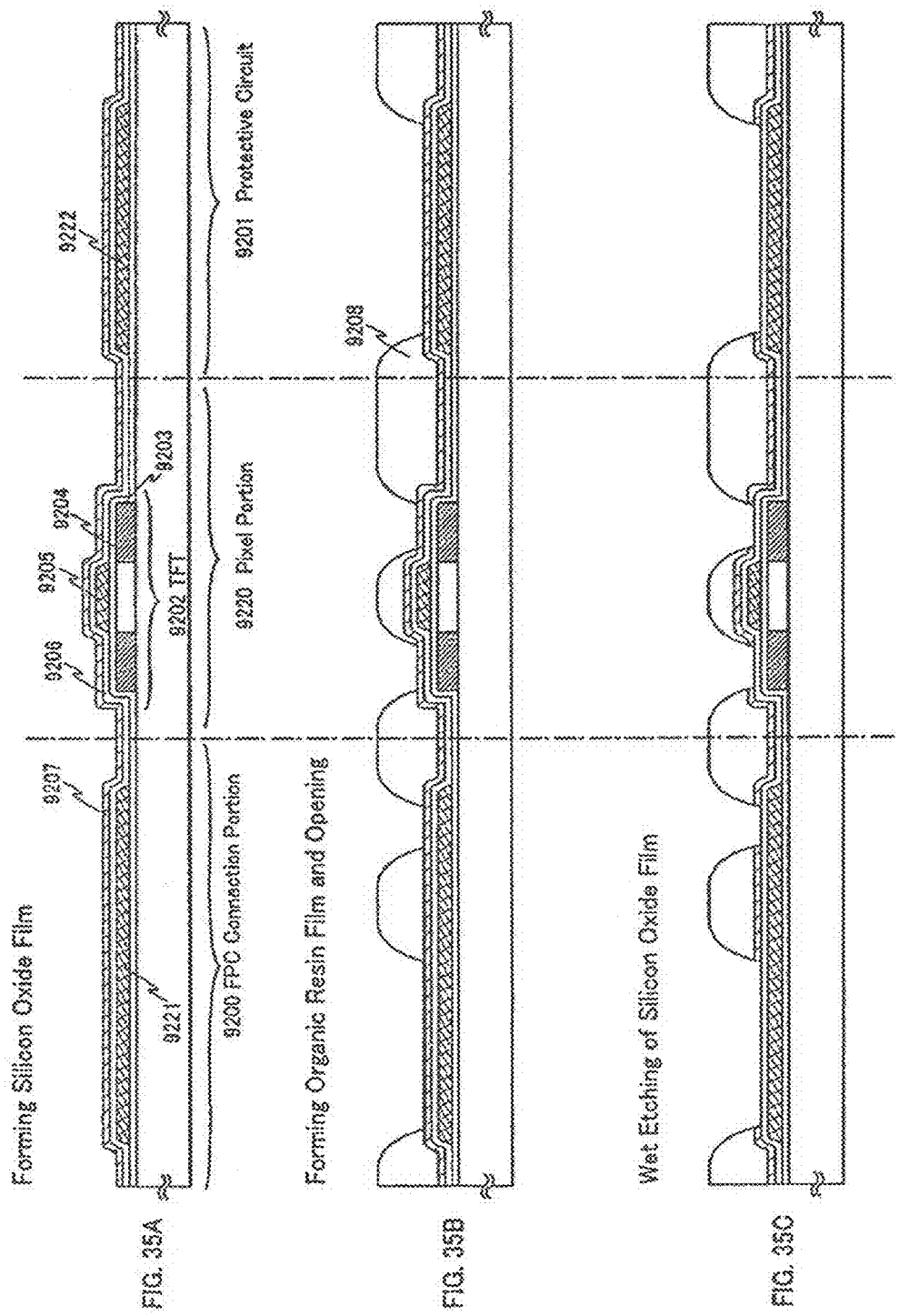
FIGS. 35A to 35C show diagrams showing a method of manufacturing semiconductor display device of the present invention.

In this embodiment, the first inorganic insulating film 9206 is covered with a barrier film 9207 (FIG. 35A). The barrier film 9207 in this embodiment is formed of $SiO_2$ by CVD to a thickness of approximately 30 to 120 nm.

Next, organic resin is applied to the top face of the barrier film 9207. The organic resin film is partially exposed to light and developed to obtain an organic resin film 9208 with openings (FIG. 35B). The organic resin film 9208 may be bleached by exposing the entirety to light after partial exposure to light and before development as described in Embodiment 1.

Using the organic resin film 9208 as a mask, the barrier film 9207 formed of $SiO_2$ is subjected to wet etching. In this embodiment, the wet etching uses a hydrofluoric acid-based etchant and the temperature is set to 20° C. to remove the barrier film 9207 from the openings of the organic resin film 9208, thereby exposing the first inorganic insulating film 9206 in the openings of the organic resin film 9208 (FIG. 35C).

A second inorganic insulating film 9209 is formed from SiN on the organic resin film 9208 so as to cover the openings. For a method of forming the second inorganic insulating film 9209 and its thickness, see the description in Embodiment 1.

The first inorganic insulating film 9206, the second inorganic insulating film 9209, and the gate insulating film 9204 are subjected to dry etching to form contact holes in the openings of the organic resin film 9208. The lead wiring 9221 and impurity regions 9225 and 9226 of the semiconductor film 9203 are partially exposed in the contact holes. During the dry etching, the first capacitor electrode 9222 is covered with a mask to avoid exposure.

Then a conductive film is formed on the second inorganic insulating film 9209 covering the contact holes and is patterned to form a leading out wiring 9210, a wiring 9211, and a second capacitor electrode 9212. The leading out wiring 9210 is in contact with the lead wiring 9221. The wiring 9211 is in contact with the impurity region 9226 of the semiconductor film 9203. The second capacitor electrode 9212 overlaps the first capacitor electrode 9222 in the opening of the organic resin film 9208 sandwiching between the first inorganic insulating film 9206 and the second inorganic insulating film 9209 are interposed between the capacitor electrodes.

Then a transparent conductive film is formed and patterned to form an input terminal 9213 adjacent to the lead wiring 9221 in the contact hole and a pixel electrode 9224 adjacent to the wiring 9211.

The first inorganic insulating film 9206 formed of SiN has higher electric conductivity than the barrier film 9207 formed of $SiO_2$. Therefore, so-called charging damage in which holes are trapped in the gate insulating film 9204 is prevented even though the films are exposed to plasma atmosphere during dry etching for forming the contact holes. Fluctuation of TFT threshold toward the plus side is thus prevented.

This embodiment can be combined freely with Embodiments 1 through 8.

Embodiment 10

This embodiment explains variations of step order after a contact hole is formed in first and second inorganic insulating films in a method of manufacturing a semiconductor display device of the present invention.

In FIG. 37A, a lead wiring 9104 is formed on a gate insulating film 9103 in an FPC connection portion 9100. A TFT 9101 is formed in a pixel portion 9120. The TFT 9101 has a semiconductor film 9102, a gate insulating film 9103 adjacent to the semiconductor film 9102, and a gate electrode 9121 adjacent to the gale insulating film 9103. A first inorganic insulating film 9105 is formed to cover the lead wiring 9104 and the TFT 9101. An organic resin film 9106 having an opening is formed on the first inorganic insulating film 9105. A second inorganic insulating film 9107 is formed on the organic resin film 9106 covering the opening.

A contact hole is formed through the first inorganic insulating film 9105 and the second inorganic insulating film 9107 in the opening of the organic resin film 9106. The lead wiring 9104 and impurity regions of the semiconductor film 9102 are partially exposed in the contact hole.

Next, a transparent conductive film 9108 is formed on the second inorganic insulating film 9107 to cover the contact hole as shown in FIG. 37B.

The transparent conductive film 9108 is patterned as shown in FIG. 37C to form an input terminal 9109 adjacent to the lead wiring 9104 in the contact hole and a pixel electrode 9110.

Next, a conductive film is formed and patterned to form a lead wiring 9111 and a wiring 9112. The lead wiring 9111 is adjacent to the lead wiring 9104 in the contact hole. The wiring 9112 is adjacent to the impurity regions of the semiconductor film 9102 and with the pixel electrode.

A step of polishing the surface of the transparent conductive film 9108 or the pixel electrode 9110 is added to FIGS. 37A to 37D. The surface polishing can be put after formation of the transparent conductive film 9108 and before patterning thereof, namely, between FIG. 37B and FIG. 37C. Alternatively, the surface polishing may be put after formation of the pixel electrode 9110 by patterning and before formation of the wiring, namely, between FIG. 37C and FIG. 37D. Since the wiring is not formed yet, the surface of the transparent conductive film 9108 or the pixel electrode 9110 alone is polished by the above surface polishing.

It is also possible to put the surface polishing after the wiring 9112 is formed, namely, after FIG. 37D. This prevents fine particles, which is resulted from the surface polishing of the transparent conductive film or the pixel electrode, from entering into the contact hole, thereby preventing contact defects.

The description given next is about a method of manufacturing a semiconductor display device of the present invention which has a different manufacture step order from the one illustrated in FIGS. 37A to 37D.

In FIG. 38A, a lead wiring 9004 is formed on a gate insulating film 9003 in an FPC connection portion 9000. A TFT 9001 is formed in a pixel portion 9020. The TFT 9001 has a semiconductor film 9002, a gate insulating film 9003 adjacent to the semiconductor film 9002, and a gate electrode 9021 adjacent to the gate insulating film 9003. A first inorganic insulating film 9005 is formed to cover the lead wiring 9004 and the TFT 9001. An organic resin film 9006 having an opening is formed on the first inorganic insulating film 9005. A second inorganic insulating film 9007 is formed on the organic resin film 9006 covering the opening.

A contact hole is formed through the first inorganic insulating film 9005 and the second inorganic insulating film 9007 in the opening of the organic resin film 9006. The lead wiring 9004 and impurity regions of the semiconductor film 9002 are partially exposed in the contact hole.

Then as shown in FIG. 38B, a conductive film is formed so as to cover the contact hole and is patterned to form a lead wiring 9011 and a wiring 9008. The lead wiring 9011 is adjacent to the lead wiring 9004 in the contact hole. The wiring 9008 is adjacent to the impurity regions of the semiconductor film 9002.

Next, a transparent conductive film 9010 is formed as shown in FIG. 38C. The transparent conductive film 9010 is adjacent to the lead wiring 9004 in the contact hole. The transparent conductive film 9010 is also adjacent to the wiring 9008.

The transparent conductive film 9010 is then patterned as shown in FIG. 38D to form an input terminal 9013 adjacent to the lead wiring 9004 and a pixel electrode 9012 that is adjacent to the wiring 9008.

The process shown in FIGS. 38A to 38D has a step of polishing the surface of the transparent conductive film 9010 or the pixel electrode 9013. The surface polishing can be put after formation of the transparent conductive film 9010 and before patterning thereof, namely, between FIG. 38C and FIG. 3-8D. Alternatively, the surface polishing may be put after the pixel electrode 9013 is formed by patterning, namely, after FIG. 38D. This prevents fine particles, which is resulted from the surface polishing of the transparent conductive film or the pixel electrode, from entering into the contact hole, thereby preventing contact defects.

If an ITO film is formed on an acrylic resin film, the ITO film is in some cases peeled off of the acrylic resin film upon polishing of the ITO film. The peeling of the ITO film upon polishing can be prevented by forming an inorganic insulating film between the acrylic resin film and the ITO film.

This embodiment can be combined freely with Embodiments 1 through 9.

While various embodiments in accordance with the present invention have been shown and described, it is understood that the invention is not limited thereto. The present invention may be changed, modified and further applied by those skilled in the art. Therefore, this invention is not limited to the detail shown and described previously, but also includes all such changes and modifications.

What is claimed is:

1. A display device comprising:
a pixel portion over a substrate;
an input terminal over the substrate;
a wiring electrically connected between the pixel portion and the input terminal;
a first transistor wherein a gate of the first transistor and one of a source and a drain of the first transistor are electrically connected to a first voltage line, and the other of the source and the drain of the first transistor is electrically connected to the wiring;
a second transistor wherein a gate of the second transistor and one of a source and a drain of the second transistor are electrically connected to the wiring, and the other of the source and the drain of the second transistor is electrically connected to a second voltage line;
a capacitor comprising a first electrode and a second electrode wherein the first electrode is electrically connected to the wiring, and the second electrode is electrically connected to one of the first voltage line and the second voltage line.

2. The display device according to claim 1, wherein the first transistor and the second transistor are N-channel transistors.

3. The display device according to claim 1, wherein the first transistor and the second transistor are P-channel transistors.

4. The display device according to claim 1, wherein the first voltage line is a power supply voltage line.

5. The display device according to claim 1, wherein the second voltage line is a ground voltage line.

6. The display device according to claim 1, further comprising:
a first inorganic insulating film over the first electrode;
an organic resin film over the first inorganic insulating film, the organic resin film including an opening;
a second inorganic insulating film over the organic resin film, the second inorganic insulating film being in contact with the first inorganic insulating film in the opening, wherein the second electrode is formed over the second inorganic insulating film and is overlapped with the opening at least partly, wherein a surface of the organic resin film is rounded in the opening.

7. The display device according to claim 6, wherein the organic resin film comprises a photosensitive resin.

8. The display device according to claim 6, wherein the second inorganic insulating film comprises a material selected from the group consisting of silicon oxynitride, silicon nitride, aluminum nitride and aluminum oxynitride.

9. A display device comprising:
a pixel portion over a substrate;
an input terminal over the substrate;
a wiring electrically connected between the pixel portion and the input terminal;
a first transistor wherein a gate of the first transistor and one of a source and a drain of the first transistor are electrically connected to a first voltage line, and the other of the source and the drain of the first transistor is electrically connected to the wiring;
a second transistor wherein a gate of the second transistor and one of a source and a drain of the second transistor are electrically connected to the wiring, and the other of the source and the drain of the second transistor is electrically connected to a second voltage line;
a first capacitor comprising a first electrode and a second electrode wherein the first electrode is electrically connected to the wiring, and the second electrode is electrically connected to the first voltage line.
a second capacitor comprising a first electrode and a second electrode wherein the first electrode of the second capacitor is electrically connected to the wiring, and the second electrode of the second capacitor is electrically connected to the second voltage line.

10. The display device according to claim 9, wherein the first transistor and the second transistor are N-channel transistors.

11. The display device according to claim 9, wherein the first transistor and the second transistor are P-channel transistors.

12. The display device according to claim 9, wherein the first voltage line is a power supply voltage line.

13. The display device according to claim 9, wherein the second voltage line is a ground voltage line.

14. The display device according to claim 9, further comprising:
a first inorganic insulating film over the first electrodes of the first capacitor and the second capacitor;
an organic resin film over the first inorganic insulating film, the organic resin film including a first opening over the first electrode of the first capacitor and a second opening over the first electrode of the second capacitor;
a second inorganic insulating film over the organic resin film, the second inorganic insulating film being in contact with the first inorganic insulating film in the first opening and the second opening, wherein the second electrode of the first capacitor is formed over the second inorganic insulating film and is overlapped with the first opening at least partly, and the second electrode of the second capacitor is formed over the second inorganic insulating film and is overlapped with the second opening at least partly, wherein a surface of the organic resin film is rounded in the first opening and the second opening.

15. A display device comprising:
a pixel portion over a substrate;
an input terminal over the substrate;
a wiring electrically connected between the pixel portion and the input terminal;
a first transistor wherein a gate of the first transistor and one of a source and a drain of the first transistor are electrically connected to a first voltage line, and the other of the source and the drain of the first transistor is electrically connected to the wiring;
a second transistor wherein a gate of the second transistor and one of a source and a drain of the second transistor are electrically connected to the wiring, and the other of the source and the drain of the second transistor is electrically connected to a second voltage line;
a capacitor comprising a first electrode and a second electrode wherein the first electrode is electrically connected to the wiring, and the second electrode is electrically connected to one of the first voltage line and the second voltage line; and
a resistor comprising a first terminal and a second terminal wherein the first terminal is electrically connected to the wiring and the second terminal is electrically connected to the second voltage line.

16. The display device according to claim 15, wherein the first transistor and the second transistor are N-channel transistors.

17. The display device according to claim 15, wherein the first transistor and the second transistor are P-channel transistors.

18. The display device according to claim 15, wherein the first voltage line is a power supply voltage line.

19. The display device according to claim 15, wherein the second voltage line is a ground voltage line.

20. The display device according to claim 15, further comprising:
a first inorganic insulating film over the first electrode;
an organic resin film over the first inorganic insulating film, the organic resin film including an opening;
a second inorganic insulating film over the organic resin film, the second inorganic insulating film being in contact with the first inorganic insulating film in the opening, wherein the second electrode is formed over the second inorganic insulating film and is overlapped with the opening at least partly,
wherein a surface of the organic resin film is rounded in the opening.

* * * * *

UNITED STATES PATENT AND TRADEMARK OFFICE
CERTIFICATE OF CORRECTION

PATENT NO. : 8,115,210 B2
APPLICATION NO. : 13/162791
DATED : February 14, 2012
INVENTOR(S) : Shunpei Yamazaki et al.

It is certified that error appears in the above-identified patent and that said Letters Patent is hereby corrected as shown below:

Title page, item [57] Abstract:
Line 12, "opening is foamed" should read "opening is formed"

Col. 4, line 2, "polyimide fi an opening" should read "polyimide film in an opening"

Col. 8, line 28, "film 7075" should read "film 7025"

Col. 8, line 58, "film 5003" should read "film 8003"

Col. 9, line 6, "top fate of" should read "top face of"

Col. 10, line 47, "compared to the ease" should read "compared to the case"

Col. 11, line 27, "cover the TFT 8401" should read "cover the TFT 8101"

Col. 14, line 6, "can avoid do" should read "can avoid to"

Col. 14, line 30, "voltage Grid quickly." should read "voltage Gnd quickly."

Col. 16, line 35, "element clue to noise" should read "element due to noise"

Col. 16, line 65, "organic resin him" should read "organic resin film"

Col. 18, line 50, "frequency of 300 Hi" should read "frequency of 300 Hz"

Col. 21, line 16, "to corm conductive layers" should read "to form conductive layers"

Col. 21, line 31, "Ta film ace etched" should read "Ta film are etched"

Col. 27, line 19, "sampling circuit 1153." should read "sampling circuit 115_3."

Col. 30, line 35, "first capacitor electrode 9008" should read "first capacitor electrode 9007"

Col. 32, line 8, "a level shill circuit" should read "a level shift circuit"

Col. 34, line 2, "a ease 2702" should read "a case 2702"

Col. 36, line 62, "the gale insulating film 9103." should read "the gate insulating film 9103."

Col. 38, line 10, "FIG. 3 8D." should read "FIG. 38D."

Signed and Sealed this
Ninth Day of October, 2012

David J. Kappos
*Director of the United States Patent and Trademark Office*